(12) United States Patent
Kim et al.

(10) Patent No.: US 11,764,115 B2
(45) Date of Patent: *Sep. 19, 2023

(54) WAFER MANUFACTURING METHOD AND LAMINATED DEVICE CHIP MANUFACTURING METHOD

(71) Applicant: DISCO CORPORATION, Tokyo (JP)

(72) Inventors: Youngsuk Kim, Tokyo (JP); Byeongdeck Jang, Tokyo (JP); Akihito Kawai, Tokyo (JP); Shunsuke Teranishi, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 58 days.

This patent is subject to a terminal disclaimer.

(21) Appl. No.: 17/453,551

(22) Filed: Nov. 4, 2021

(65) Prior Publication Data
US 2022/0157669 A1 May 19, 2022

(30) Foreign Application Priority Data
Nov. 18, 2020 (JP) ................. 2020-191855

(51) Int. Cl.
*H01L 21/683* (2006.01)
*H01L 21/66* (2006.01)
(Continued)

(52) U.S. Cl.
CPC .......... *H01L 22/22* (2013.01); *H01L 21/3043* (2013.01); *H01L 21/6835* (2013.01);
(Continued)

(58) Field of Classification Search
CPC . H01L 22/22; H01L 21/3043; H01L 21/6835; H01L 21/7806;
(Continued)

(56) References Cited

U.S. PATENT DOCUMENTS

| 7,378,288 | B2* | 5/2008 | Tran | B23K 26/40 |
| | | | | 257/E21.526 |
| 7,952,184 | B2* | 5/2011 | Farrar | H01L 25/50 |
| | | | | 365/72 |
| 8,045,132 | B2* | 10/2011 | Kawada | G02F 1/1303 |
| | | | | 349/192 |
| 8,883,565 | B2* | 11/2014 | Vaupel | H01L 21/78 |
| | | | | 438/33 |

(Continued)

FOREIGN PATENT DOCUMENTS

JP 2012134334 A 7/2012

OTHER PUBLICATIONS

Youngsuk Kim; U.S. Appl. No. 17/453,411, filed Nov. 3, 2021.
(Continued)

*Primary Examiner* — Vu A Vu
(74) *Attorney, Agent, or Firm* — Greer Burns & Crain Ltd.

(57) ABSTRACT

A wafer manufacturing method includes a wafer preparing step of preparing a wafer including a semiconductor device formed in each of a plurality of regions demarcated by a plurality of streets intersecting each other, a removing step of removing, from the wafer, a defective device region including a semiconductor device determined to be a defective product among a plurality of the semiconductor devices formed in the wafer, and a fitting step of fitting, into a removed region formed by removing the defective device region from the wafer, a device chip including a semiconductor device as a non-defective product having same functions as those of the semiconductor device determined to be a defective product and having a size capable of being fitted into the removed region.

16 Claims, 37 Drawing Sheets

(51) Int. Cl.
*H01L 21/78* (2006.01)
*H01L 21/304* (2006.01)

(52) U.S. Cl.
CPC .................. *H01L 21/7806* (2013.01); *H01L 2221/68322* (2013.01); *H01L 2221/68327* (2013.01)

(58) Field of Classification Search
CPC . H01L 2221/68322; H01L 2221/68327; H01L 2221/6834; H01L 21/67092; H01L 21/67115; H01L 21/67288; H01L 21/6836; H01L 21/78; H01L 21/50; H01L 22/14; H01L 22/20; H01L 2221/68304; H01L 2221/68359; H01L 21/52; H01L 21/304; H01L 25/0657; H01L 25/074; H01L 25/0756; H01L 25/50; B23K 26/38
USPC ........................................................ 438/464
See application file for complete search history.

(56) References Cited

U.S. PATENT DOCUMENTS

| | | | |
|---|---|---|---|
| 2010/0202126 A1* | 8/2010 | Nakamura | H01L 24/19 361/803 |
| 2012/0315710 A1* | 12/2012 | Hozawa | H01L 22/20 438/109 |
| 2013/0062800 A1 | 3/2013 | Arai | |
| 2017/0186730 A1* | 6/2017 | Shen | H01L 21/78 |
| 2020/0279835 A1 | 9/2020 | Sasaki et al. | |
| 2021/0005520 A1* | 1/2021 | Ishio | H01L 21/67271 |

OTHER PUBLICATIONS

Youngsuk Kim; U.S. Appl. No. 17/453,368, filed Nov. 3, 2021.
Youngsuk Kim; U.S. Appl. No. 17/453,557, filed Nov. 4, 2021.
Youngsuk Kim; U.S. Appl. No. 17/453,543, filed Nov. 4, 2021.
Youngsuk Kim; U.S. Appl. No. 17/453,547, filed Nov. 4, 2021.

* cited by examiner

WAFER MANUFACTURING METHOD AND LAMINATED DEVICE CHIP MANUFACTURING METHOD

BACKGROUND OF THE INVENTION

Field of the Invention

The present invention relates to a method for manufacturing a wafer including a plurality of semiconductor devices and a method for manufacturing a laminated device chip including a plurality of laminated semiconductor devices.

Description of the Related Art

A device chip manufacturing process uses a wafer in which a semiconductor device is formed in each of a plurality of regions demarcated by a plurality of streets (planned dividing lines) arranged in a lattice manner. A plurality of device chips including respective semiconductor devices are obtained by dividing the wafer along the streets. The device chips are incorporated into various electronic apparatuses such as mobile telephones or personal computers.

In recent years, a technology for manufacturing device chips including a plurality of laminated semiconductor devices (laminated device chips) has been put to practical use. The laminated device chips are obtained by, for example, laminating a plurality of device chips and connecting semiconductor devices to each other by through electrodes (through-silicon vias (TSV)) that vertically penetrate the device chips. The use of the through electrodes can shorten wiring connecting the semiconductor devices to each other as compared with a case of using wire bonding or the like, and can therefore achieve miniaturization of the laminated device chips and an improvement in processing speed of the laminated device chips.

A method referred to as Wafer on Wafer (WoW) has been proposed as a method for manufacturing the laminated device chips. In this method, a laminated wafer is formed by laminating a plurality of wafers and connecting semiconductor devices included in the respective wafers to each other by electrodes formed so as to penetrate the laminated wafers. Then, the laminated device chips are manufactured by dividing the laminated wafer along the streets.

However, the wafers used to manufacture the laminated device chips may include a defective product of a semiconductor device (defective device). Then, when the laminated wafer formed by laminating the wafers including the defective device is divided, the laminated device chips including the defective device are manufactured. When some of semiconductor devices included in a laminated device chip are defective products, the laminated device chip as a whole is determined to be a defective product (defective chip) even if the other semiconductor devices are non-defective products. Therefore, in manufacturing the laminated device chips, there is a large effect of a decrease in yield due to defective devices.

Accordingly, before the lamination of a plurality of wafers, an inspection which determines whether semiconductor devices included in the wafers are each a non-defective product or a defective product is performed. Then, an optimum combination of wafers used to manufacture laminated device chips is determined on the basis of the number, arrangement, and the like of defective devices included in the wafers, for example (see Japanese Patent Laid-Open No. 2012-134334). Thus, the number of laminated device chips including a defective device is minimized, so that a decrease in yield is suppressed.

SUMMARY OF THE INVENTION

As described above, even when the wafers include defective devices, the number of laminated device chips including a defective device (defective chips) can be minimized by determining a combination of wafers on the basis of a result of the inspection of the semiconductor devices. However, as long as the wafers include defective devices, at least a certain number of defective chips are manufactured when the laminated device chips are manufactured by using the wafers including defective devices. There is thus a limit to the reduction of the number of defective chips.

The present invention has been made in view of such problems. It is an object of the present invention to provide a method for manufacturing wafers that can suppress a decrease in yield of laminated device chips and a method for manufacturing the laminated device chips which method uses the wafers.

In accordance with an aspect of the present invention, there is provided a wafer manufacturing method including a wafer preparing step of preparing a wafer including a semiconductor device formed in each of a plurality of regions demarcated by a plurality of streets intersecting each other, a removing step of removing, from the wafer, a defective device region including a semiconductor device determined to be a defective product among a plurality of the semiconductor devices formed in the wafer, and a fitting step of fitting, into a removed region formed by removing the defective device region from the wafer, a device chip including a semiconductor device as a non-defective product having same functions as those of the semiconductor device determined to be a defective product and having a size capable of being fitted into the removed region. The removing step destroys the defective device region by irradiating the defective device region with a laser beam.

Incidentally, preferably, the removing step irradiates the defective device region with the laser beam in a state in which a condensing point of the laser beam of a wavelength absorbable by the wafer is positioned in the defective device region. In addition, preferably, the removing step irradiates the defective device region with the laser beam via a liquid column formed by jetting a liquid to the wafer in a state in which a condensing point of the laser beam of a wavelength absorbable by the wafer is positioned inside the liquid column.

In addition, preferably, the wafer manufacturing method further includes a grinding step of, before the removing step is performed, affixing a protective member to a first surface side of the wafer, the semiconductor devices being formed on the first surface side, and thinning the wafer to a predetermined thickness by grinding a second surface side of the wafer, the second surface side being an opposite side of the first surface.

In addition, preferably, by grinding a second surface side of the wafer, the second surface side being an opposite side of a first surface side on which the semiconductor devices are formed, the removing step exposes the removed region on the second surface side of the wafer.

In addition, preferably, the removing step supplies an etchant to the removed region. In addition, preferably, the removing step supplies gas in a plasma state to the removed region.

In addition, preferably, the wafer manufacturing method further includes a resin filling step of filling a resin into a gap between the device chip and the wafer, after the fitting step is performed, and a resin grinding step of grinding the resin formed on an outside of the gap, after the resin filling step is performed.

In accordance with another aspect of the present invention, there is provided a laminated device chip manufacturing method including a wafer preparing step of preparing a first wafer and a second wafer each having a semiconductor device formed in each of a plurality of regions demarcated by a plurality of streets intersecting each other, a removing step of removing, from the first wafer, a defective device region including a semiconductor device determined to be a defective product among a plurality of the semiconductor devices formed in the first wafer, a fitting step of fitting, into a removed region formed by removing the defective device region from the first wafer, a device chip including a semiconductor device as a non-defective product having same functions as those of the semiconductor device determined to be a defective product and having a size capable of being fitted into the removed region, a wafer laminating step of forming a laminated wafer by laminating the second wafer onto the first wafer, and a dividing step of forming laminated device chips including a plurality of the laminated semiconductor devices by dividing the laminated wafer along the streets. The removing step destroys the defective device region by irradiating the defective device region with a laser beam.

In the wafer manufacturing method according to one aspect of the present invention, the defective device region including the semiconductor device determined to be a defective product is removed from the wafer, and a device chip including a semiconductor device as a non-defective product is fitted into a gap formed by removing the defective device region. The wafer not including the defective device can be thereby manufactured. In addition, laminated device chips each not including the defective device can be manufactured by laminating the wafers each not including the defective device, thereby forming a laminated wafer, and dividing the laminated wafer. As a result, a decrease in yield of the laminated device chips is suppressed.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

First Embodiment

Figure 1A:
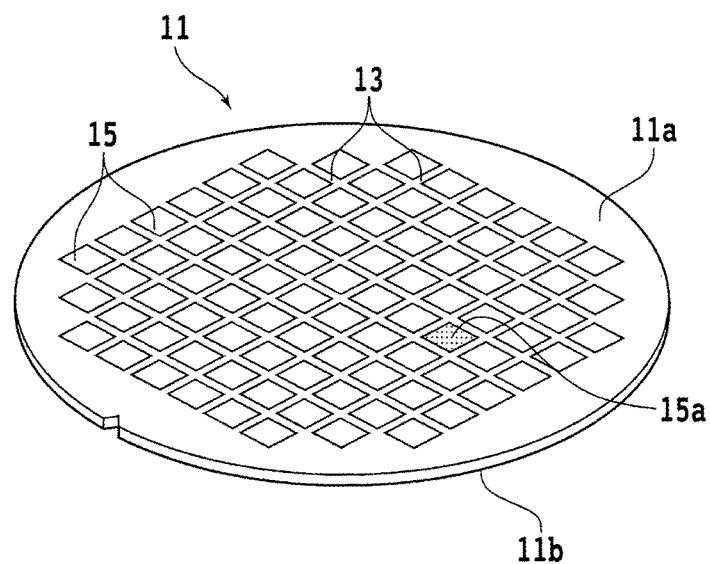
FIG. 1A is a perspective view depicting a wafer.
Figure 1B:
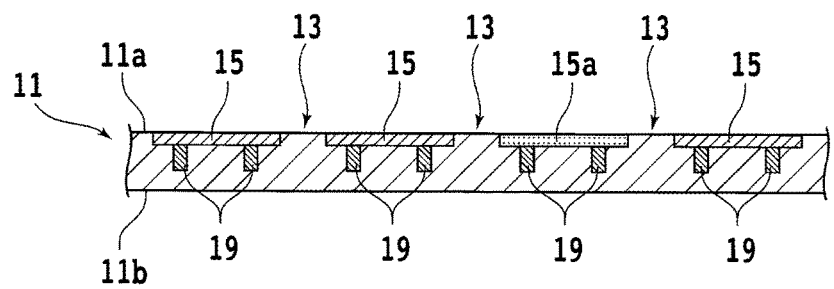
FIG. 1B is a sectional view depicting the wafer.

An embodiment of the present invention will hereinafter be described with reference to the accompanying drawings. An example of configuration of a wafer that can be used in the present embodiment will first be described. FIG. 1A is a perspective view depicting a wafer 11. FIG. 1B is a sectional view depicting the wafer 11.

The wafer 11 is, for example, a silicon wafer formed in a disk shape. The wafer 11 has a top surface (first surface) 11a and an undersurface (second surface) 11b on an opposite side of the top surface 11a. The top surface 11a and the undersurface 11b are formed substantially in parallel with each other.

The wafer 11 is demarcated into a plurality of rectangular regions by a plurality of streets (planned dividing lines) 13 arranged in a lattice manner so as to intersect each other. Then, a semiconductor device 15 such as an integrated circuit (IC), large scale integration (LSI), a light emitting diode (LED), or microelectromechanical systems (MEMS) is formed in each of the plurality of regions demarcated by the streets 13 on the top surface 11a side of the wafer 11.

It is to be noted that there is no limitation on the material, shape, structure, size, or the like of the wafer 11. For example, the wafer 11 may be a wafer formed of a semiconductor other than silicon (GaAs, InP, GaN, SiC, or the like), glass, ceramic, a resin, a metal, or the like. In addition, there is no limitation on the kind, quantity, shape, structure, size, arrangement, or the like of the semiconductor devices 15 either.

Figure 1C:
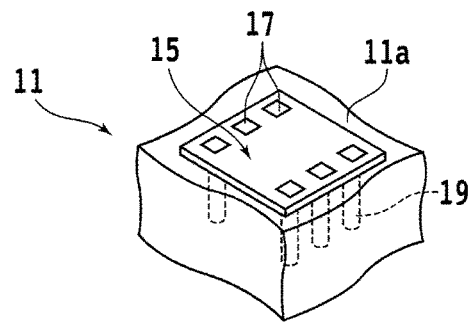
FIG. 1C is a perspective view depicting a semiconductor device.

FIG. 1C is a perspective view depicting the semiconductor device 15. The semiconductor device 15, for example, includes a plurality of electrodes 17 that are exposed on the top surface of the semiconductor device 15 and that are connected to another piece of wiring, other electrodes, another semiconductor device, or the like. Incidentally, a connecting electrode such as a bump may be formed on each of the top surfaces of the electrodes 17.

In addition, a plurality of electrodes (via electrodes or through electrodes) 19 are embedded in each of the plurality of regions demarcated by the streets 13 of the wafer 11. The electrodes 19 are each formed in a columnar shape along the thickness direction of the wafer 11, and are connected to the electrodes 17 of the semiconductor device 15. It is to be noted that the material of the electrodes 19 are not limited. For example, a metal such as copper, tungsten, or aluminum is used as the material of the electrodes 19.

The electrodes 19 are each formed extending from the semiconductor device 15 toward the undersurface 11b side of the wafer 11. The length (height) of each of the electrodes 19 is less than the thickness of the wafer 11. Therefore, the electrodes 19 are not exposed on the undersurface 11b side of the wafer 11, and are embedded in the wafer 11. In addition, an insulating layer (not depicted) that insulates the wafer 11 from the electrodes 19 is provided between the wafer 11 and the electrodes 19.

When the wafer 11 is thinned by subjecting the undersurface 11b side of the wafer 11 to grinding processing, etching processing, or the like, the electrodes 19 are exposed on the undersurface 11b side of the wafer 11. Then, when a plurality of wafers 11 in a state in which the electrodes 19 are exposed on the undersurface 11b side are laminated, a laminated wafer which includes a plurality of semiconductor devices 15 laminated so as to be stacked on each other is obtained. The stacked semiconductor devices 15 are connected to each other via the electrodes 19.

The laminated wafer is divided along the streets 13 by cutting processing, laser processing, or the like. As a result, device chips each including a plurality of laminated semiconductor devices 15 (laminated device chips) are manufactured.

Incidentally, the wafer 11 may include a defective product of a semiconductor device 15 (defective device). FIG. 1A and FIG. 1B depict an example in which the wafer 11 includes a defective device 15a. The defective device 15a, for example, corresponds to a semiconductor device 15 not meeting a standard of predetermined electrical characteristics determined in advance.

When the laminated wafer is formed by laminating the wafer 11 including the defective device 15a, and the laminated wafer is divided, a laminated device chip including the defective device 15a is manufactured. Then, when some of the semiconductor devices 15 included in the laminated device chip are the defective devices 15a, the laminated device chip as a whole is determined to be a defective product (defective chip) even if the other semiconductor devices 15 are non-defective products.

Accordingly, a wafer manufacturing method according to the present embodiment removes the defective device 15a from the wafer 11. Then, a semiconductor device 15 as a non-defective product is fitted into a removed region (gap) formed in the wafer 11 by removing the defective device 15a. The wafer 11 not including the defective device 15a is thereby manufactured. A concrete example of the wafer manufacturing method according to the present embodiment will be described in the following.

First, the wafer 11 which has the semiconductor device 15 formed in each of the plurality of regions demarcated by the plurality of streets 13 intersecting each other (see FIG. 1A and FIG. 1B) is prepared (wafer preparing step). Incidentally, because a laminated wafer is formed by laminating a plurality of wafers in a subsequent step, at least two or more wafers are preferably prepared in the wafer preparing step.

Figure 2:
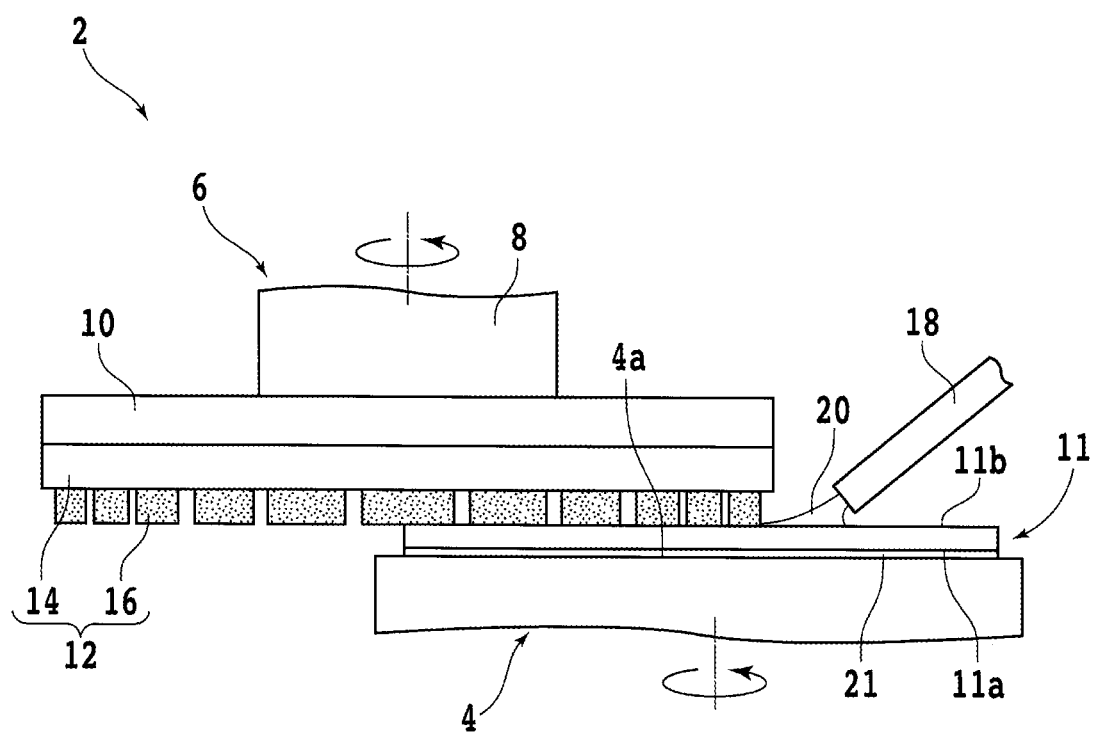
FIG. 2 is a front view depicting a grinding apparatus.

Next, the wafer 11 is ground and thinned (grinding step). A grinding apparatus, for example, is used to grind the wafer 11. FIG. 2 is a front view depicting a grinding apparatus 2. The grinding apparatus 2 includes a chuck table 4 that holds the wafer 11 and a grinding unit 6 that grinds the wafer 11.

The upper surface of the chuck table 4 constitutes a flat holding surface 4a that holds the wafer 11. The holding surface 4a is connected to a suction source (not depicted) such as an ejector via a flow passage (not depicted) formed within the chuck table 4. In addition, the chuck table 4 is coupled with a moving mechanism (not depicted) that moves the chuck table 4 along a horizontal direction. Used as the moving mechanism is a moving mechanism of a ball screw type, a turn table that supports and rotates the chuck table 4, or the like. Further, the chuck table 4 is coupled with a rotational driving source (not depicted) such as a motor that rotates the chuck table 4 about a rotational axis substantially parallel with a vertical direction (upward-downward direction).

The grinding unit 6 is disposed above the chuck table 4. The grinding unit 6 includes a cylindrical spindle 8 disposed along the vertical direction. A disk-shaped mount 10 formed of a metal or the like is fixed to a distal end portion (lower end portion) of the spindle 8. In addition, a rotational driving source (not depicted) such as a motor that rotates the spindle 8 is connected to a proximal end portion (upper end portion) of the spindle 8.

A grinding wheel 12 that grinds the wafer 11 is fitted to the lower surface side of the mount 10. The grinding wheel 12 includes an annular base 14 formed of a metal such as stainless steel or aluminum and formed with substantially a same diameter as that of the mount 10. A plurality of grinding stones 16 are fixed to the lower surface side of the base 14. For example, the plurality of grinding stones 16 are formed in a rectangular parallelepipedic shape, and are arranged at substantially equal intervals along the outer circumference of the base 14.

Power transmitted from the rotational driving source to the grinding wheel 12 via the spindle 8 and the mount 10 rotates the grinding wheel 12 about a rotational axis substantially parallel with the vertical direction. In addition, a ball screw type moving mechanism (not depicted) that raises and lowers the grinding unit 6 along the vertical direction is coupled to the grinding unit 6. Further, a nozzle 18 that supplies a grinding liquid 20 such as pure water to the wafer 11 held by the chuck table 4 and the plurality of grinding stones 16 is provided in the vicinity of the grinding unit 6.

The grinding apparatus 2 grinds, for example, the undersurface 11b side of the wafer 11. In this case, first, a protective member 21 is affixed to the top surface 11a side of the wafer 11 on which surface side the semiconductor devices 15 are formed. The semiconductor devices 15 are thereby covered and protected by the protective member 21.

Usable as the protective member 21 is a circular tape (protective tape) including a film-shaped base material and an adhesive layer (glue layer) on the base material or the like. For example, the base material is formed of a resin such as polyolefin, polyvinyl chloride, or polyethylene terephthalate, and the adhesive layer is formed of an epoxy-based, an acryl-based, or a rubber-based adhesive. In addition, an ultraviolet curable resin cured by being irradiated with ultraviolet rays may be used as the adhesive layer.

Then, the wafer 11 is held by the chuck table 4. Specifically, the wafer 11 is disposed on the chuck table 4 such that the top surface 11a side (protective member 21 side) of the wafer 11 faces the holding surface 4a and the undersurface 11b side of the wafer 11 is exposed upward. When a negative pressure of the suction source is made to act on the holding surface 4a in this state, the top surface 11a side of the wafer 11 is sucked and held by the chuck table 4 via the protective member 21.

Next, the chuck table 4 is moved to a position below the grinding unit 6. Then, while the chuck table 4 and the grinding wheel 12 are each rotated in a predetermined direction at a predetermined rotational speed, the grinding wheel 12 is lowered to the chuck table 4. The lowering speed of the grinding wheel 12 at this time is adjusted such that the grinding stones 16 are pressed against the wafer 11 with an appropriate force.

When the grinding stones 16 come into contact with the undersurface 11b side of the wafer 11, the undersurface 11b side of the wafer 11 is scraped away. Consequently, the undersurface 11b side of the wafer 11 is ground, and the wafer 11 is thinned. Then, when the wafer 11 is thinned to a predetermined thickness, the grinding is stopped. The protective member 21 is thereafter peeled and removed from the wafer 11.

Incidentally, before or after the grinding step, an inspection that determines whether the semiconductor devices 15 are a non-defective product or a defective product is performed for each of the semiconductor devices 15 included in the wafer 11. In the inspection of the semiconductor device 15, for example, electrical characteristics of the semiconductor device 15 are measured by applying a metallic probe to the electrodes 17 exposed on the top surface of the semiconductor device 15 (probing). Then, whether the semiconductor device 15 is a non-defective product or a defective product is determined on the basis of whether or not the measured electrical characteristics satisfy a predetermined standard.

When the wafer 11 includes a defective product of a semiconductor device 15 (defective device 15a), the semiconductor device 15 is determined to be a defective product by the inspection. Then, the position of the semiconductor device 15 determined to be a defective product is recorded.

Figure 3A:
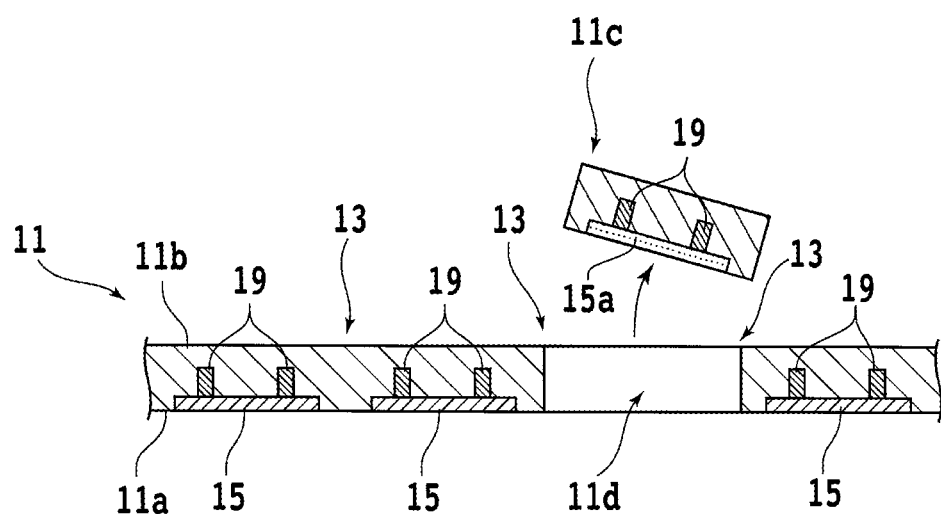
FIG. 3A is a sectional view depicting the wafer in a removing step.

Next, a defective device region including the semiconductor device 15 (defective device 15a) determined to be a defective product among the plurality of semiconductor devices 15 formed in the wafer 11 is removed from the wafer 11 (removing step). FIG. 3A is a sectional view depicting the wafer 11 in the removing step.

In the removing step, for example, a region of the wafer 11 is removed along four streets 13 surrounding the defective device 15a. Consequently, a defective device region 11c in a rectangular parallelepipedic shape including the defective device 15a is removed and separated from the wafer 11. Then, a through hole (removed region) 11d in a rectangular parallelepipedic shape extending from the top surface 11a to the undersurface 11b of the wafer 11 is formed in a position where the defective device region 11c of the wafer 11 existed.

Figure 3B:
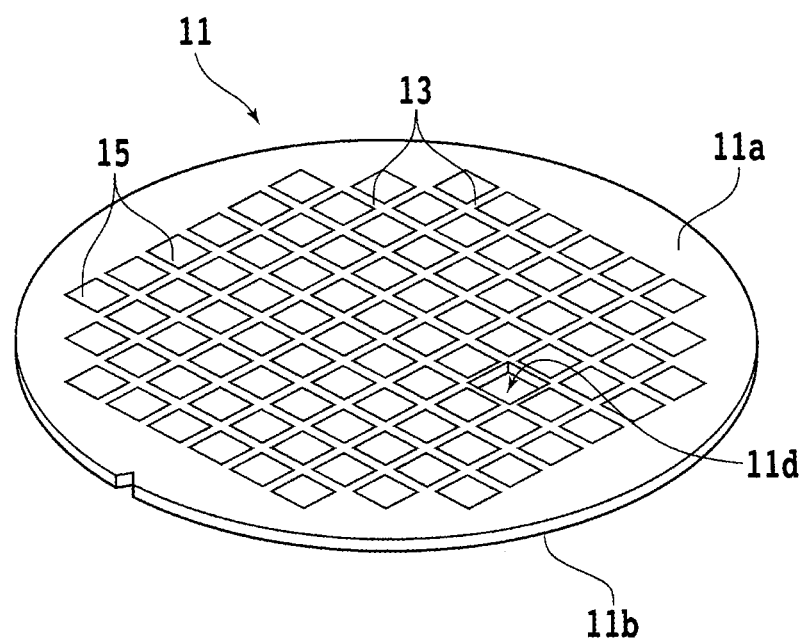
FIG. 3B is a perspective view depicting the wafer in which a through hole is formed.

FIG. 3B is a perspective view depicting the wafer 11 in which the through hole 11d is formed. The wafer 11 not including the defective device 15a is obtained by removing the defective device region 11c. Incidentally, when the above-described grinding step (see FIG. 2) is performed in advance before the removing step is performed, the wafer 11 is thinned, and thus the defective device region 11c is removed from the wafer 11 easily. However, when there is no difficulty in removing the defective device region 11c, the grinding step may be omitted.

Various methods can be used to remove the defective device region 11c. For example, the defective device region 11c is separated from the wafer 11 by applying a laser beam along the streets 13 surrounding the defective device 15a. In the following, description will be made of an example in which the wafer 11 is subjected to laser processing in the removing step.

Figure 4A:
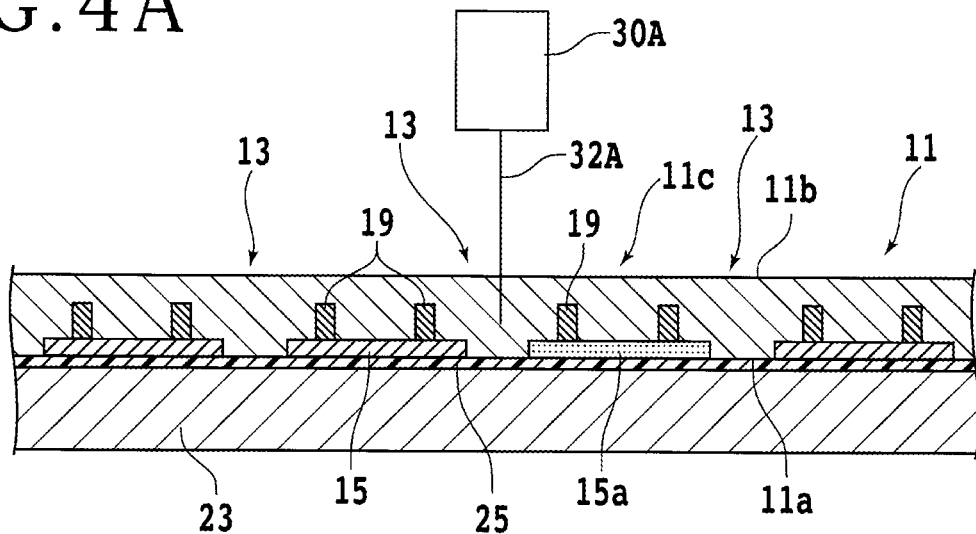
FIG. 4A is a sectional view depicting the wafer irradiated with a laser beam.

FIG. 4A is a sectional view depicting the wafer 11 irradiated with a laser beam 32A. In the removing step, first, the top surface 11a side of the wafer 11 is fixed to a support substrate 23 that supports the wafer 11. The support substrate 23 is, for example, a plate-shaped member formed of silicon, glass, ceramic, or the like. The top surface 11a side of the wafer 11 is fixed to the support substrate 23 via an adhesive layer 25. Consequently, the wafer 11 is supported by the support substrate 23 in a state in which the undersurface 11b side is exposed.

The material of the adhesive layer 25 is not limited, and is selected as appropriate according to the materials of the wafer 11 and the support substrate 23. For example, usable as the adhesive layer 25 is an adhesive formed of a thermosetting resin cured by heating, an adhesive formed of a thermoplastic resin softened by heating, an adhesive formed of an ultraviolet curable resin cured by application of ultraviolet rays, or the like.

In addition, the adhesive layer 25 may be a sheet that can be fixed to the wafer 11 and the support substrate 23 by heating and pressurization (thermocompression bonding sheet). For example, the adhesive layer 25 is a flexible sheet formed of a thermoplastic resin having a lower melting point than those of the wafer 11 and the support substrate 23, and does not include an adhesive (glue layer). When the wafer 11 is pressed against the support substrate 23 via the thermocompression bonding sheet while the thermocompression bonding sheet is heated, the thermocompression bonding sheet closely adheres to the wafer 11 and the support substrate 23. The wafer 11 is thereby fixed to the support substrate 23. Concrete examples of the sheet include a polyolefin (PO)-based sheet and a polyester (PE)-based sheet.

The polyolefin-based sheet is a sheet formed of a polymer synthesized with alkene as a monomer. Examples of the polyolefin-based sheet include a polyethylene sheet, a polypropylene sheet, a polystyrene sheet, and the like. In addition, a sheet formed of a copolymer of propylene and ethylene and a sheet formed of an olefin-based elastomer can also be used.

The polyester-based sheet is a sheet formed of a polymer synthesized with a dicarboxylic acid (compound having two carboxyl groups) and a diol (compound having two hydroxyl groups) as monomers. Examples of the polyester-based sheet include a polyethylene terephthalate sheet, a polyethylene naphthalate sheet, and the like. In addition, a polytrimethylene terephthalate sheet, a polybutylene terephthalate sheet, or a polybutylene naphthalate sheet can also be used.

Incidentally, when the wafer 11 is fixed to the support substrate 23 via the adhesive layer 25, the wafer 11 is preferably provisionally fixed to the support substrate 23 without the adhesive layer 25 being made to adhere firmly to the wafer 11 and the support substrate 23. This makes the defective device region 11c easily peeled off from the adhesive layer 25 when the defective device region 11c is to be separated from the wafer 11 in a subsequent step (see FIG. 8B).

For example, in a case where the adhesive layer 25 is an adhesive formed of a thermosetting resin, the wafer 11 is fixed to the support substrate 23 by performing heating treatment at a lower temperature or for a shorter time than in a case where the thermosetting resin is completely fixed to the wafer 11 and the support substrate 23. In addition, in a case where the adhesive layer 25 is an adhesive formed of a thermoplastic resin, the wafer 11 is fixed to the support substrate 23 in a state in which the thermoplastic resin is softened by heating to a predetermined temperature.

In a case where the adhesive layer 25 is an adhesive formed of an ultraviolet curable resin, the wafer 11 is fixed to the support substrate 23 without the ultraviolet curable resin being subjected to heating treatment. In addition, in a case where the adhesive layer 25 is a thermocompression bonding sheet, the wafer 11 is fixed to the support substrate 23 by performing heating treatment at a lower temperature or for a shorter time than in a case where the thermocompression bonding sheet is completely fixed to the wafer 11 and the support substrate 23.

In addition, in place of the support substrate 23, a tape formed of a resin or the like may be affixed to the top surface 11a side of the wafer 11. Examples of the structure and material of the tape are similar to those of the protective member 21 (see FIG. 2).

Next, the wafer 11 is subjected to laser processing. A laser processing apparatus is used for the laser processing of the wafer 11. The laser processing apparatus includes a chuck table (not depicted) that holds the wafer 11 and a laser irradiating unit 30A that irradiates the wafer 11 with the laser beam 32A. The laser irradiating unit 30A includes a laser oscillator that oscillates a laser of a predetermined wavelength and a condenser (condensing lens) that condenses a laser beam emitted from the laser oscillator.

Irradiation conditions of the laser beam 32A are set such that a region of the wafer 11 which is irradiated with the laser beam 32A is modified (altered) by multiphoton absorption. Specifically, the wavelength of the laser beam 32A is set such that at least a part of the laser beam 32A passes through the wafer 11. That is, the laser irradiating unit 30A applies the laser beam 32A having a wavelength transmissible through the wafer 11. In addition, other irradiation conditions (power, pulse width, spot diameter, repetition frequency, and the like) of the laser beam 32A are set such that the wafer 11 is modified appropriately.

Then, the laser beam 32A is applied along the four streets 13 surrounding the defective device 15a in a state in which the condensing point of the laser beam 32A is positioned inside the wafer 11. Incidentally, it suffices to apply the laser beam 32A so as to surround the defective device 15a, and a concrete scanning path of the laser beam 32A is set as appropriate.

Figure 5A:
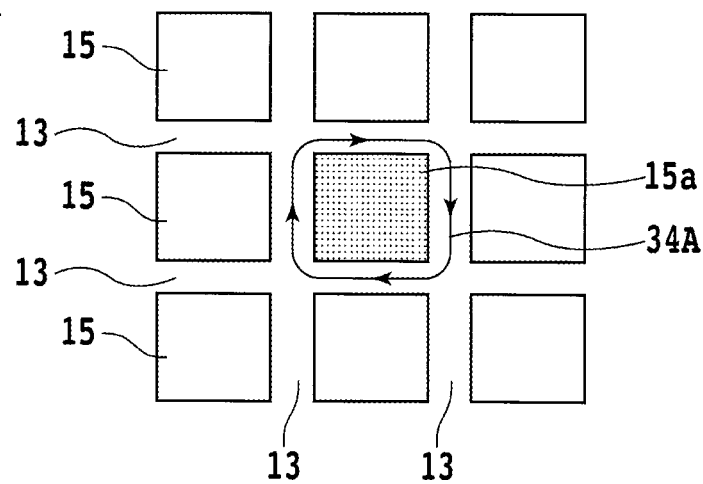
FIG. 5A is a plan view depicting a path in a quadrangular shape with rounded corners.
Figure 5B:
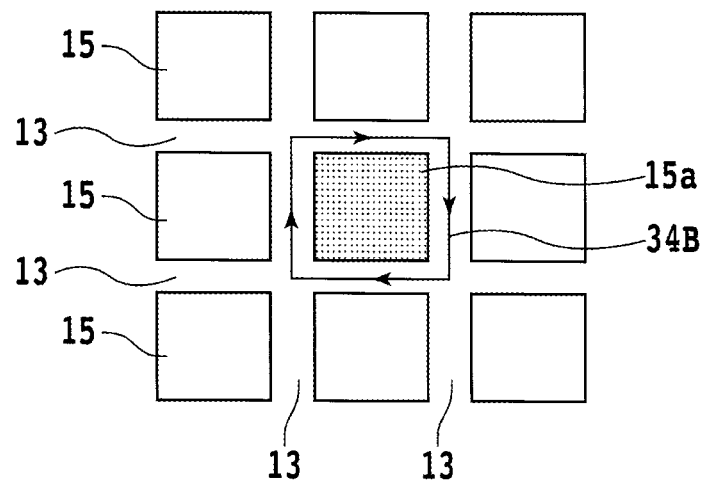
FIG. 5B is a plan view depicting a rectangular path.
Figure 5C:
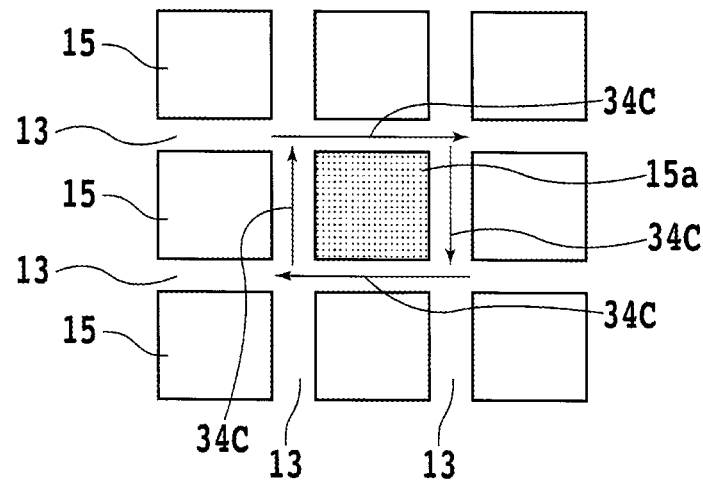
FIG. 5C is a plan view depicting a plurality of linear paths.

FIGS. 5A to 5C depict examples of the scanning path of the laser beam 32A. FIG. 5A is a plan view depicting a path 34A in a quadrangular shape with rounded corners. FIG. 5B is a plan view depicting a rectangular path 34B. FIG. 5C is a plan view depicting a plurality of linear paths 34C. Each of the path 34A, the path 34B, and the plurality of paths 34C is set so as to be superposed on the street 13.

For example, the laser beam 32A is scanned so as to surround the defective device 15a along the path 34A in a substantially rectangular shape having four corners formed in the shape of an arc. In addition, the laser beam 32A may be scanned along the path 34B in a rectangular shape surrounding the defective device 15a. Incidentally, in the case where the laser beam 32A is scanned along the path 34A or the path 34B, the laser beam 32A is continuously applied to the wafer 11 so as to surround the defective device 15a (drawing with one stroke).

In addition, the laser beam 32A may be scanned along the four linear paths 34C along the four streets 13 surrounding the defective device 15a. Incidentally, the paths 34C are not coupled to each other, so that the laser beam 32A is applied intermittently so as to surround the defective device 15a.

Figure 4B:
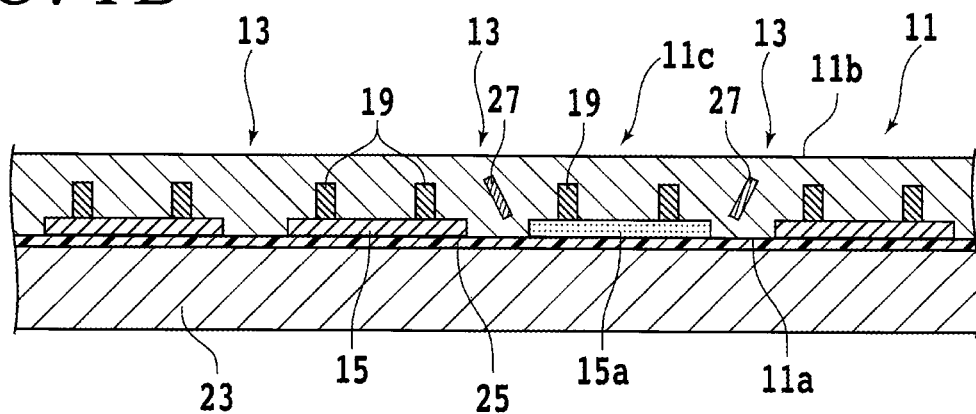
FIG. 4B is a sectional view depicting the wafer in which a modified layer is formed.

FIG. 4B is a sectional view depicting the wafer 11 in which a modified layer (altered layer) 27 is formed. When the laser beam 32A is applied along the streets 13 surrounding the defective device 15a, the wafer 11 is modified by multiphoton absorption, and the modified layer 27 is formed in the wafer 11 along the streets 13. Then, a region in which the modified layer 27 is formed is fragile than other regions of the wafer 11. Therefore, when an external force is applied to the wafer 11, for example, the wafer 11 ruptures along the modified layer 27. That is, the modified layer 27 functions as a starting point (trigger) of separation of the defective device region 11c.

It has been confirmed that the application of the laser beam 32A along the path 34A depicted in FIG. 5A or the paths 34C depicted in FIG. 5C, in particular, effectively suppresses the occurrence of unintended irregular cracks at four corners (corner portions) of the path 34A or 34C. In this case, the modified layer 27 formed at the four corners of the path 34A or 34C properly functions as a starting point of division, and the defective device region 11c is correctly separated easily.

Incidentally, the modified layer 27 may be formed by applying the laser beam 32A along each street 13 a plurality of times while the height position of the condensing point of the laser beam 32A is changed. In this case, the modified layer 27 is formed by modified regions formed in a plurality of stages along the thickness direction of the wafer 11.

Figure 4C:
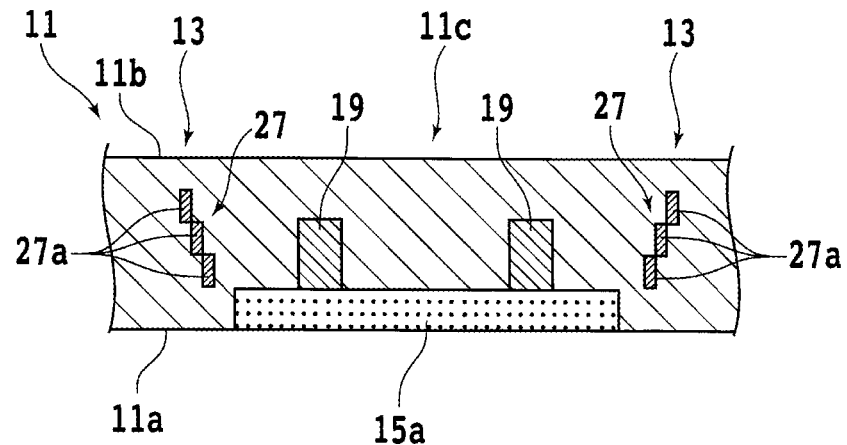
FIG. 4C is a sectional view depicting a modified layer including a plurality of modified regions.

FIG. 4C is a sectional view depicting a modified layer 27 including a plurality of modified regions (altered regions) 27a. For example, the modified regions 27a in a plurality of stages are formed in the wafer 11 along each street 13 at different depth positions in the thickness direction of the wafer 11.

Incidentally, the plurality of modified regions 27a may be formed so as not to overlap each other as viewed in plan. Specifically, as depicted in FIG. 4C, the plurality of modified regions 27a are formed such that the closer to the undersurface 11b side of the wafer 11 a modified region 27a is formed, the more distant from the defective device 15a the position of the modified region 27a is in the horizontal direction (direction perpendicular to the thickness direction of the wafer 11). In this case, the modified layer 27 inclined with respect to the thickness direction of the wafer 11 is formed (see FIG. 4B), so that it becomes easy to separate the defective device region 11c from the wafer 11 in a subsequent step (see FIG. 8B). However, there is no limitation on the shape of the modified layer 27. The modified layer 27 may be formed in parallel with the thickness direction of the wafer 11.

Next, a processed region (modified layer 27) processed by the application of the laser beam 32A or a crack developed from the processed region (modified layer 27) is exposed on the undersurface 11b side of the wafer 11 by grinding the undersurface 11b side of the wafer 11. The grinding apparatus 2 depicted in FIG. 2, for example, is used to grind the wafer 11.

The undersurface 11b side of the wafer 11 is ground by bringing the grinding stones 16 into contact with the undersurface 11b side of the wafer 11 held by the chuck table 4. Then, for example, the wafer 11 is ground and thinned until the modified layer 27 is exposed on the undersurface 11b side of the wafer 11.

Figure 6:
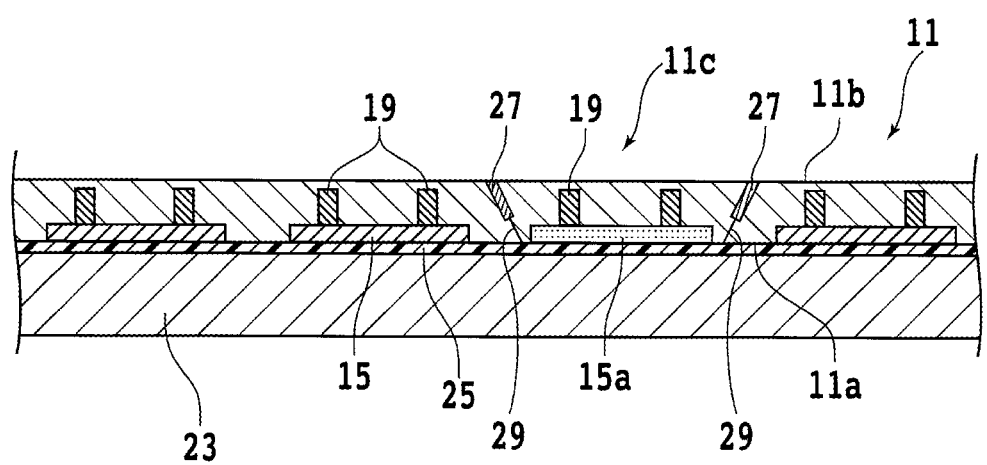
FIG. 6 is a sectional view depicting the wafer after being ground.

FIG. 6 is a sectional view depicting the wafer 11 after being ground. When the wafer 11 is ground by pressing the grinding stones 16 (see FIG. 2) against the wafer 11, an external force (pressure) is applied to the wafer 11, and the wafer 11 ruptures along the modified layer 27. In addition, a crack 29 occurring in the modified layer 27 develops, and reaches the top surface 11a of the wafer 11. As a result, the defective device region 11c is divided from the wafer 11.

Incidentally, the crack 29 developed from the modified layer 27 to the top surface 11a of the wafer 11 may occur when the modified layer 27 is formed by applying the laser beam 32A (see FIG. 4A and FIG. 4B). Specifically, appropriate setting of the irradiation conditions of the laser beam 32A and the position at which the modified layer 27 is formed can make the crack 29 occurring at the same time as the formation of the modified layer 27 reach the top surface 11a of the wafer 11.

In addition, after the grinding of the wafer 11, the wafer 11 is preferably subjected to etching processing. For example, the wafer 11 is subjected to plasma etching. A plasma processing apparatus is used for the plasma etching. The plasma processing apparatus includes a chuck table having a holding surface for holding the wafer 11 and a chamber (processing chamber) housing the chuck table.

Figure 7A:
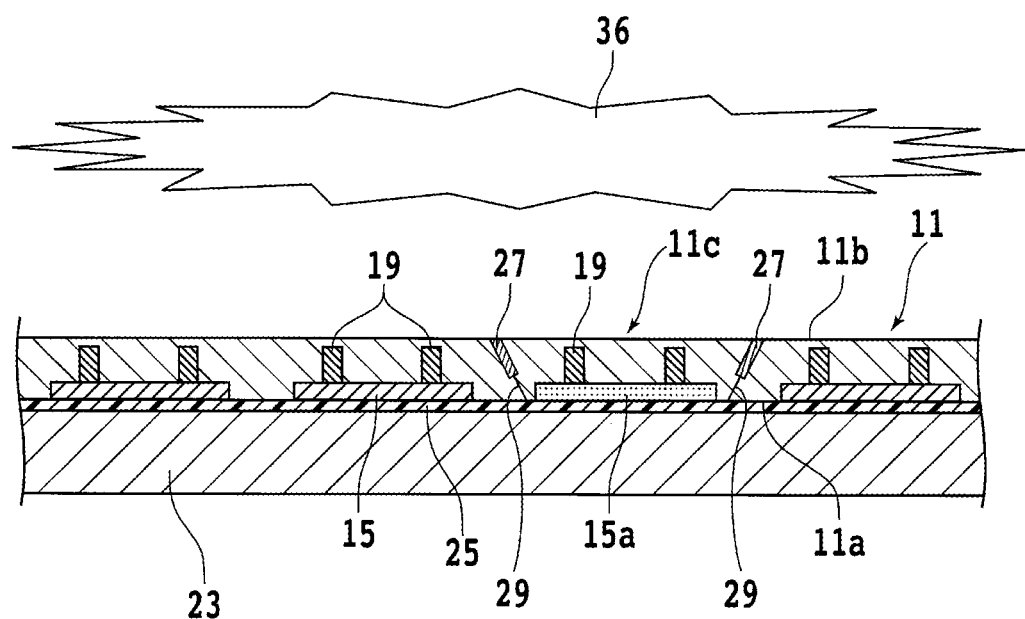
FIG. 7A is a sectional view depicting the wafer subjected to plasma etching.

FIG. 7A is a sectional view depicting the wafer 11 subjected to the plasma etching. When the plasma etching is performed, the chamber is sealed in a state in which the wafer 11 is held by the chuck table, and the inside of the chamber is supplied with gas (etching gas) 36 for the etching. Then, the plasma processing apparatus sets gas 36 within the chamber in a plasma state including ions and radicals by a high frequency voltage. Consequently, the gas 36 converted into plasma is supplied to the wafer 11.

In a case where the wafer 11 is a silicon wafer, for example, fluorine-based gas such as $CF_4$ or $SF_6$ is used as the gas 36. However, the component of the gas 36 is selected as appropriate according to the material of the wafer 11. Then, the gas 36 in the plasma state acts on the wafer 11, and thus the wafer 11 is subjected to the plasma etching.

Figure 7B:
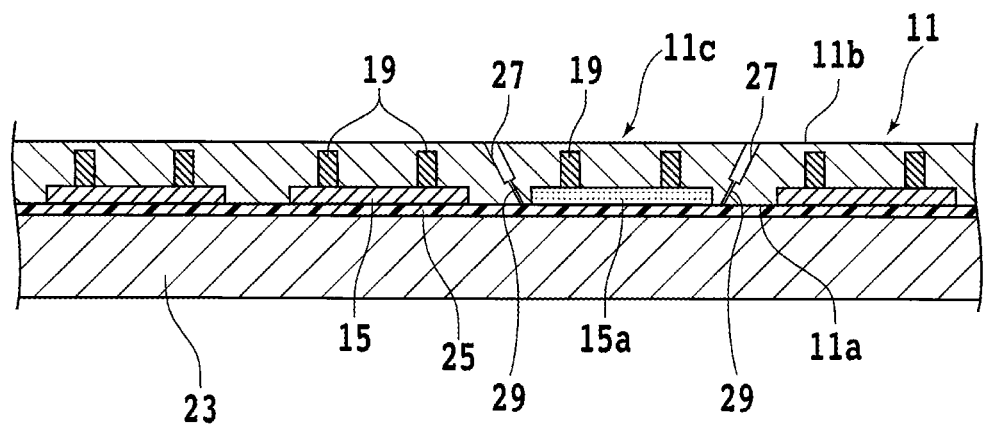
FIG. 7B is a sectional view depicting the wafer after the plasma etching.

FIG. 7B is a sectional view depicting the wafer 11 after the plasma etching. When the gas 36 converted into plasma is supplied to the undersurface 11b side of the wafer 11, the gas 36 enters the modified layer 27 and the crack 29, and the insides of the modified layer 27 and the crack 29 are etched. As a result, a gap between the wafer 11 and the defective device region 11c is expanded, and the defective device region 11c is surely divided from the wafer 11.

However, the gas 36 may be supplied to the inside of the chamber via a supply pipe made of a metal after the gas 36 is converted into plasma outside the chamber. In this case, when the gas 36 converted into plasma passes through the supply pipe, ions included in the gas are adsorbed by the inner wall of the supply pipe, and do not easily reach the inside of the chamber. As a result, the gas 36 having a high radical ratio is introduced into the chamber, and is supplied to the wafer 11. The gas 36 having a high radical ratio easily enters narrow regions in the wafer 11. Thus, the gas 36 easily etches the insides of the modified layer 27 and the crack 29.

In addition, the kind of etching processing is not limited to the plasma etching. For example, the wafer 11 may be subjected to wet etching by supplying an etchant to the undersurface 11b side of the wafer 11. Specifically, in a case where the wafer 11 is a silicon wafer, an etchant including potassium hydroxide (KOH), tetramethylammonium hydroxide (TMAH), or the like is supplied to the wafer 11. Then, the etchant enters the modified layer 27 and the crack 29. The insides of the modified layer 27 and the crack 29 are thereby etched, so that the modified layer 27 and the crack 29 are expanded.

Incidentally, in a case where the modified layer 27 formed by the application of the laser beam 32A (see FIG. 4B) is located more on the undersurface 11b side of the wafer 11 than the electrode 19, the wafer 11 is preferably ground and thinned until all of the modified layer 27 is removed. In this case, the wafer 11 that does not include the modified layer 27 but in which only the crack 29 developed from the modified layer 27 remains is obtained. When the modified layer 27 is thus removed from the wafer 11 in advance, a decrease in transverse rupture strength (bending strength) of device chips ultimately obtained by dividing the wafer 11 is prevented.

In the case where the modified layer 27 is removed from the wafer 11 as described above, the crack 29 is exposed on the undersurface 11b side of the wafer 11 by grinding, and the defective device region 11c is thus divided from the wafer 11. Then, the gas 36 converted into plasma or an etchant is supplied to the inside of the crack 29, so that the crack 29 is expanded.

In addition, when the modified layer 27 is formed by the application of the laser beam 32A (see FIG. 4A and FIG. 4B), or when the undersurface 11b side of the wafer 11 is ground (see FIG. 6), a crack developed from the modified layer 27 toward the undersurface 11b side of the wafer 11 may occur. In this case, when the crack is exposed on the undersurface 11b of the wafer 11 by the grinding of the wafer 11, the defective device region 11c is divided from the wafer 11.

Next, the defective device region 11c is removed from the wafer 11. Specifically, the defective device region 11c is separated from the wafer 11 by peeling and picking up the defective device region 11c from the adhesive layer 25.

When the defective device region 11c is to be separated from the wafer 11, processing (preprocessing) of partly reducing the adhesive power of the adhesive layer 25 is preferably performed first. For example, the supply of a chemical solution to the adhesive layer 25 via the modified layer 27 and the crack 29 partly reduces the adhesive power of the adhesive layer 25, or partly removes the adhesive layer 25.

In addition, in a case where the adhesive layer 25 is formed of a material whose adhesive power is reduced by application of predetermined energy (heating, application of an electromagnetic wave, or the like), the adhesive power of the adhesive layer 25 may be reduced by applying energy to the adhesive layer 25. For example, in a case where the adhesive layer 25 is an adhesive formed of a thermoplastic resin, the adhesive power of the adhesive layer 25 can be reduced by heating the adhesive layer 25. In addition, in a case where the adhesive layer 25 is an adhesive formed of an ultraviolet curable resin, the adhesive power of the adhesive layer 25 can be reduced by applying ultraviolet rays to the adhesive layer 25.

In addition, as the adhesive layer 25, a tape which includes a film-shaped base material, a thermally foamed layer provided on one surface side of the base material, and an adhesive layer provided on another surface side of the base material can also be used. The thermally foamed layer of this tape is formed by including an expanding material expanded by heating in an adhesive.

Usable as the adhesive of the thermally foamed layer is an acryl-based adhesive, a rubber-based adhesive, a vinyl alkyl ether-based adhesive, a silicone-based adhesive, a polyester-based adhesive, a polyamide-based adhesive, a urethane-based adhesive, or the like. In addition, usable as the expanding material of the thermally foamed layer is microspheres expanded by heating (thermally expandable microspheres), a foamed material foamed by heating, or the like.

The thermally expandable microspheres are formed by including a material expanded by heating in microcapsules having elasticity. Usable as the material expanded by heating is, for example, propane, propylene, butene, or the like. An example of a commercially available product of a tape including the thermally expandable microspheres is REVALPHA (registered trademark) manufactured by Nitto Denko Corporation. In addition, usable as the foamed material foamed by heating are, for example, inorganic-based foam agents such as ammonium carbonate, ammonium hydrogen carbonate, sodium hydrogen carbonate, ammonium nitrite, sodium borohydride, and azides and various kinds of organic-based foam agents.

The above-described tape is affixed to the wafer 11 and the support substrate 23 such that the thermally foamed layer side is in contact with the wafer 11 and the adhesive layer side is in contact with the support substrate 23. Then, when the tape is heated, the expanding material included in the thermally foamed layer expands in a heated region of the tape, and forms projections and depressions, so that the adhesive power of the tape adhering to the wafer 11 is decreased.

Figure 8A:
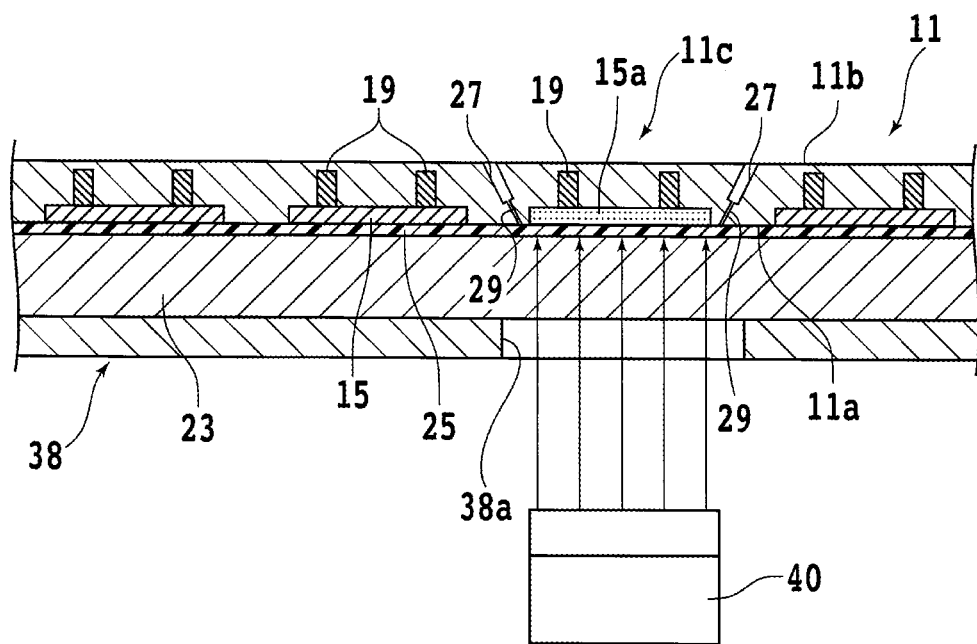
FIG. 8A is a sectional view depicting the wafer when preprocessing is performed on an adhesive layer.

FIG. 8A is a sectional view depicting the wafer 11 when preprocessing is performed on the adhesive layer 25. For example, a mask 38 is fixed to a surface (lower surface) side of the support substrate 23 which surface side is on an opposite side of a surface (upper surface) of the support substrate 23 to which surface the wafer 11 is fixed. Incidentally, the mask 38 has an opening 38a vertically penetrating the mask 38, and is fixed such that the opening 38a coincides with the defective device region 11c.

In addition, an energy applying unit 40 that applies energy to the adhesive layer 25 is disposed below the support substrate 23. The energy applying unit 40 applies energy to the adhesive layer 25 via the opening 38a of the mask 38. Incidentally, the kind of the energy applied from the energy applying unit 40 to the adhesive layer 25 is selected according to the properties of the adhesive layer 25.

For example, in a case where the adhesive layer 25 is an adhesive formed of a thermoplastic resin or a tape including a thermally foamed layer, a heater is used as the energy applying unit 40. In addition, a heat insulating member is used as the mask 38. Then, heat is applied from the energy applying unit 40 to a region coinciding with the opening 38a of the mask 38 in the support substrate 23, and the heat of the support substrate 23 is transmitted to the adhesive layer 25. Consequently, a region coinciding with the opening 38a of the mask 38 in the adhesive layer 25 is partly heated.

In addition, in a case where the adhesive layer 25 is an adhesive formed of an ultraviolet curable resin, a light source (lamp) that applies ultraviolet rays is used as the energy applying unit 40. In addition, a member having a transmitting property for ultraviolet rays is used as the support substrate 23, and a member having a light shielding property for ultraviolet rays is used as the mask 38. Then, ultraviolet rays are applied from the energy applying unit 40 to the adhesive layer 25 via the opening 38a of the mask 38 and the support substrate 23. Consequently, the region coinciding with the opening 38a of the mask 38 in the adhesive layer 25 is partly irradiated with the ultraviolet rays.

When energy is applied from the energy applying unit 40 to the adhesive layer 25, the adhesive power of a region coinciding with the defective device region 11c in the adhesive layer 25 is partly decreased. Consequently, the defective device region 11c is easily peeled off from the adhesive layer 25.

Figure 8B:
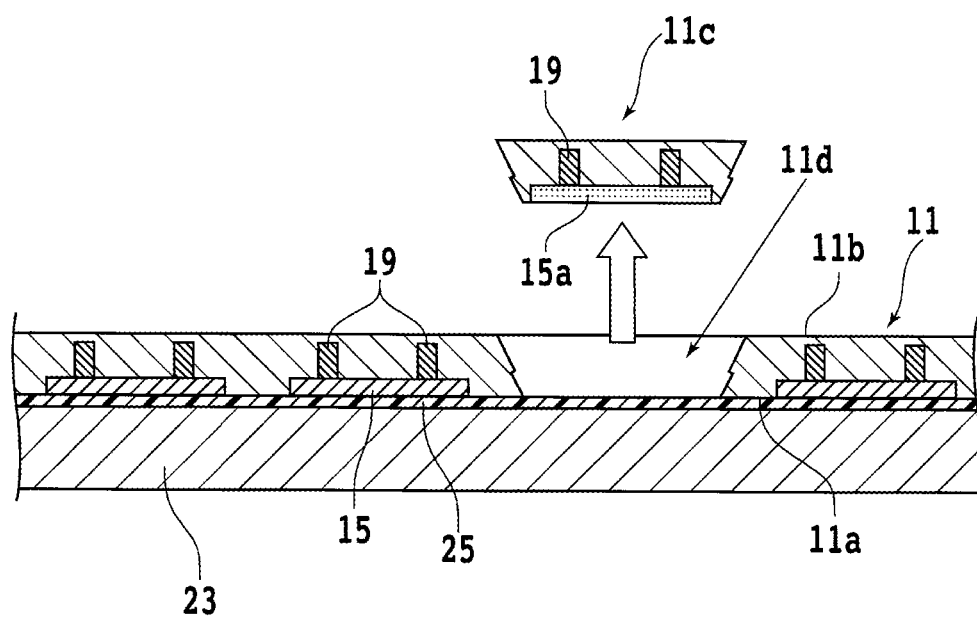
FIG. 8B is a sectional view depicting the wafer when a defective device region is separated.

FIG. 8B is a sectional view depicting the wafer 11 when the defective device region 11c is separated. After preprocessing is performed on the wafer 11 as required, the defective device region 11c is held and separated from the wafer 11. Consequently, the defective device region 11c is peeled off from the adhesive layer 25, and is removed from the wafer 11.

Figure 9:
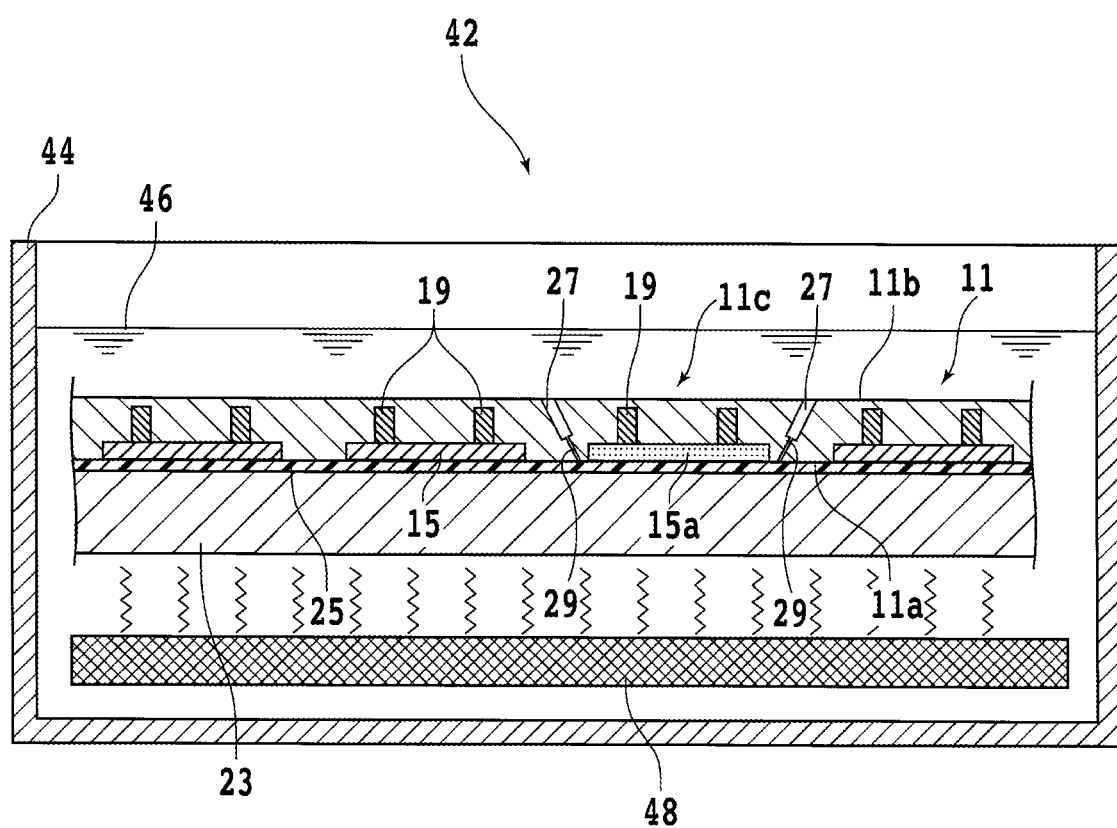
FIG. 9 is a sectional view depicting an ultrasonic irradiating unit.

Incidentally, when the defective device region 11c is separated from the wafer 11, the irradiation of the wafer 11 or the support substrate 23 with an ultrasonic wave may assist in separating the defective device region 11c. FIG. 9 is a sectional view depicting an ultrasonic irradiating unit 42.

The ultrasonic irradiating unit 42 has a box-shaped container 44 formed in a rectangular parallelepipedic shape. A liquid 46 such as pure water is retained within the container 44. In addition, an ultrasonic transmitter 48 that emits an ultrasonic wave is provided within the container 44.

The wafer 11 in which the modified layer 27 and the crack 29 are formed is housed in the container 44 so as to be immersed in the liquid 46. At this time, the wafer 11 is, for example, disposed such that the support substrate 23 faces the ultrasonic transmitter 48. When the ultrasonic transmitter 48 is made to transmit an ultrasonic wave in this state, the ultrasonic wave propagates with the liquid 46 as a medium, and reaches the support substrate 23, so that an ultrasonic vibration is applied to the support substrate 23.

Even if the wafer 11 is in a state of not rupturing sufficiently along the modified layer 27 and the crack 29, the vibration of the support substrate 23 promotes the rupture of the wafer 11 when the ultrasonic vibration is applied to the support substrate 23. In addition, the vibration of the support substrate 23 weakens bonding between the defective device region 11c and the adhesive layer 25. As a result, the defective device region 11c is separated from the wafer 11 easily. Incidentally, the ultrasonic wave may be partly applied to the region coinciding with the defective device region 11c in the support substrate 23.

The defective device region 11c is thus separated from the wafer 11. Then, the through hole 11d penetrating the wafer 11 in the thickness direction is formed in a position where the defective device region 11c of the wafer 11 existed (see FIG. 8B).

Incidentally, in the above description, a method of rupturing the wafer 11 along the modified layer 27 and the crack 29 formed by the application of the laser beam 32A has been described as an example. However, the content of the laser processing performed on the wafer 11 is not limited to the formation of the modified layer 27 and the crack 29. For example, in the removing step, it is also possible to separate the defective device region 11c from the wafer 11 by performing ablation processing on the wafer 11.

Figure 10A:
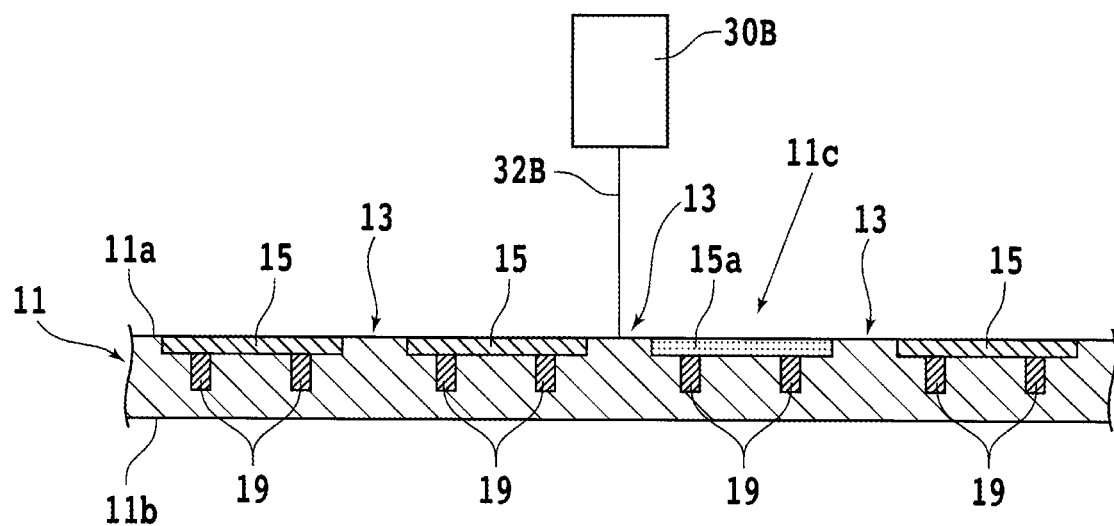
FIG. 10A is a sectional view depicting the wafer irradiated with a laser beam.

FIG. 10A is a sectional view depicting the wafer 11 irradiated with a laser beam 32B. In a case where the ablation processing is performed on the wafer 11, a laser irradiating unit 30B which irradiates the wafer 11 with the laser beam 32B is used. Incidentally, the configuration of the laser irradiating unit 30B is similar to that of the laser irradiating unit 30A (see FIG. 4A).

However, irradiation conditions of the laser beam 32B are set such that a region of the wafer 11 which is irradiated with the laser beam 32B is removed by the ablation processing. Specifically, the wavelength of the laser beam 32B is set such that at least a part of the laser beam 32B is absorbed by the wafer 11. That is, the laser irradiating unit 30B applies the laser beam 32B of a wavelength absorbable by the wafer 11. In addition, other irradiation conditions of the laser beam 32B are also set such that the ablation processing is properly performed on the wafer 11.

The laser beam 32B is, for example, applied to the top surface 11a side of the wafer 11. Specifically, the wafer 11 is held by the chuck table (not depicted) of the laser processing apparatus such that the top surface 11a side is exposed. Then, in a state in which the condensing point of the laser beam 32B is positioned at a street 13 of the wafer 11, the laser beam 32B is applied along the four streets 13 surrounding the defective device 15a. It is to be noted that the scanning path of the laser beam 32B is not limited. For example, the laser beam 32B is scanned along the path 34A or the path 34B depicted in FIG. 5A or FIG. 5B.

Figure 10B:
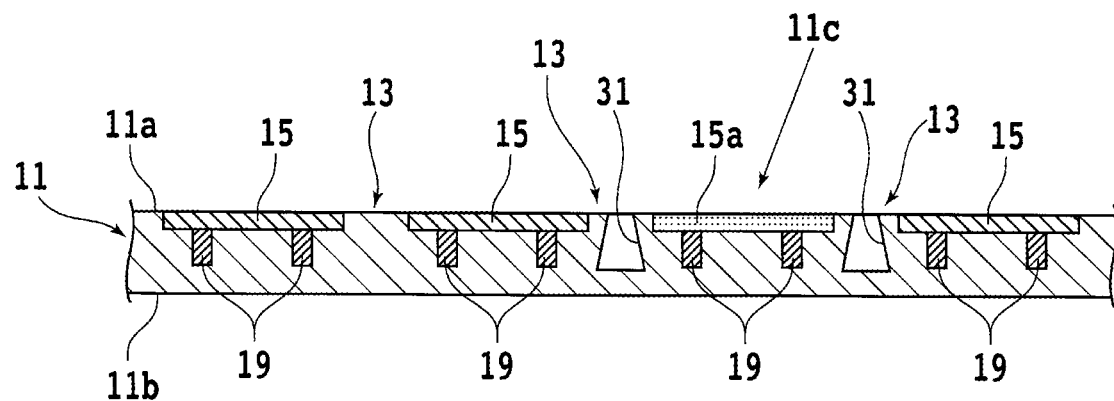
FIG. 10B is a sectional view depicting the wafer in which a groove is formed.

FIG. 10B is a sectional view depicting the wafer 11 in which a groove 31 is formed. When the laser beam 32B is applied along the four streets 13 surrounding the defective device 15a, a region along the streets 13 on the top surface 11a side of the wafer 11 is removed by the ablation processing. As a result, on the top surface 11a side of the wafer 11, the groove 31 in a rectangular shape as viewed in plan is formed along the streets 13.

It is to be noted that the shape of the groove 31 is not limited. For example, the groove 31 may be formed so as to have a width fixed in the thickness direction of the wafer 11, or may be formed so as to have a width increasing toward the undersurface 11b side of the wafer 11, as depicted in FIG. 10B.

In addition, when the groove 31 is formed, the top surface 11a side of the wafer 11 may be covered by a protective film, and the wafer 11 may be irradiated with the laser beam 32B via the protective film. Usable as the protective film is, for example, a tape made of a resin or a film formed of a water-soluble resin such as polyvinyl alcohol (PVA) or polyethylene glycol (PEG). When the protective film is formed on the top surface 11a side of the wafer 11, a processing waste (debris) produced at the time of the ablation processing can be prevented from adhering to the top surface 11a of the wafer 11, so that contamination of the wafer 11 and the semiconductor devices 15 is avoided.

In addition, the wafer 11 may be subjected to etching processing by supplying gas converted into plasma or an etchant to the processed region (groove 31) processed by the application of the laser beam 32B. Consequently, the groove 31 is expanded, and minute projections and depressions formed on the inner wall of the groove 31 by the ablation processing are removed.

When the wafer 11 is to be subjected to the etching processing, a mask covering the top surface 11a side of the wafer 11 is preferably formed. This mask is provided with an opening for exposing the region where the groove 31 is formed in the wafer 11. Then, the gas converted into plasma or the etchant is supplied to the wafer 11 via the mask. Thus, the semiconductor devices 15 formed on the top surface 11a side of the wafer 11 are protected.

It is to be noted that there is no limitation on the material of the mask used in the etching processing. For example, a resist formed of a photosensitive resin is used as the mask. Also usable as the mask is the above-described protective film (PVA, PEG, or the like) formed on the top surface 11a side of the wafer 11 at the time of the application of the laser beam 32B.

Figure 11A:
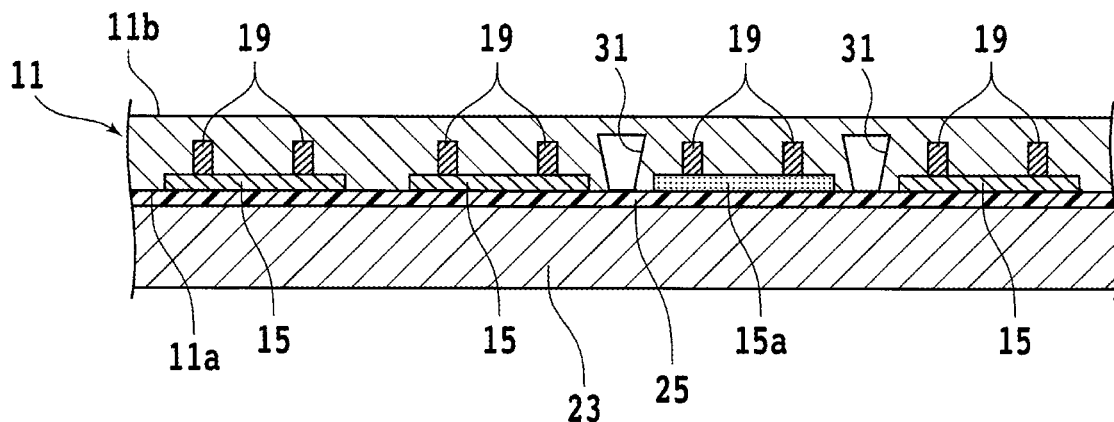
FIG. 11A is a sectional view depicting the wafer fixed to a support substrate.

Next, the processed region (groove 31) processed by the application of the laser beam 32B is exposed on the undersurface 11b side of the wafer 11 by grinding the undersurface 11b side of the wafer 11. When the wafer 11 is to be ground, first, the wafer 11 is fixed to the support substrate. FIG. 11A is a sectional view depicting the wafer 11 fixed to the support substrate 23. In a case where the undersurface 11b side of the wafer 11 is ground, the top surface 11a side of the wafer 11 is fixed to the support substrate 23 via the adhesive layer 25.

Next, the grinding apparatus 2 (see FIG. 2) grinds the wafer 11. Specifically, the undersurface 11b side of the wafer 11 is ground by bringing the grinding stones 16 into contact with the undersurface 11b side of the wafer 11. Then, the wafer 11 is ground and thinned until the groove 31 is exposed on the undersurface 11b side of the wafer 11.

Figure 11B:
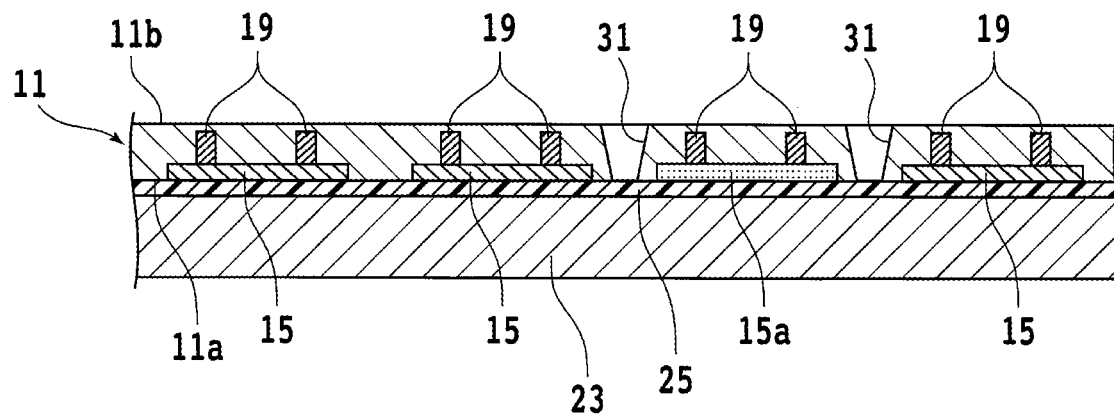
FIG. 11B is a sectional view depicting the wafer after being ground.

FIG. 11B is a sectional view depicting the wafer 11 after being ground. When the groove 31 is exposed on the undersurface 11b side of the wafer 11, the defective device region 11c is divided from the wafer 11. Thereafter, as described earlier, the defective device region 11c is separated from the wafer 11, and the through hole 11d is formed in the wafer 11 (see FIG. 8A, FIG. 8B, and FIG. 9).

In addition, in the removing step, the wafer 11 may be cut by applying a laser beam. Specifically, a kerf (slit) extending from the top surface 11a to the undersurface 11b of the wafer 11 is formed along the streets 13 by ablation processing.

Figure 12A:
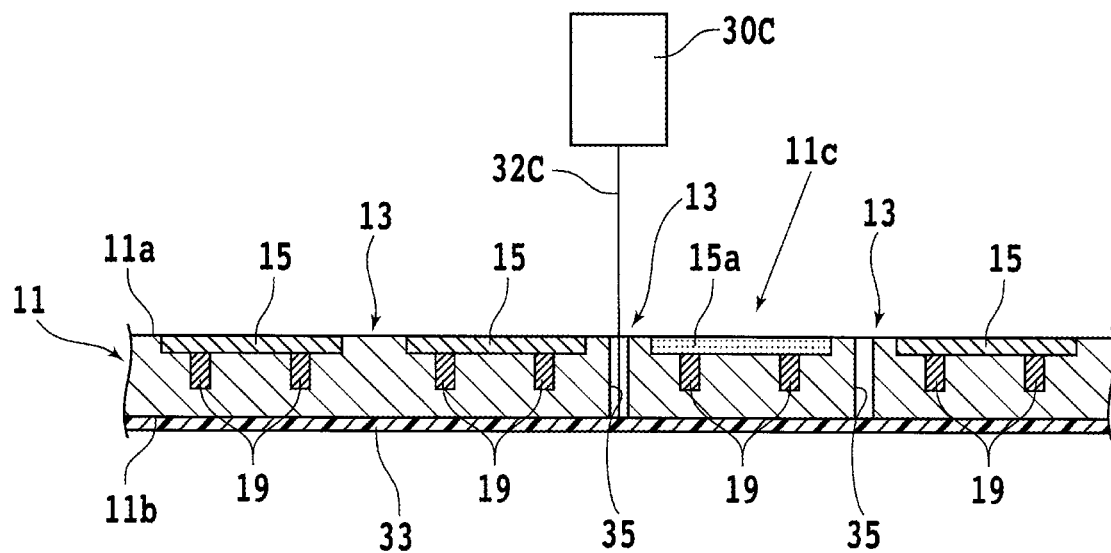
FIG. 12A is a sectional view depicting the wafer irradiated with a laser beam.

FIG. 12A is a sectional view depicting the wafer 11 irradiated with a laser beam 32C. A laser irradiating unit 30C that irradiates the wafer 11 with the laser beam 32C is used to cut the wafer 11. Incidentally, the configuration of the laser irradiating unit 30C is similar to that of the laser irradiating unit 30A (see FIG. 4A).

However, irradiation conditions of the laser beam 32C are set such that a region extending from the top surface 11a to the undersurface 11b of the wafer 11 is removed by the ablation processing. Specifically, the wavelength of the laser beam 32C is set such that at least a part of the laser beam 32C is absorbed by the wafer 11. That is, the laser irradiating unit 30C applies the laser beam 32C of a wavelength absorbable by the wafer 11. In addition, other irradiation conditions of the laser beam 32C are also set such that the region extending from the top surface 11a to the undersurface 11b of the wafer 11 is removed.

When the wafer 11 is to be irradiated with the laser beam 32C, first, a protective member 33 such as a tape is affixed to the wafer 11. For example, in a case where the top surface 11a side of the wafer 11 is irradiated with the laser beam 32C, a tape is affixed as the protective member 33 to the undersurface 11b side of the wafer 11.

Next, the laser beam 32C is applied to the top surface 11a side of the wafer 11. Specifically, in a state in which the condensing point of the laser beam 32C is positioned at a street 13 of the wafer 11, the laser beam 32C is applied along the four streets 13 surrounding the defective device 15a. It is to be noted that the scanning path of the laser beam 32C is not limited. For example, the laser beam 32C is scanned along the path 34A or the path 34B depicted in FIG. 5A or FIG. 5B.

When the laser beam 32C is applied along the streets 13 surrounding the defective device 15a, a region of the wafer 11 is removed along the streets 13. As a result, in the wafer 11, a kerf (slit) 35 extending from the top surface 11a to the undersurface 11b is formed along the streets 13. As a result, the defective device region 11c is divided from the wafer 11.

Incidentally, in a case where it is difficult to form the kerf 35 reaching the undersurface 11b of the wafer 11 by merely scanning the laser beam 32C along the streets 13 once, the laser beam 32C may be scanned along each street 13 a plurality of times. Thereafter, as described earlier, the defective device region 11c is separated from the wafer 11, and the through hole 11d is formed in the wafer 11 (see FIG. 8A, FIG. 8B, and FIG. 9).

Figure 12B:
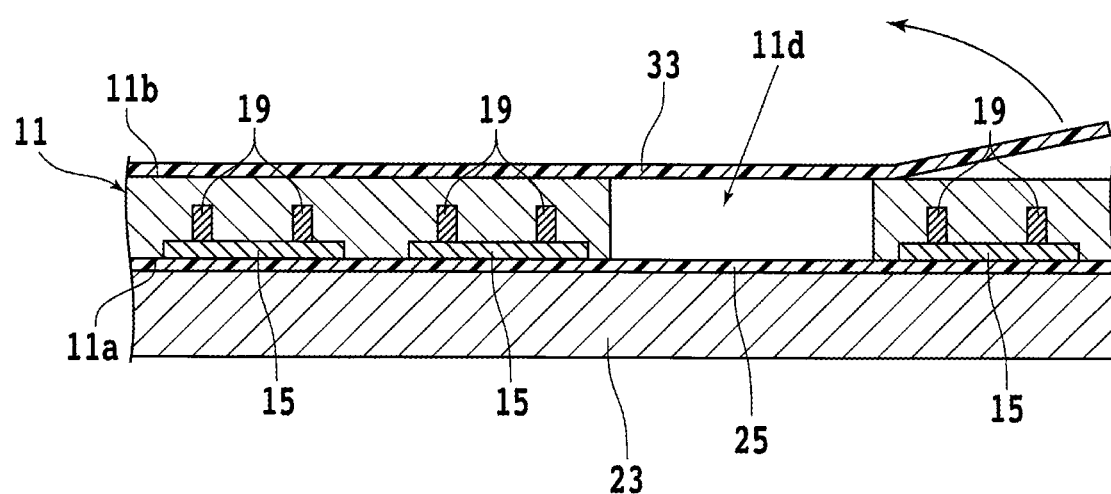
FIG. 12B is a sectional view depicting the wafer fixed to the support substrate.

After the defective device region 11c is separated from the wafer 11, the wafer 11 is fixed to the support substrate 23. FIG. 12B is a sectional view depicting the wafer 11 fixed to the support substrate 23. After the kerf 35 is formed in the wafer 11 and the defective device region 11c is separated, the support substrate 23 is fixed to the top surface 11a side of the wafer 11 via the adhesive layer 25. The protective member 33 is thereafter peeled and removed from the undersurface 11b side of the wafer 11.

Figure 13A:
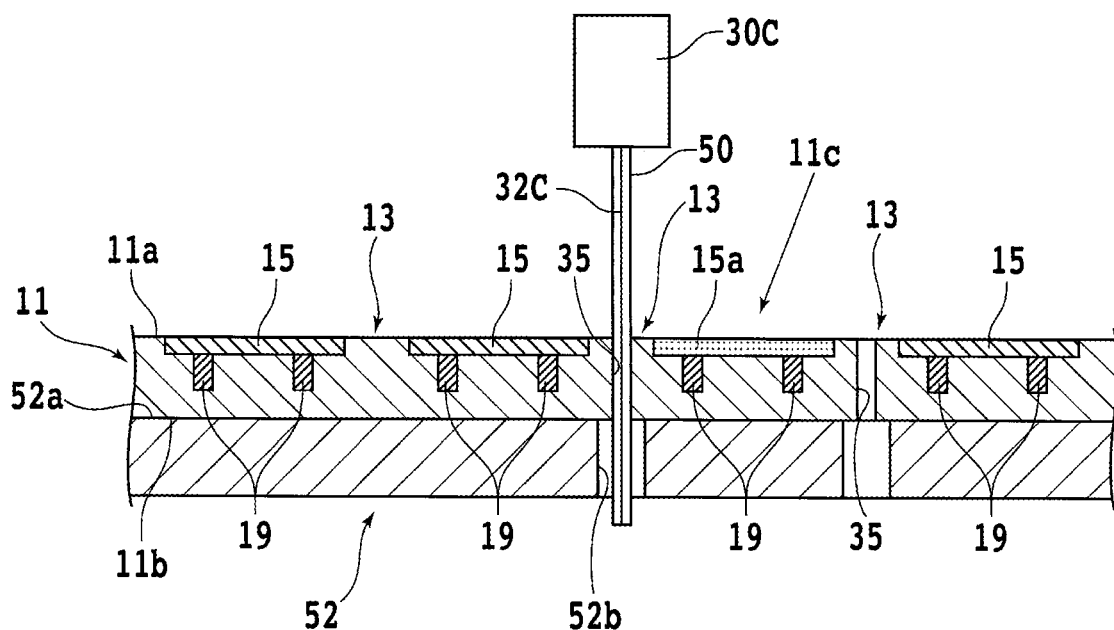
FIG. 13A is a sectional view depicting the wafer irradiated with the laser beam via a liquid column.

In addition, in the removing step, it is also possible to process the wafer 11 by a laser beam applied via a liquid (aqua laser). FIG. 13A is a sectional view depicting the wafer 11 irradiated with the laser beam 32C via a liquid column 50.

The laser irradiating unit 30C may include a jetting unit (nozzle) that jets a liquid to the wafer 11. In this case, the liquid column 50 extending from the laser irradiating unit 30C to the wafer 11 is formed by continuously supplying the liquid from the jetting unit to the wafer 11. The liquid column 50 is a column formed by a flowing liquid. The liquid column 50 functions as a light guiding path for propagating the laser beam 32C. For example, water is jetted from the jetting unit, and a water column is formed.

The wafer 11 is held by a holding table 52. The upper surface of the holding table 52 constitutes a flat holding surface 52a that holds the wafer 11. In addition, the holding table 52 is provided with an opening 52b that vertically penetrates the holding table 52. The opening 52b is formed in a rectangular shape as viewed in plan so as to correspond to the four streets 13 surrounding the semiconductor device 15. The wafer 11 is disposed on the holding table 52 such that each of the four streets 13 surrounding the defective device 15a coincides with the opening 52b.

Then, the liquid column 50 is formed by jetting the liquid from the laser irradiating unit 30C, and the laser beam 32C is applied from the laser irradiating unit 30C. At this time, the condensing point of the laser beam 32C is positioned inside the liquid column 50. The laser beam 32C is applied to the wafer 11 via the liquid column 50.

The application of the laser beam 32C to the liquid column 50 as described above makes it possible to guide the laser beam 32C to the streets 13 of the wafer 11 even when the height position of the condensing point of the laser beam 32C is not precisely controlled. In addition, the liquid washes away a processing waste (debris) produced by the laser processing.

Then, the laser beam 32C is scanned along the streets 13 together with the liquid column 50. Consequently, the kerf 35 is formed in the wafer 11 along the streets 13, and the defective device region 11c is thus divided from the wafer 11. Incidentally, the liquid jetted from the laser irradiating unit 30C is discharged via the opening 52b provided in the holding table 52.

Figure 13B:
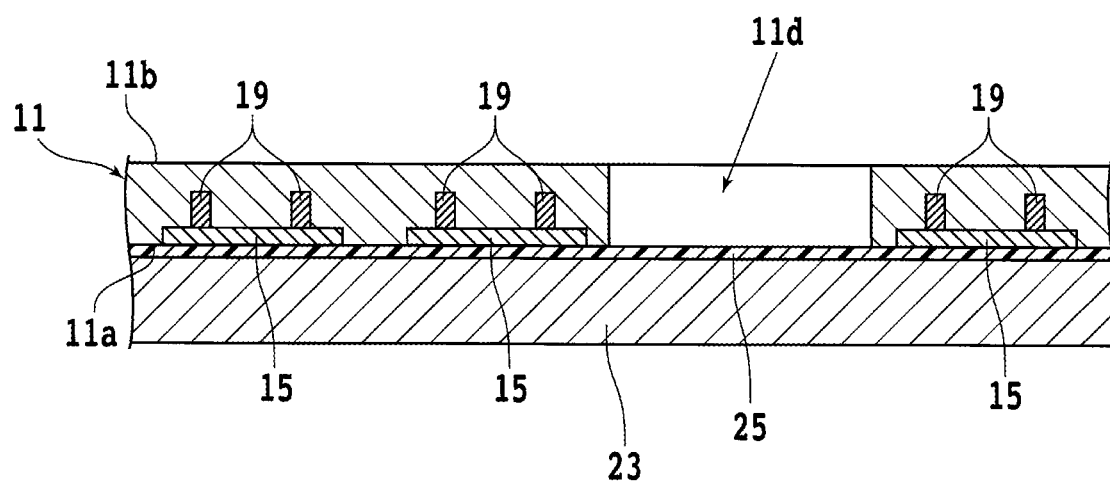
FIG. 13B is a sectional view depicting the wafer fixed to the support substrate.

The wafer 11 is thereafter fixed to a support substrate. FIG. 13B is a sectional view depicting the wafer 11 fixed to the support substrate 23. After the kerf 35 is formed in the wafer 11 and the defective device region 11c is separated, the support substrate 23 is fixed to the top surface 11a side of the wafer 11 via the adhesive layer 25.

Incidentally, etching processing may be performed by supplying gas converted into plasma or an etchant to the processed region (kerf 35) processed by the application of the laser beam 32C. Consequently, the kerf 35 is expanded, and minute projections and depressions formed on the inner wall of the kerf 35 by the ablation processing are removed.

In addition, while a method of separating the defective device region 11c from the wafer 11 by laser processing has been described in the above description, a method other than laser processing can also be used to separate the defective device region 11c. For example, what is generally called plasma dicing, which cuts the wafer 11 by plasma etching, can also be used.

In a case where the plasma dicing is to be performed, first, the support substrate 23 is fixed to the top surface 11a side of the wafer 11 (see FIG. 4A). A mask for plasma etching is thereafter formed on the undersurface 11b side of the wafer 11.

Figure 14A:
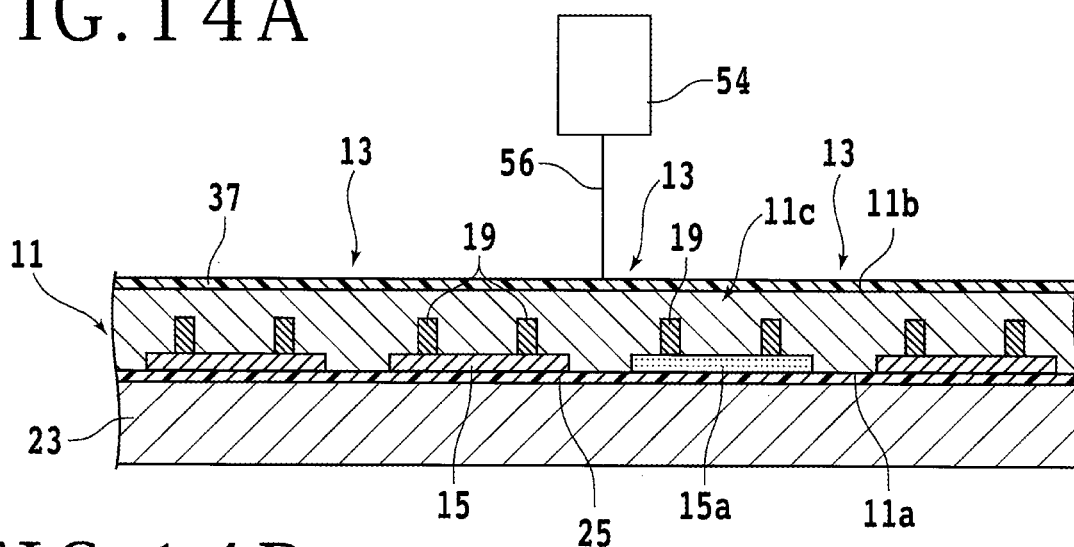
FIG. 14A is a sectional view depicting the wafer on which a mask layer is formed.

FIG. 14A is a sectional view depicting the wafer 11 on which a mask layer 37 is formed. The mask layer 37 is formed of a material functioning as the mask for the plasma etching, and is formed so as to cover the whole of the undersurface 11b of the wafer 11. Usable as the mask layer 37 is, for example, a resist formed of a photosensitive resin or a water-soluble resin such as PVA or PEG.

Next, a region of the mask layer 37 which coincides with the four streets 13 surrounding the defective device 15a is removed. For example, the mask layer 37 is removed along the streets 13 by irradiating the mask layer 37 with a laser beam 56 from a laser irradiating unit 54. Incidentally, the irradiation conditions of the laser beam 56 are set such that the mask layer 37 is removed by ablation processing when the mask layer 37 is irradiated with the laser beam 56.

When the mask layer 37 is irradiated with the laser beam 56 along the four streets 13 surrounding the defective device 15a, a rectangular opening that exposes the four streets 13 is formed in the mask layer 37. Thus, the mask layer 37 is patterned, and a mask 39 (see FIG. 14B) for plasma etching is formed.

Next, the wafer 11 is subjected to plasma etching using the mask 39. The above-described plasma processing apparatus, for example, is used for the plasma etching of the wafer 11.

Figure 14B:
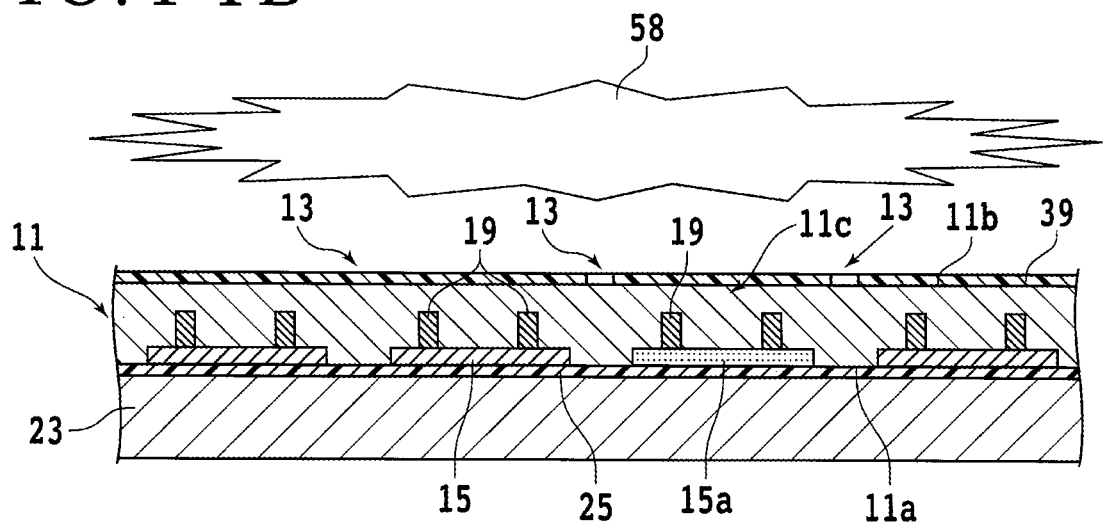
FIG. 14B is a sectional view depicting the wafer subjected to plasma etching.

FIG. 14B is a sectional view depicting the wafer 11 subjected to the plasma etching. When the plasma etching is performed, gas (etching gas) 58 for etching in a plasma state is supplied to the wafer 11 via the opening of the mask 39. Consequently, a region along the streets 13 surrounding the defective device 15a in the wafer 11 is etched, and a groove is formed on the undersurface 11b side of the wafer 11.

Figure 14C:
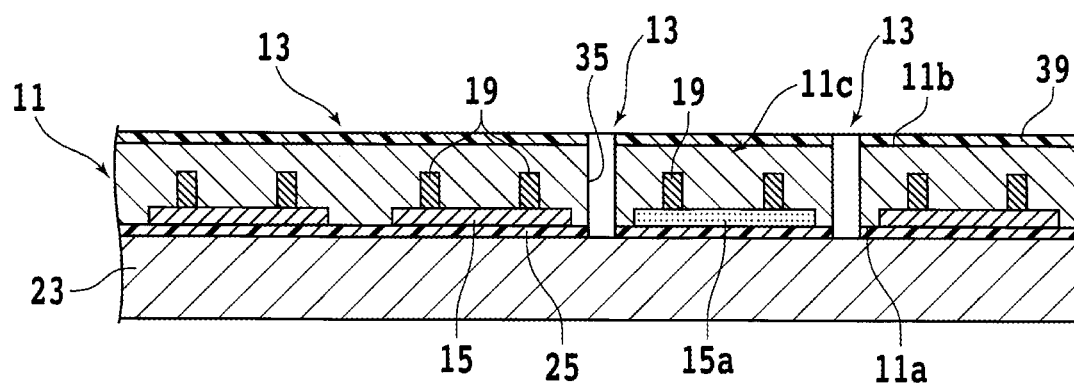
FIG. 14C is a sectional view depicting the wafer after the plasma etching.

FIG. 14C is a sectional view depicting the wafer 11 after the plasma etching. When the etching progresses and the groove formed on the undersurface 11b side of the wafer 11 reaches the top surface 11a, a kerf 35 extending from the top surface 11a to the undersurface 11b of the wafer 11 is formed along the streets 13, and the defective device region 11c is thus divided from the wafer 11. Thereafter, the defective device region 11c is separated from the wafer 11, and the through hole 11d is formed in the wafer 11 (see FIG. 8A, FIG. 8B, and FIG. 9).

Incidentally, the plasma etching may be performed by supplying the gas 58 converted into plasma to the top surface 11a side of the wafer 11. In this case, the mask 39 is formed on the top surface 11a side of the wafer 11 before the wafer 11 is fixed to the support substrate 23. Then, the gas 58 is supplied to the wafer 11 via the mask 39, and a groove is formed on the top surface 11a side of the wafer 11. When this groove reaches the undersurface 11b, the kerf 35 is formed, and the defective device region 11c is thus divided from the wafer 11. The support substrate 23 is thereafter fixed to the top surface 11a side of the wafer 11.

After the steps as described above, the defective device region 11c is separated from the wafer 11, and the through hole 11d is formed in the wafer 11. As a result, as depicted in FIG. 3B, the wafer 11 not including the defective device 15a is obtained.

Figure 15A:
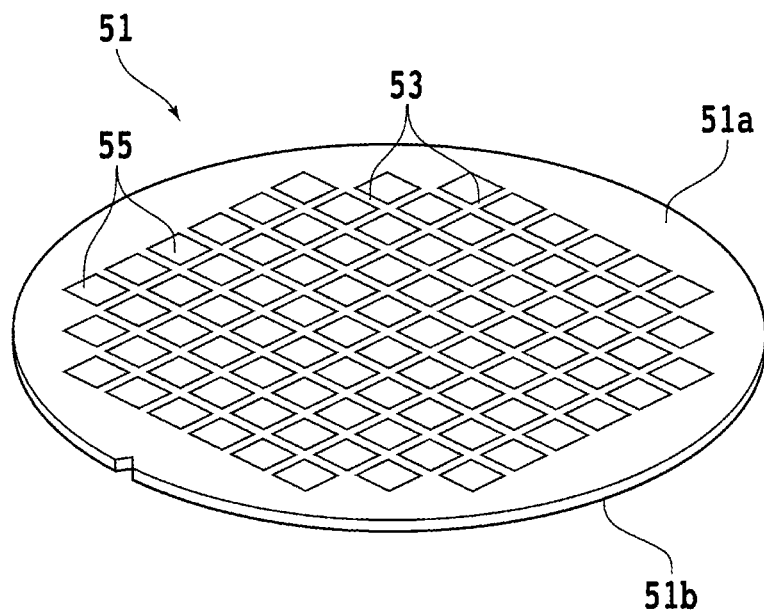
FIG. 15A is a perspective view depicting a wafer for preparing a device chip.

Next, a device chip is prepared, the device chip including a semiconductor device 15 as a non-defective product that is of the same kind as that of the semiconductor device 15 (defective device 15a) determined to be a defective product and having such a size as to be able to be fitted into the through hole 11d. A wafer having an identical structure to that of the wafer 11, for example, is used to manufacture the device chip. FIG. 15A is a perspective view depicting a wafer 51 for preparing the device chip.

The wafer 51 is formed of the same material as that of the wafer 11. The wafer 51 includes a top surface (first surface) 51a and an undersurface (second surface) 51b. In addition, the wafer 51 is demarcated into a plurality of regions by a plurality of streets (planned dividing lines) 53 arranged in a lattice manner so as to intersect each other. Then, a semiconductor device 55 is formed in each of the plurality of regions demarcated by the streets 53 on the top surface 51a side of the wafer 51.

The semiconductor device 55 has the same functions as those of the semiconductor devices 15 depicted in FIG. 1A and the like. In addition, the structure of the semiconductor device 55 is similar to that of the semiconductor devices 15.

Electrodes (via electrodes or through electrodes) 57 (see FIG. 17A) are connected to the semiconductor device 55. The structure and material of the electrodes 57 are similar to those of the electrodes 19 depicted in FIG. 1B and the like.

A plurality of device chips each including each of semiconductor devices 55 are manufactured by dividing the wafer 51 along the streets 53. The division of the wafer 51 is performed by the laser processing or the plasma etching described earlier, for example.

In addition, a cutting apparatus can also be used to divide the wafer 51. The cutting apparatus includes a chuck table that holds the wafer 51 and a cutting unit that cuts the wafer 51 held by the chuck table. An annular cutting blade is fitted to the cutting unit. The wafer 51 is divided along the streets 53 by rotating the cutting blade and making the cutting blade cut into the wafer 51. As a result, the plurality of device chips each including each of the semiconductor devices 55 are obtained.

Figure 15B:
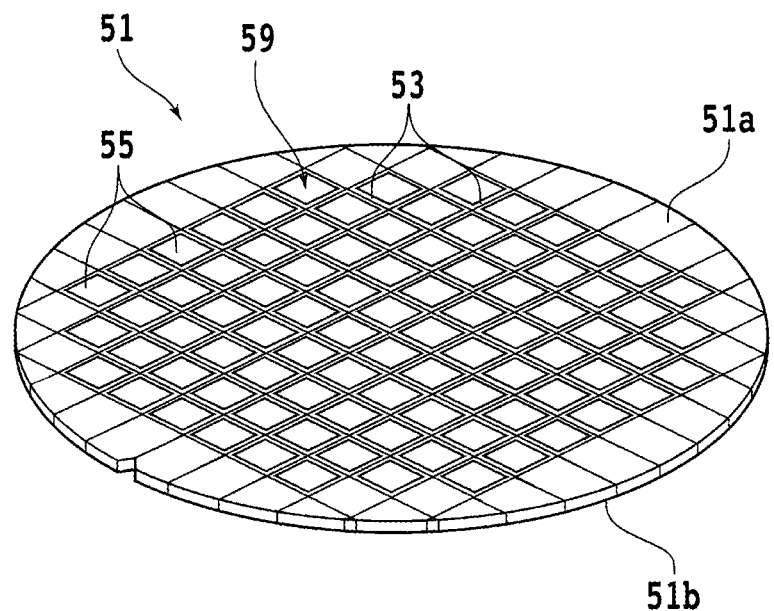
FIG. 15B is a perspective view depicting the wafer divided into a plurality of device chips.

FIG. 15B is a perspective view depicting the wafer 51 divided into a plurality of device chips 59. Incidentally, before or after the division of the wafer 11, the plurality of semiconductor devices 55 formed in the wafer 51 are inspected to determine whether each of the semiconductor devices 55 is a non-defective product or a defective product. Then, a device chip 59 including a semiconductor device 55 determined to be a defective product is excluded from the plurality of device chips 59 obtained by the division of the wafer 51.

Consequently, the device chips 59 each including each of the semiconductor devices 55 identical to the semiconductor devices 15 (see FIG. 1A and the like) as non-defective products formed in the wafer 11 are obtained. That is, the device chips 59 each include each of the semiconductor devices 55 as non-defective products having the same functions as those of the defective device 15a (see FIG. 1A and the like) (the semiconductor devices 55 including the functions that should be possessed by the defective device 15a).

It is to be noted that a timing of preparing the device chips 59 is not limited. For example, the device chips 59 are manufactured by the division of the wafer 51 after the preparation of the wafer 51 and the inspection of the semiconductor devices 55 are performed at the same timing as the preparation of the wafer 11 and the inspection of the semiconductor devices 15.

Figure 16:
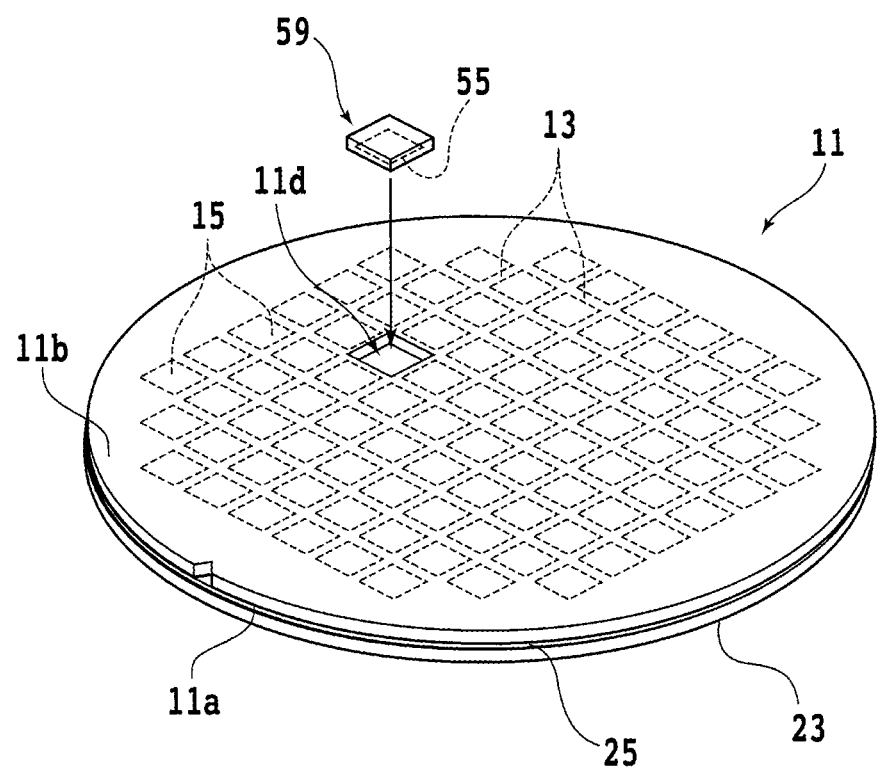
FIG. 16 is a perspective view depicting the wafer in a fitting step.

Next, a device chip 59 is fitted into the through hole 11d of the wafer 11 (fitting step). FIG. 16 is a perspective view depicting the wafer 11 in the fitting step.

In a case where the top surface 11a side (semiconductor device 15 side) of the wafer 11 is fixed to the support substrate 23, the device chip 59 is positioned such that a surface side thereof on which the semiconductor device 55 is formed (top surface side) faces the support substrate 23. Then, the device chip 59 is fitted into the through hole 11d of the wafer 11.

Figure 17A:
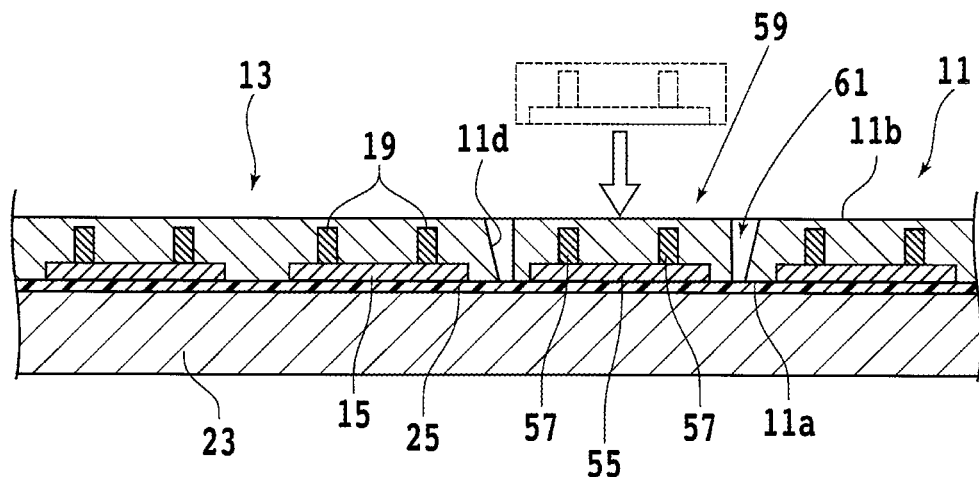
FIG. 17A is a sectional view depicting the wafer in which the device chip is fitted.

FIG. 17A is a sectional view depicting the wafer 11 in which the device chip 59 is fitted. The device chip 59 is fitted into the through hole 11d so as to come into contact with the adhesive layer 25 exposed within the through hole 11d. The device chip 59 is thereby fixed to the support substrate 23 via the adhesive layer 25.

Incidentally, in a case where the wafer 11 is provisionally fixed to the support substrate 23 by the adhesive layer 25 and thus bonding between the wafer 11 and the support substrate 23 is weak, processing of firmly fixing the wafer 11 to the support substrate 23 (main fixing processing) is performed after the device chip 59 is fitted into the through hole 11d.

The wafer 11 and the device chip 59 are thereby firmly fixed to the support substrate 23 via the adhesive layer 25.

For example, in a case where the adhesive layer 25 is an adhesive formed of a thermosetting resin, the thermosetting resin is cured by performing heating treatment at a higher temperature or for a longer period than at the time of the provisional fixing, and thereby the bonding between the wafer 11 and the support substrate 23 is enhanced. In addition, in a case where the adhesive layer 25 is an adhesive formed of an ultraviolet curable resin, the bonding between the wafer 11 and the support substrate 23 is enhanced by subjecting the ultraviolet curable resin to heating treatment. Further, in a case where the adhesive layer 25 is a thermocompression bonding sheet, the bonding between the wafer 11 and the support substrate 23 is enhanced by pressing the wafer 11 and the support substrate 23 against the thermocompression bonding sheet while heating treatment at a higher temperature or for a longer period than at the time of the provisional fixing is performed.

In addition, in the removing step, in a case where the wafer 11 is provisionally fixed to the support substrate 23 by using an adhesive layer 25 having a weak adhesive power, the wafer 11 and the support substrate 23 may be temporarily separated from each other before the fitting step, and the wafer 11 may be fixed to the support substrate 23 again by using another adhesive layer having a higher adhesive power than the adhesive layer 25.

Figure 17B:
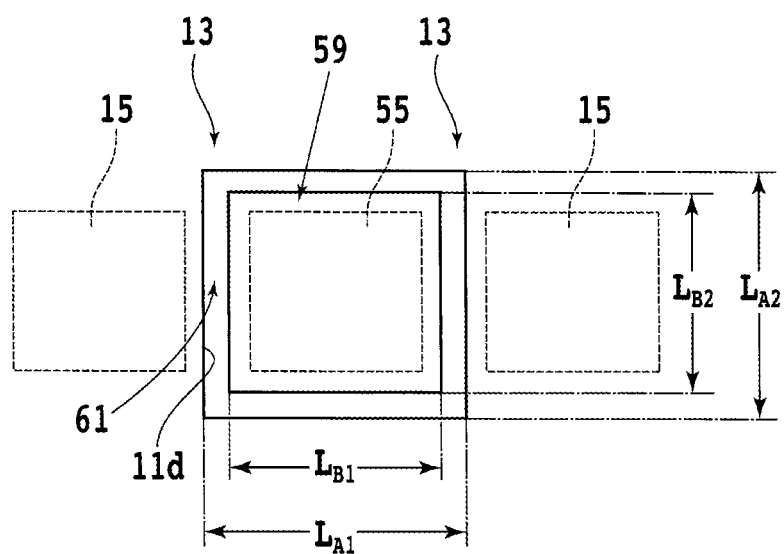
FIG. 17B is a plan view depicting a through hole.

FIG. 17B is a plan view depicting the through hole 11d. In the foregoing removing step, the through hole 11d is formed so as to be larger than the device chip 59. Specifically, a length $L_{A1}$ in a first direction (left-right direction on a paper surface) of the through hole 11d is larger than a length $L_{B1}$ in the first direction of the device chip 59. In addition, a length $L_{A2}$ in a second direction (direction perpendicular to the first direction or an upward-downward direction on the paper surface) of the through hole 11d is larger than a length $L_{B2}$ in the second direction of the device chip 59. Therefore, when the device chip 59 is fitted into the through hole 11d, a gap 61 is formed between the wafer 11 and the device chip 59 so as to surround the device chip 59.

Incidentally, in a subsequent step (resin filling step to be described later), the gap 61 is filled with a resin. Therefore, a certain width or more is preferably secured as the width of the gap 61 (distance between the inner wall of the through hole 11d and the side surface of the device chip 59). For example, the size of the through hole 11d or the device chip 59 is adjusted such that the width of the gap 61 is equal to or more than 2 µm, preferably equal to or more than 5 µm, or more preferably equal to or more than 10 µm.

Concrete dimensions of the through hole 11d can be set as appropriate in consideration of the positions of the semiconductor devices 15 and 55 and the like. For example, on the top surface 11a side of the wafer 11, a distance between an edge portion (inner wall) of the through hole 11d and an edge portion of a semiconductor device 15 is set to be equal to or more than 2 µm, or preferably equal to or more than 5 µm. In addition, on the top surface 11a side of the wafer 11, the edge portion of the through hole 11d may be disposed more on the semiconductor device 15 side than the center in the width direction of the street 13. In addition, in a case where the inner wall of the through hole 11d is inclined with respect to the thickness direction of the wafer 11 as depicted in FIG. 17A, a part of a region on the undersurface 11b side of the wafer 11 in the through hole 11d may coincide with a part of the semiconductor device 15 formed in the wafer 11.

Concrete dimensions of the device chip 59 are not limited either as long as the device chip 59 can be fitted into the through hole 11d. For example, on the top surface side of the device chip 59, a distance between an edge portion of the semiconductor device 55 and an edge portion of the device chip 59 is set to be equal to or less than half of the width of the streets 13 set on the wafer 11.

Incidentally, in the fitting step, instead of fixing the device chip 59 to the adhesive layer 25, the device chip 59 having an adhesive layer adhering thereto may be fitted into the through hole 11d. Specifically, the device chip 59 having an adhesive layer adhering thereto may be fixed to the support substrate 23 via the adhesive layer after the adhesive layer 25 exposed within the through hole 11d is removed by processing such as plasma etching or wet etching (chemical solution processing).

Figure 18A:
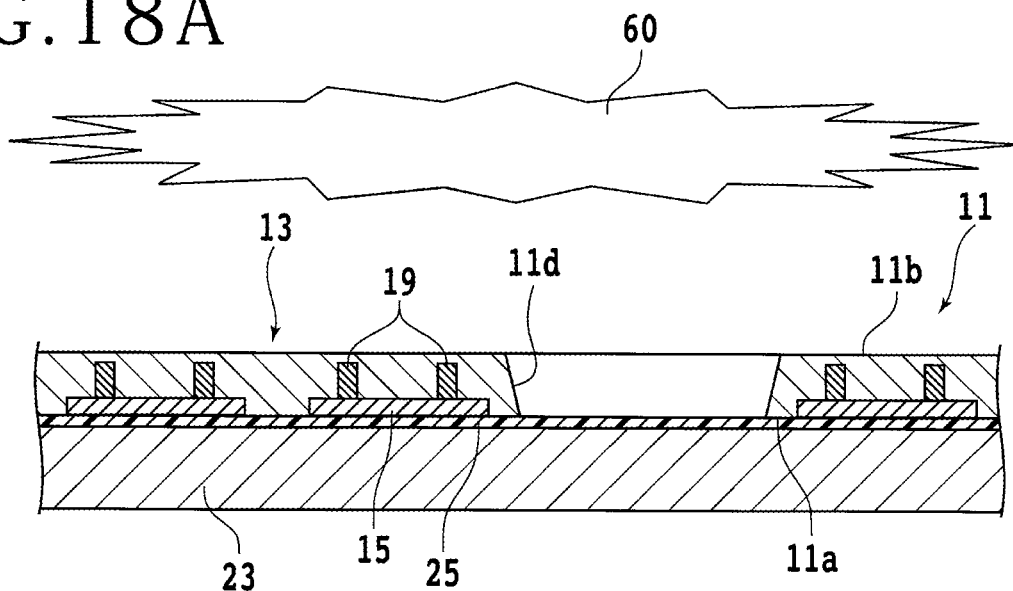
FIG. 18A is a sectional view depicting the wafer when the adhesive layer is subjected to plasma etching.

FIG. 18A is a sectional view depicting the wafer 11 when the adhesive layer 25 is subjected to plasma etching. A region superimposed on the through hole 11d in the adhesive layer 25 is removed by supplying gas converted into plasma (etching gas) 60 to the undersurface 11b side of the wafer 11, for example.

Figure 18B:
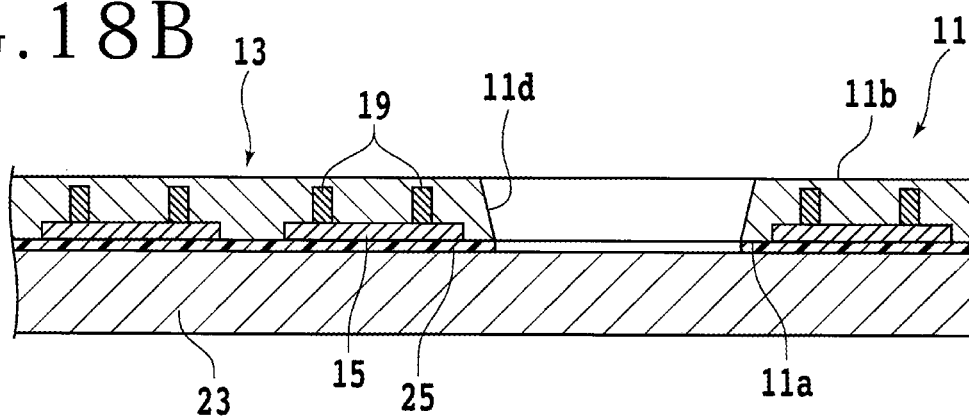
FIG. 18B is a sectional view depicting the wafer in a state in which a part of the adhesive layer is removed.

FIG. 18B is a sectional view depicting the wafer 11 in a state in which a part of the adhesive layer 25 is removed. When the region superimposed on the through hole 11d in the adhesive layer 25 is removed, a region superimposed on the through hole 11d in the upper surface of the support substrate 23 is exposed. Incidentally, when the wafer 11 is subjected to the plasma etching, a mask that exposes the through hole 11d may be formed on the undersurface 11b side of the wafer 11.

Figure 18C:
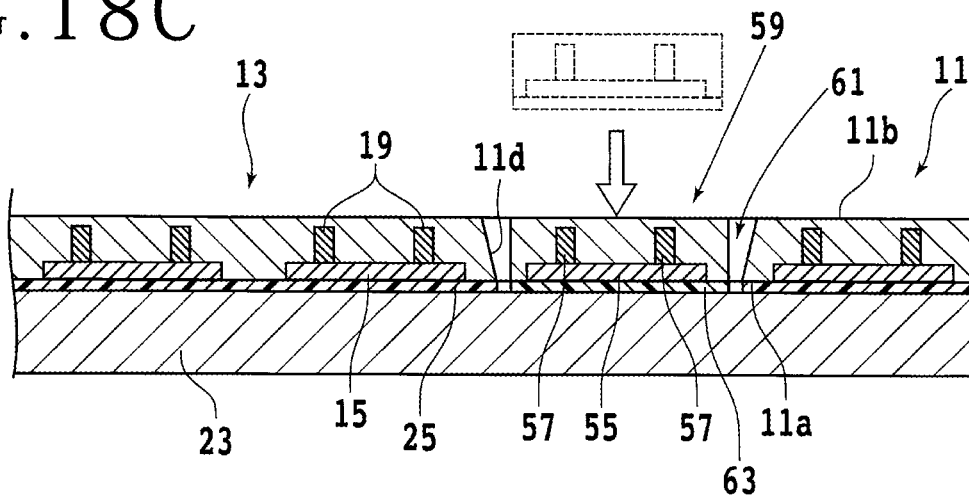
FIG. 18C is a sectional view depicting the wafer in which the device chip having an adhesive layer adhering thereto is fitted.

Next, the device chip 59 having an adhesive layer adhering thereto is fitted into the through hole 11d. FIG. 18C is a sectional view depicting the wafer 11 in which the device chip 59 having an adhesive layer 63 adhering thereto is fitted. The adhesive layer 63 is provided to the top surface side (semiconductor device 55 side) of the device chip 59. Incidentally, an example of the material of the adhesive layer 63 is similar to that of the adhesive layer 25. The device chip 59 is fixed to the upper surface of the support substrate 23 exposed within the through hole 11d via the adhesive layer 63.

Then, after the device chip 59 is fitted into the through hole 11d, main fixing processing is performed on the adhesive layers 25 and 63 as required. The wafer 11 and the device chip 59 are thereby firmly fixed to the support substrate 23 via the adhesive layers 25 and 63.

Figure 19A:
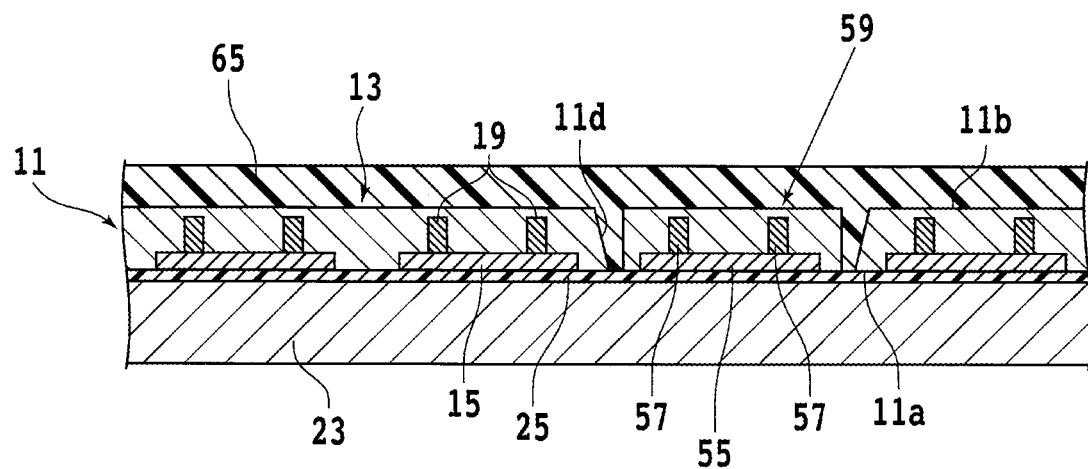
FIG. 19A is a sectional view depicting the wafer in a resin filling step.

Next, a resin is filled into the gap 61 between the wafer 11 and the device chip 59 (resin filling step). FIG. 19A is a sectional view depicting the wafer 11 in the resin filling step.

In the resin filling step, a resin 65 is formed on the undersurface 11b side of the wafer 11. The resin 65 is, for example, formed by applying a liquid resin such as an epoxy resin to the undersurface 11b side of the wafer 11 and curing the liquid resin. However, the material of the resin 65 is not limited.

When the liquid resin is applied to the undersurface 11b side of the wafer 11, a part of the liquid resin flows into the gap 61 between the wafer 11 and the device chip 59 (see FIG. 17A, FIG. 17B, and the like), and is filled into the gap 61. When the liquid resin is cured in this state, the wafer 11 and the device chip 59 are coupled to each other via the resin 65, and the device chip 59 is thus fixed to the wafer 11.

Next, the resin 65 formed on the outside of the gap 61 is ground (resin grinding step). In the resin grinding step, the resin 65 formed on the undersurface 11b side of the wafer 11 is removed by grinding processing. The grinding apparatus 2 (see FIG. 2), for example, is used to grind the resin 65.

Figure 19B:
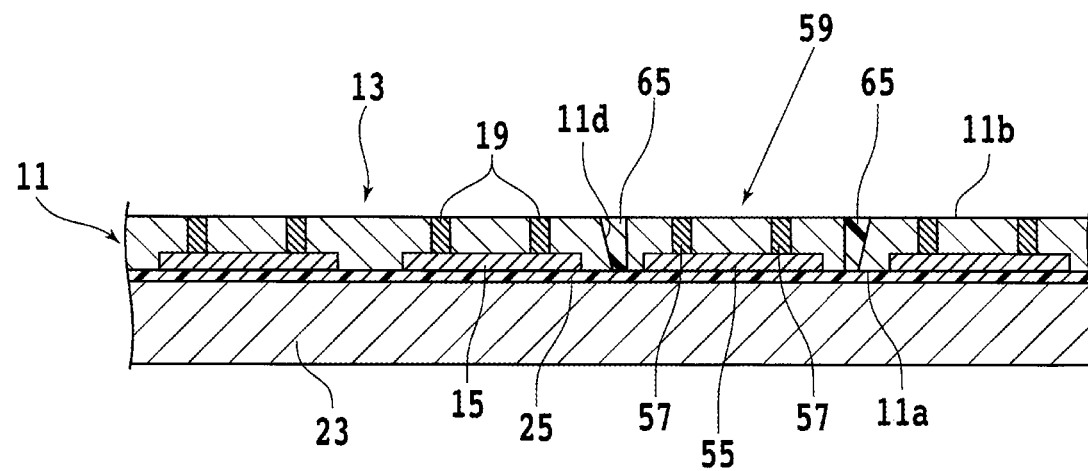
FIG. 19B is a sectional view depicting the wafer in a resin grinding step.

FIG. 19B is a sectional view depicting the wafer 11 in the resin grinding step. In the resin grinding step, for example, the resin 65 formed on the outside of the gap 61 is removed by grinding, and the undersurface 11b side of the wafer 11 is ground. Then, the wafer 11 is thinned until the electrodes 19 and 57 are exposed on the undersurface 11b side of the wafer 11.

However, a method of exposing the electrodes 19 and 57 is not limited. For example, the electrodes 19 and 57 may be exposed by grinding the resin 65 until the undersurface 11b side of the wafer 11 is exposed in the resin grinding step, and thereafter performing etching processing such as plasma etching or wet etching on the undersurface 11b side of the wafer 11. In this case, it is possible to prevent the metal included in the electrodes 19 and 57 from being scattered while the grinding stones 16 (see FIG. 2) are in contact with the electrodes 19 and 57.

After the above steps, the wafer 11 having the electrodes 19 and 57 exposed on the undersurface 11b side is obtained. It is thus possible to connect, via the electrodes 19 and 57, the semiconductor devices 15 and 55 and semiconductor devices (not depicted) included in another wafer laminated to the undersurface 11b side of the wafer 11. That is, the wafer manufacturing method according to the present embodiment manufactures the wafer 11 that can be used to form a laminated wafer.

Figure 20:
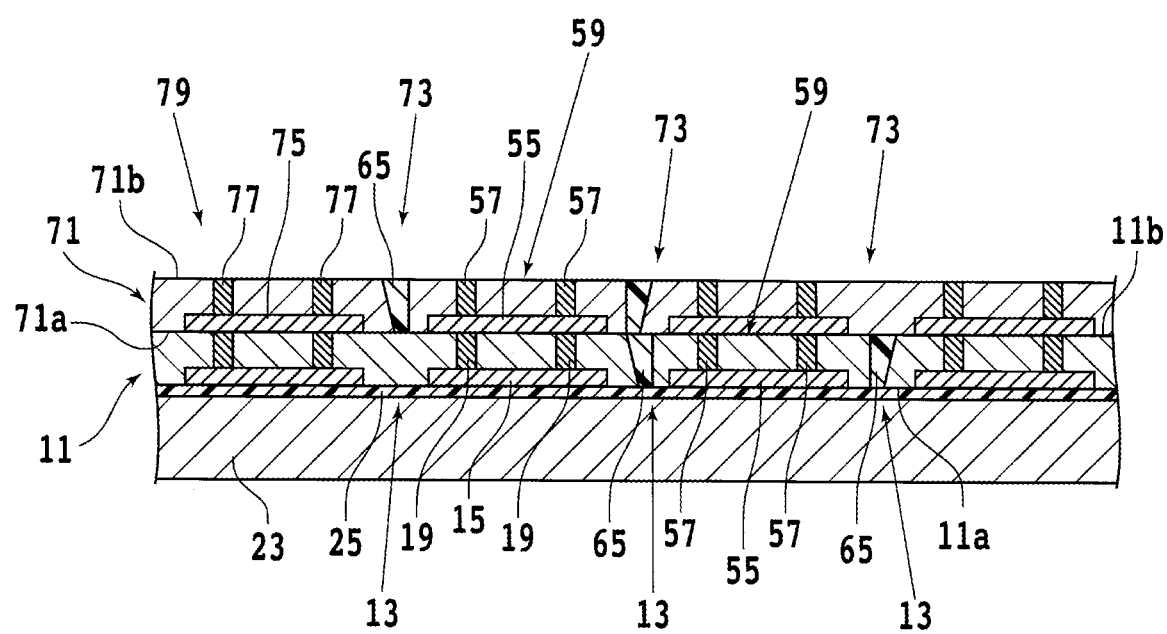
FIG. 20 is a sectional view depicting a laminated wafer.

Description will next be made of a concrete example of a method of manufacturing device chips (laminated device chips) each including a plurality of laminated semiconductor devices by using the above-described wafer 11. When the laminated device chips are to be manufactured, first, a laminated wafer including a plurality of laminated wafers is formed (wafer laminating step). FIG. 20 is a sectional view depicting a laminated wafer 79.

The wafer laminating step uses the wafer 11 (first wafer) after the resin grinding step and another wafer 71 (second wafer) prepared in the above-described wafer preparing step. Incidentally, the configuration of the wafer 71 is similar to that of the wafer 11.

Specifically, the wafer 71 is formed of the same material as that of the wafer 11, and has a top surface (first surface) 71a and an undersurface (second surface) 71b. In addition, the wafer 71 is demarcated into a plurality of rectangular regions by a plurality of streets (planned dividing lines) 73 arranged in a lattice manner so as to intersect each other. A semiconductor device 75 is formed in each of the plurality of regions demarcated by the streets 73 on the top surface 71a side of the wafer 71.

The structure of the semiconductor devices 75 is similar to that of the semiconductor devices 15. In addition, electrodes (via electrodes or through electrodes) 77 are connected to the semiconductor devices 75. The structure and material of the electrodes 77 are identical to those of the electrodes 19.

The wafer 71 is laminated onto the wafer 11. For example, the wafer 71 is laminated to the wafer 11 such that the top surface 71a side faces the undersurface 11b side of the wafer 11. It is to be noted that a method of laminating the wafer 11 and the wafer 71 is not limited. For example, the wafer 11 and the wafer 71 are laminated by direct bonding. Specifically, the undersurface 11b side of the wafer 11 and the top surface 71a side of the wafer 71 are bonded to each other by surface activated bonding.

However, the wafer 11 and the wafer 71 may be bonded to each other by indirect bonding. For example, it is also possible to bond the wafer 11 and the wafer 71 to each other by laminating the wafer 71 onto the wafer 11 via a permanent adhesive.

Incidentally, when the plurality of semiconductor devices 75 formed in the wafer 71 include a defective device, the wafer 71 is subjected to the grinding step, the removing step, the fitting step, the resin filling step, and the resin grinding step before or after the wafer 71 is laminated onto the wafer 11. As a result, the defective device is removed from the wafer 71, and a device chip 59 including a semiconductor device 55 as a non-defective product is fitted into the wafer 71.

The wafer 11 and the wafer 71 are laminated to each other such that the streets 13 and the streets 73 are superimposed on each other and the semiconductor devices 15 and 55 included in the wafer 11 and the semiconductor devices 75 and 55 included in the wafer 71 are superimposed on each other. As a result, the semiconductor devices 15 and 55 included in the wafer 11 and the semiconductor devices 75 and 55 included in the wafer 71 are connected to each other via the electrodes 19 and 57.

The laminated wafer 79 including the wafer 11 and the wafer 71 laminated to each other is thus formed. Incidentally, in the wafer laminating step, a plurality of wafers 71 may be laminated onto the wafer 11. For example, yet another wafer 71 may be laminated onto the wafer 71 laminated onto the wafer 11. In this case, each of the plurality of wafers 71 laminated on the wafer 11 is subjected to the grinding step, the removing step, the fitting step, the resin filling step, and the resin grinding step. The laminated wafer 79 including three layers or more of wafers is thereby obtained.

Figure 21A:
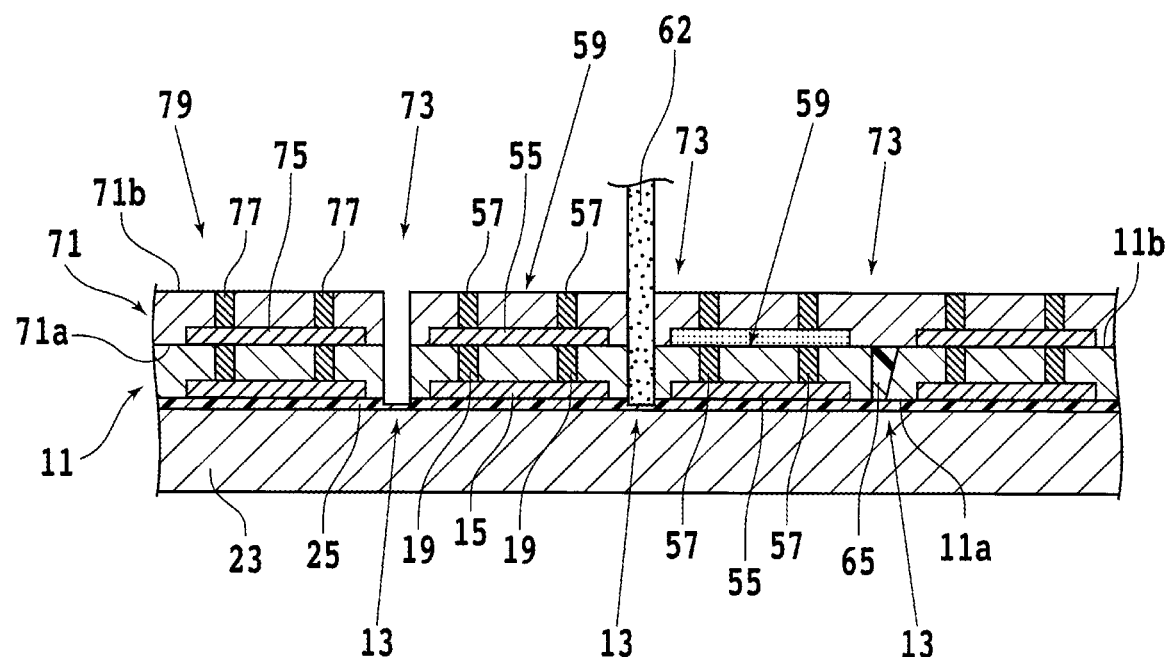
FIG. 21A is a sectional view depicting the laminated wafer in a dividing step.

Next, laminated device chips each including a plurality of laminated semiconductor devices are formed by dividing the laminated wafer 79 along the streets 13 and 73 (dividing step). FIG. 21A is a sectional view depicting the laminated wafer 79 in the dividing step.

In the dividing step, the laminated wafer 79 is, for example, cut by a cutting apparatus. The cutting apparatus includes a chuck table that holds the laminated wafer 79 and a cutting unit that cuts the laminated wafer 79 held by the chuck table. The cutting unit includes a cylindrical spindle rotated by a rotational driving source such as a motor. Then, an annular cutting blade 62 for cutting the laminated wafer 79 is fitted to a distal end portion of the spindle.

A cutting blade of a hub type (hub blade), for example, is used as the cutting blade 62. The hub blade is formed by integrating an annular base formed of a metal or the like and an annular cutting edge formed along the outer circumferential edge of the base. The cutting edge of the hub blade is formed by an electroformed grindstone in which abrasive grains formed of diamond or the like are fixed by a binding material such as a nickel plating.

In addition, a cutting blade of a washer type (washer blade) can also be used as the cutting blade 62. The washer blade is formed by an annular cutting edge in which abrasive grains are fixed by a binding material formed of a metal, ceramic, a resin, or the like.

The laminated wafer 79 is divided by rotating the cutting blade 62 and making the cutting blade 62 cut into the laminated wafer 79. Specifically, in a state in which a lower end of the cutting blade 62 is positioned below the top surface 11a of the wafer 11 (upper surface of the adhesive layer 25), the cutting blade 62 is made to cut into the laminated wafer 79 along the streets 13 and 73 by moving the cutting blade 62 and the laminated wafer 79 relative to each other along the horizontal direction while the cutting blade 62 is rotated. Then, when the laminated wafer 79 is cut along all of the streets 13 and 73, the laminated wafer 79 is divided into a plurality of laminated device chips.

Figure 21B:
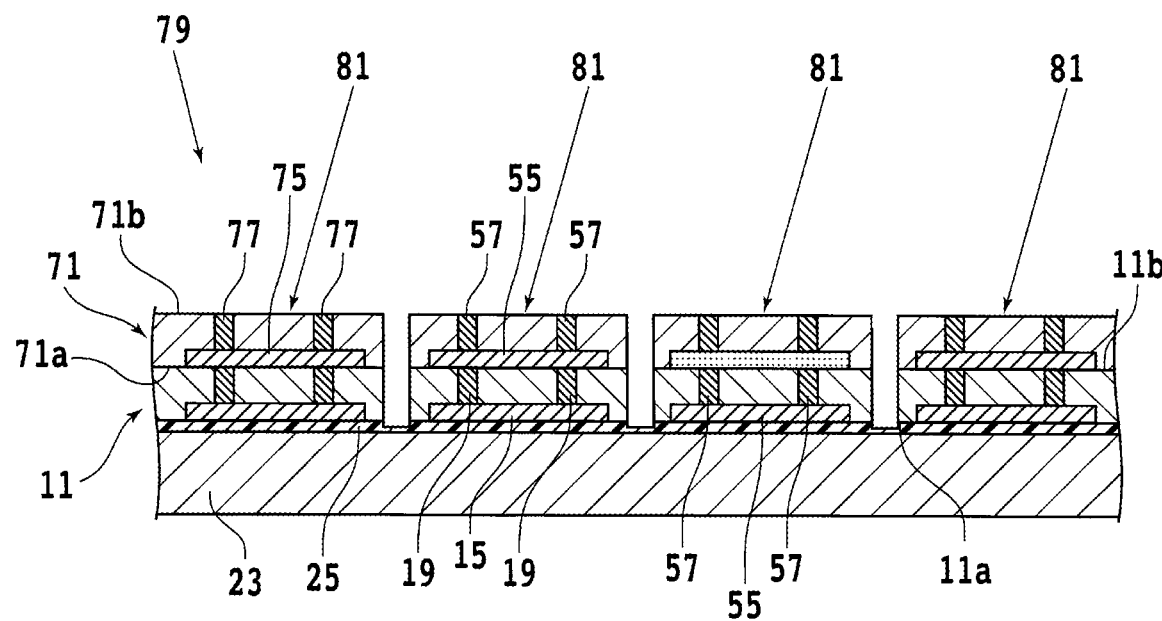
FIG. 21B is a sectional view depicting the laminated wafer divided into a plurality of laminated device chips.

FIG. 21B is a sectional view depicting the laminated wafer 79 divided into a plurality of laminated device chips 81. Each of the laminated device chips 81 includes one semiconductor device 15 or one semiconductor device 55 (first semiconductor device) included in the wafer 11 and one semiconductor device 75 or one semiconductor device 55 (second semiconductor device) included in the wafer 71. Then, the first semiconductor device and the second semiconductor device are laminated to each other, and are connected to each other via electrodes 19 or electrodes 57.

As described above, in the wafer manufacturing method according to the present embodiment, the defective device region 11c is removed from the wafer 11, and a device chip 59 including a semiconductor device 15 as a non-defective product is fitted into a space formed by removing the defective device region 11c (removed region). Consequently, the wafer 11 not including the defective device 15a can be manufactured. In addition, the laminated device chips 81 each not including the defective device 15a can be manufactured by laminating the wafer 11 not including the defective device 15a, thereby forming the laminated wafer 79, and dividing the laminated wafer 79. As a result, a decrease in yield of the laminated device chips 81 is suppressed.

Second Embodiment

In the first embodiment, description has been made of an example in which the defective device region 11c is separated by the application of a laser beam in the removing step. However, another method may be used to separate the defective device region 11c. In the present embodiment, description will be made of a method of separating the defective device region 11c by crushing processing of crushing the wafer 11 in the removing step after performing the wafer preparing step and the grinding step (see FIG. 2).

The crushing processing used in the present embodiment is not limited as long as the crushing processing can process the wafer 11. Examples of the crushing processing that can be used to process the wafer 11 include sandblast processing, water jet processing, drill processing, and the like.

Figure 22A:
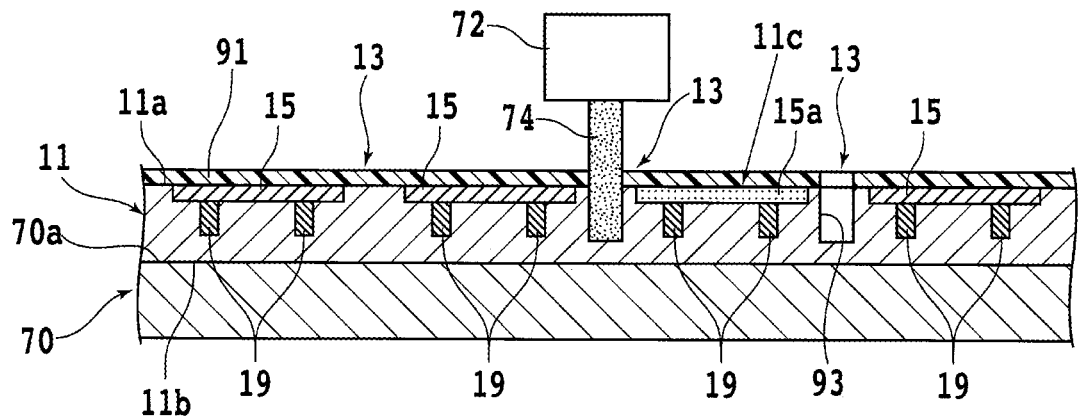
FIG. 22A is a sectional view depicting the wafer in which a groove is formed by sandblast processing.

FIG. 22A is a sectional view depicting the wafer 11 in which a groove 93 is formed by the sandblast processing. A sandblast unit 72 that jets a polishing material 74 is used for the sandblast processing. The sandblast unit 72, for example, includes a compressor that compresses and feeds gas such as air and a blast gun that jets the polishing material 74 together with the compressed gas. The polishing material 74 jetted from the sandblast unit 72 collides with the wafer 11. The wafer 11 is thereby processed.

When the crushing processing is to be performed, first, a protective layer 91 is formed on the wafer 11. For example, in a case where the top surface 11a side of the wafer 11 is processed, the top surface 11a side of the wafer 11 is covered by the protective layer 91 to protect the semiconductor devices 15. It is to be noted that the material of the protective layer 91 is not limited. A water-soluble resin such as PVA or PEG, for example, can be used as the material of the protective layer 91. In addition, the formation of the protective layer 91 may be omitted in a case where damage to the semiconductor devices 15 due to the crushing processing is not likely to occur.

Next, the wafer 11 is held by a holding table 70. The upper surface of the holding table 70 constitutes a flat holding surface 70a that holds the wafer 11. The wafer 11 is, for example, disposed on the holding table 70 such that the top surface 11a side is exposed upward and the undersurface 11b side faces the holding surface 70a.

Then, the polishing material 74 is jetted from the sandblast unit 72 along the four streets 13 surrounding the defective device 15a. As a result, on the top surface 11a side of the wafer 11, a band-shaped groove 93 is formed along the streets 13. This groove 93 is formed in a rectangular shape as viewed in plan so as to surround the defective device 15a.

Figure 22B:
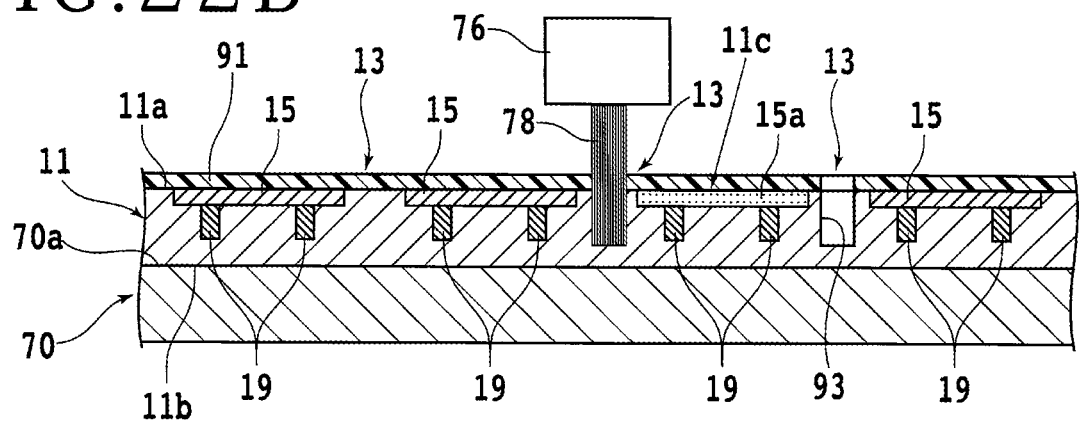
FIG. 22B is a sectional view depicting the wafer in which a groove is formed by water jet processing.

FIG. 22B is a sectional view depicting the wafer 11 in which a groove 93 is formed by the water jet processing. A water jet unit 76 that jets a liquid 78 such as water is used for the water jet processing. The water jet unit 76 includes a nozzle that jets the liquid 78 pressurized by a pump. Incidentally, the liquid 78 may include abrasive grains. The liquid 78 jetted from the water jet unit 76 collides with the wafer 11. The wafer 11 is thereby processed.

Specifically, the liquid 78 jetted from the water jet unit 76 is jetted along the four streets 13 surrounding the defective device 15a. As a result, on the top surface 11a side of the wafer 11, a band-shaped groove 93 is formed along the streets 13. This groove 93 is formed in a rectangular shape as viewed in plan so as to surround the defective device 15a.

Figure 22C:
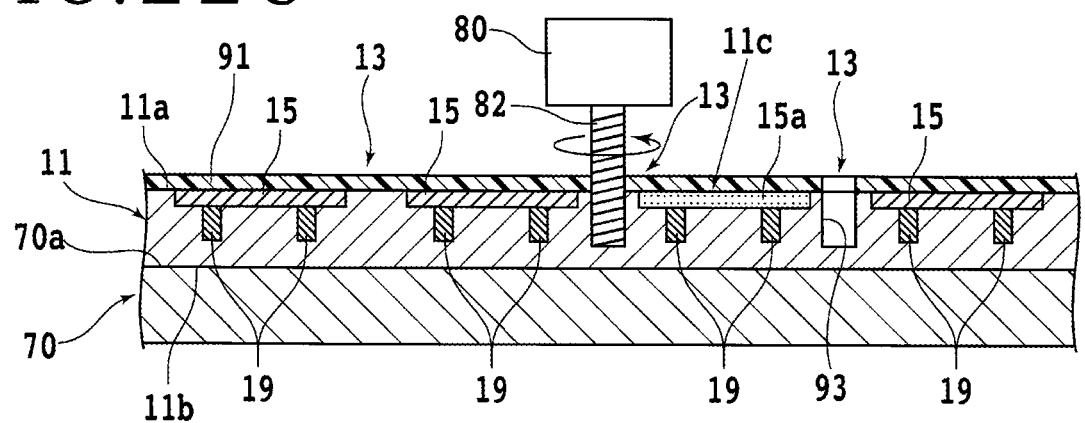
FIG. 22C is a sectional view depicting the wafer in which a groove is formed by drill processing.

FIG. 22C is a sectional view depicting the wafer 11 in which a groove 93 is formed by the drill processing. A drill unit 80 fitted with a rod-shaped drill bit 82 is used for the drill processing. The drill unit 80 includes a rotational driving source such as a motor that rotates the drill bit 82 fitted to the drill unit 80. A distal end portion of the drill bit 82 is brought into contact with the wafer 11 while the drill bit 82 is rotated. The wafer 11 is thereby processed.

Specifically, first, the rotating drill bit 82 is brought into contact with a region of the wafer 11 which is superimposed on a street 13, and a cylindrical groove is thereby formed in the wafer 11. Next, the holding table 70 or the drill bit 82 is moved along the street 13. Incidentally, an amount of movement at this time is set to be less than the diameter of the cylindrical groove formed in the wafer 11. Thereafter, the drill bit 82 forms a new groove in the wafer 11. As a result, the groove already formed in the wafer 11 and the newly formed groove are coupled to each other.

A plurality of grooves are formed along the four streets 13 surrounding the defective device 15a by repeating the above-described procedure. As a result, on the top surface 11a side of the wafer 11, a band-shaped groove 93 is formed along the streets 13. This groove 93 is formed by a plurality of cylindrical grooves formed so as to be coupled to each other.

The groove 93 is formed in the wafer 11 by performing the crushing processing along the streets 13 surrounding the defective device 15a as described above. Thereafter, the processed region (groove 93) processed by the crushing processing is exposed on the undersurface 11b side of the wafer 11 by grinding the undersurface 11b side of the wafer 11.

Figure 23A:
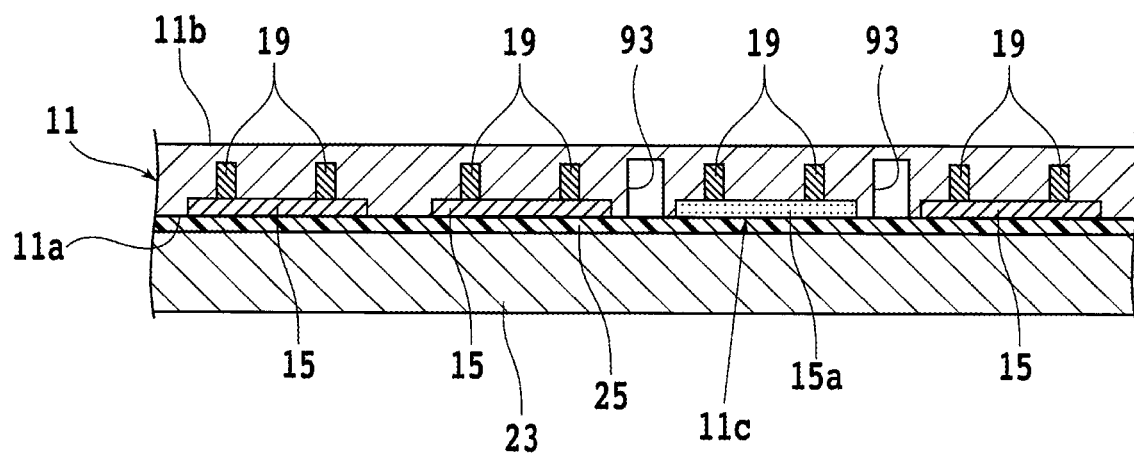
FIG. 23A is a sectional view depicting the wafer fixed to the support substrate.

When the wafer 11 is to be ground, first, the wafer 11 is fixed to the support substrate 23. FIG. 23A is a sectional view depicting the wafer 11 fixed to the support substrate 23. In a case where the undersurface 11b side of the wafer 11 is ground, the top surface 11a side of the wafer 11 is fixed to the support substrate 23 via the adhesive layer 25.

Next, the grinding apparatus 2 (see FIG. 2) grinds the wafer 11. Specifically, the undersurface 11b side of the wafer 11 is ground by bringing the grinding stones 16 into contact with the undersurface 11b side of the wafer 11. Then, the wafer 11 is ground and thinned until the groove 93 is exposed on the undersurface 11b side of the wafer 11.

Figure 23B:
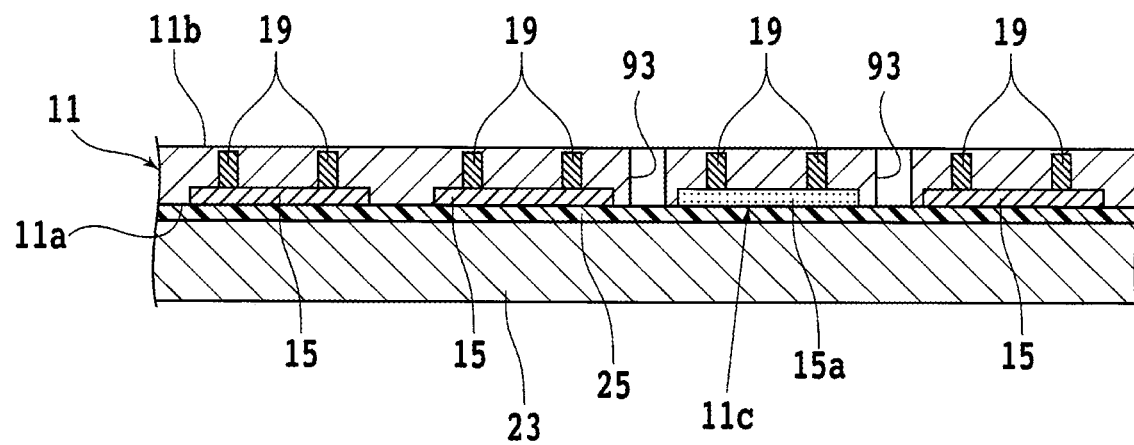
FIG. 23B is a sectional view depicting the wafer after being ground.

FIG. 23B is a sectional view depicting the wafer 11 after being ground. When the groove 93 is exposed on the undersurface 11b side of the wafer 11, the defective device region 11c is divided from the wafer 11. Thereafter, a procedure similar to that of the first embodiment separates the defective device region 11c from the wafer 11, and forms the through hole 11d in the wafer (see FIG. 8A, FIG. 8B, and FIG. 9).

Incidentally, in the removing step, the defective device region 11c may be separated by forming a through hole that penetrates the wafer 11 by the crushing processing. Specifically, the crushing processing forms a through hole extending from the top surface 11a to the undersurface 11b of the wafer 11 along the streets 13.

Figure 24A:
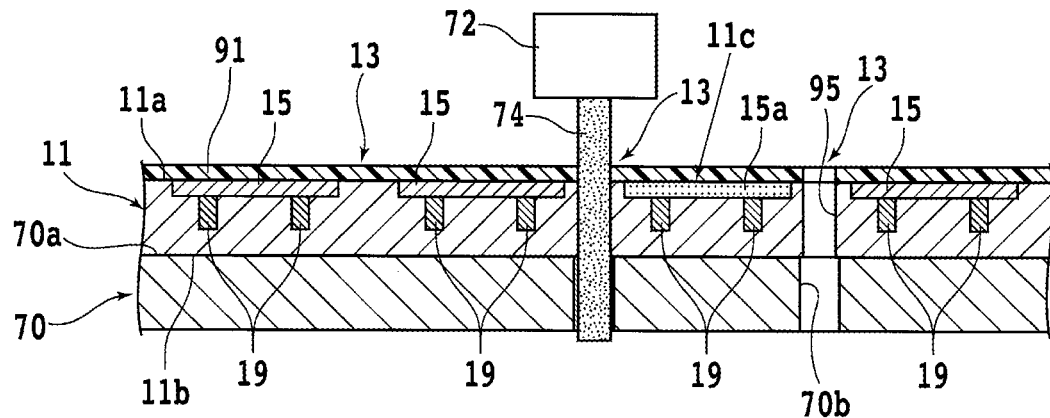
FIG. 24A is a sectional view depicting the wafer in which a through hole is formed by the sandblast processing.

FIG. 24A is a sectional view depicting the wafer 11 in which a through hole 95 is formed by the sandblast processing. In a case where the through hole 95 is formed by the crushing processing, the holding table 70 is provided with an opening 70b that vertically penetrates the holding table 70. The opening 70b is formed in a rectangular shape as viewed in plan so as to correspond to the four streets 13 surrounding the semiconductor device 15. Then, the wafer 11 is disposed on the holding table 70 such that the four streets 13 surrounding the defective device 15a each coincide with the opening 70b.

Next, the polishing material 74 is jetted from the sandblast unit 72 along the four streets 13 surrounding the defective device 15a. Incidentally, jetting conditions of the polishing material 74 are set such that a hole penetrating the wafer 11 from the top surface 11a to the undersurface 11b is formed in a region of the wafer 11 with which the polishing material 74 collides.

Consequently, when the polishing material 74 is jetted along the streets 13, a band-shaped through hole 95 extending from the top surface 11a to the undersurface 11b is formed in the wafer 11 along the streets 13. This through hole 95 is formed in a rectangular shape as viewed in plan so as to surround the defective device 15a. As a result, the defective device region 11c is divided from the wafer 11.

Figure 24B:
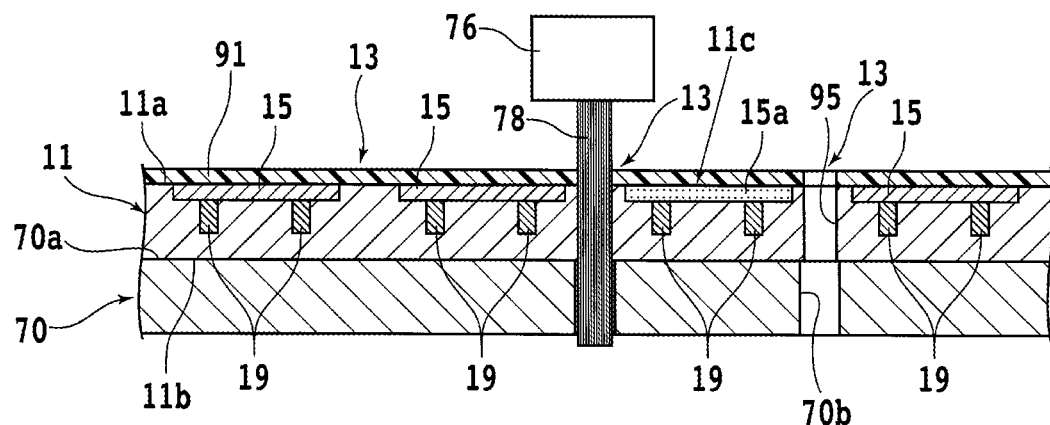
FIG. 24B is a sectional view depicting the wafer in which a through hole is formed by the water jet processing.

FIG. 24B is a sectional view depicting the wafer 11 in which a through hole 95 is formed by the water jet processing. In a case where the through hole 95 is formed by the water jet processing, the liquid 78 jetting from the water jet unit 76 is jetted along the four streets 13 surrounding the defective device 15a. Incidentally, jetting conditions of the liquid 78 are set such that a hole penetrating the wafer 11 from the top surface 11a to the undersurface 11b is formed in a region of the wafer 11 with which the liquid 78 collides.

Consequently, when the liquid 78 is jetted along the streets 13, a band-shaped through hole 95 extending from the top surface 11a to the undersurface 11b is formed in the wafer 11 along the streets 13. This through hole 95 is formed in a rectangular shape as viewed in plan so as to surround the defective device 15a. As a result, the defective device region 11c is divided from the wafer 11.

Figure 24C:
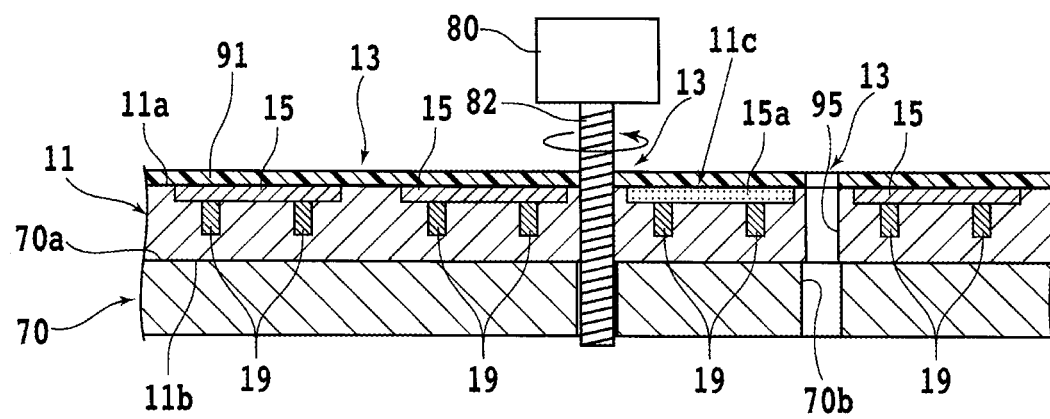
FIG. 24C is a sectional view depicting the wafer in which a through hole is formed by the drill processing.

FIG. 24C is a sectional view depicting the wafer 11 in which a through hole 95 is formed by the drill processing. In a case where the through hole 95 is formed by the drill processing, first, a cylindrical hole penetrating the wafer 11 from the top surface 11a to the undersurface 11b is formed by bringing the drill bit 82 into contact with the wafer 11 while the drill bit 82 is rotated.

Thereafter, a plurality of holes are formed along the four streets 13 surrounding the defective device 15a by repeating a similar procedure. Incidentally, each of the plurality of holes is formed so as to be coupled to a hole already formed in the wafer 11. As a result, a band-shaped through hole 95 extending from the top surface 11a to the undersurface 11b is formed in the wafer 11 along the streets 13, and the defective device region 11c is thus divided from the wafer 11.

When the sandblast processing (see FIG. 24A) is performed, the polishing material 74 passed through the through hole 95 of the wafer 11 is discharged via the opening 70b of the holding table 70. Similarly, when the water jet processing (see FIG. 24B) is performed, the liquid 78 passed through the through hole 95 of the wafer 11 is discharged via the opening 70b of the holding table 70. It is therefore possible to prevent the holding table 70 from being damaged by the collision of the polishing material 74 or the liquid 78 with the holding surface 70a of the holding table 70.

In addition, when the drill processing (see FIG. 24C) is performed, a distal end portion of the drill bit 82 is inserted into the opening 70b of the holding table 70. It is therefore possible to prevent the holding table 70 from being damaged by the contact of the drill bit 82 with the holding table 70.

Incidentally, while FIG. 24A, FIG. 24B, and FIG. 24C depict states in which the wafer 11 is processed from the top surface 11a side, the wafer 11 may be processed from the undersurface 11b side. That is, the polishing material 74 or the liquid 78 may be made to collide with the undersurface 11b side of the wafer 11, or the drill bit 82 may be brought into contact with the undersurface 11b side of the wafer 11.

Figure 25:
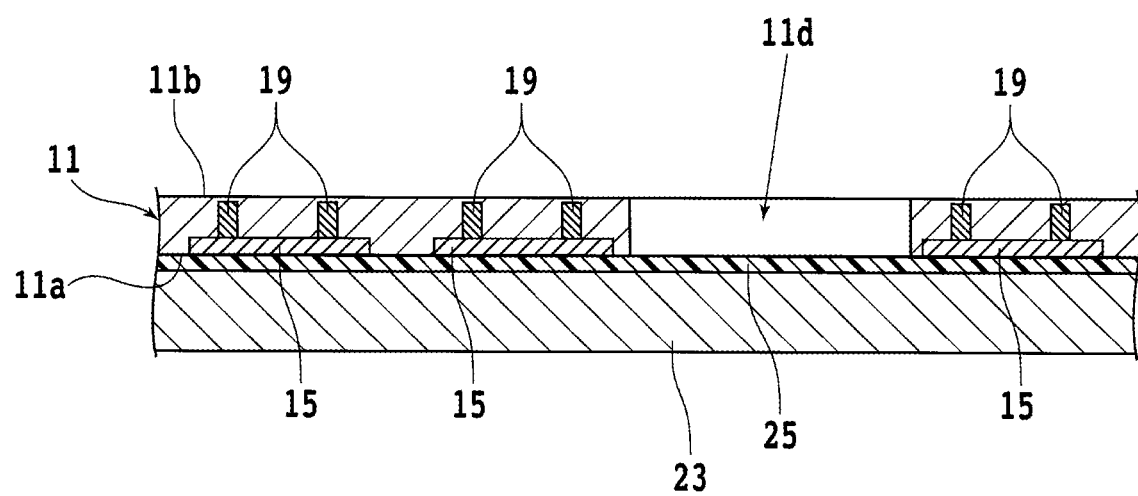
FIG. 25 is a sectional view depicting the wafer fixed to the support substrate.

Next, the protective layer 91 is removed from the wafer 11, and the defective device region 11c is separated from the wafer 11. The wafer 11 is thereafter fixed to the support substrate 23. FIG. 25 is a sectional view depicting the wafer 11 fixed to the support substrate 23. For example, the top surface 11a side of the wafer 11 is fixed to the support substrate 23 via the adhesive layer 25.

Incidentally, the wafer 11 in which the through hole 11d is formed by the crushing processing may be subjected to etching processing. For example, the inside of the through hole 11d is subjected to plasma etching by supplying gas in a plasma state to the through hole 11d of the wafer 11. In addition, the inside of the through hole 11d is subjected to wet etching by supplying an etchant to the through hole 11d of the wafer 11.

Figure 26:
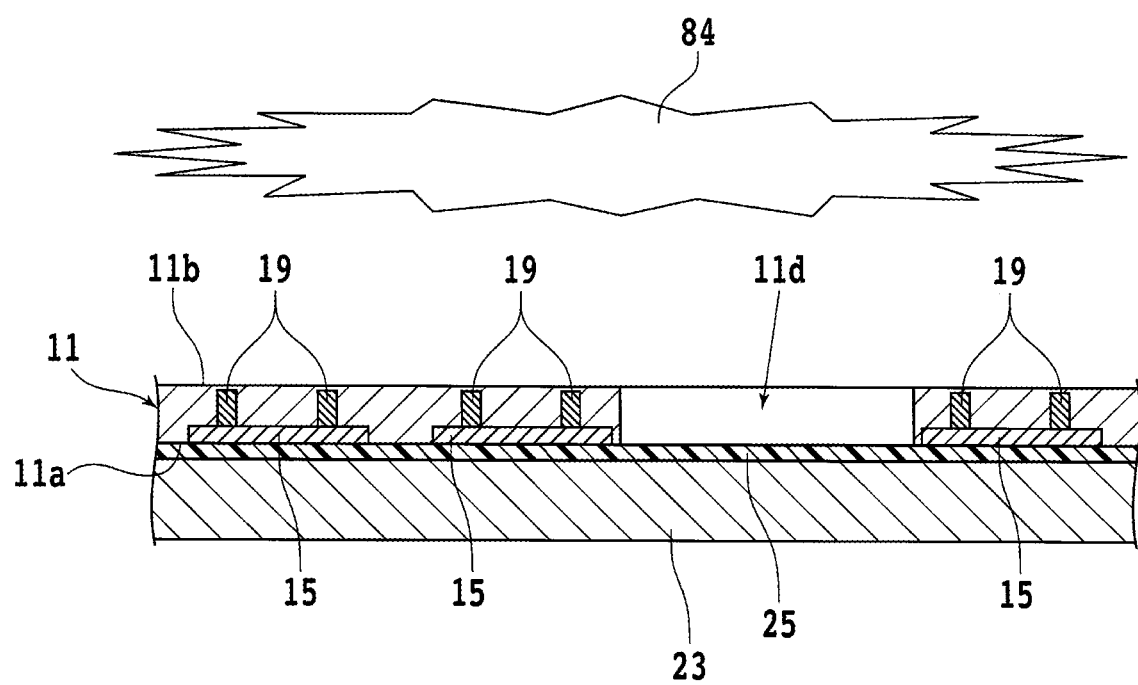
FIG. 26 is a sectional view depicting the wafer subjected to plasma etching.

FIG. 26 is a sectional view depicting the wafer 11 subjected to the plasma etching. When gas (etching gas) 84 for etching in a plasma state is supplied to the wafer 11, the inner wall of the through hole 11d is subjected to the plasma etching. The size of the through hole 11d is thereby increased. In addition, minute projections and depressions formed on the inner wall of the through hole 11d by the crushing processing are removed by the plasma etching.

Figure 27A:
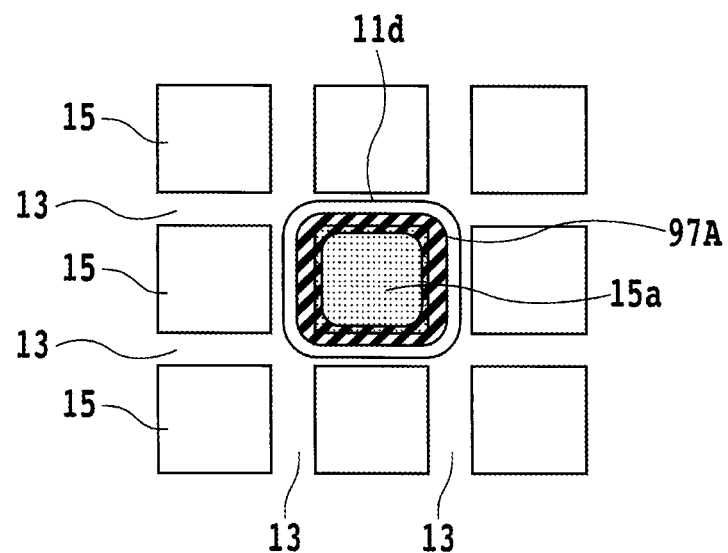
FIG. 27A is a plan view depicting a region processed by the sandblast processing or the water jet processing.
Figure 27B:
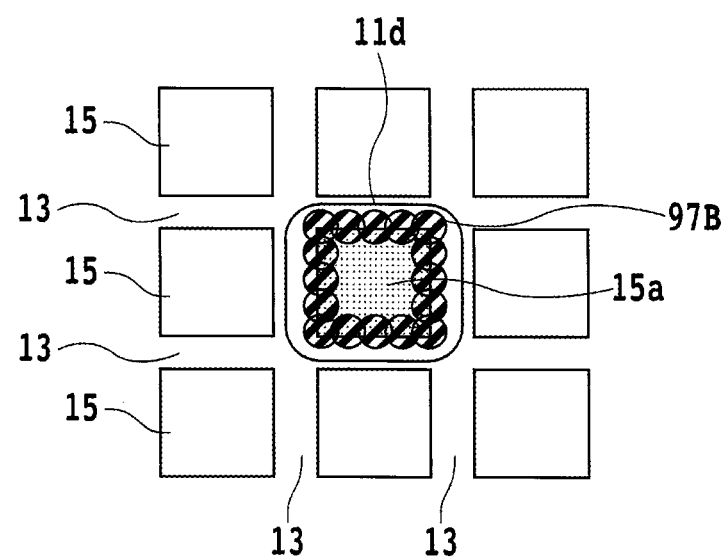
FIG. 27B is a plan view depicting regions processed by the drill processing.

Incidentally, a region of the wafer 11 which is subjected to the crushing processing is set as appropriate such that the through hole 11d of a desired size is formed. FIG. 27A is a plan view depicting a region (processed region) 97A processed by the sandblast processing or the water jet processing. In addition, FIG. 27B is a plan view depicting regions (processed regions) 97B processed by the drill processing. In FIG. 27A and FIG. 27B, the regions 97A and 97B are provided with a pattern.

In the case where the wafer 11 is processed by the sandblast processing, the polishing material 74 is, for example, jetted to the region 97A along the peripheral edge of the defective device 15a. Similarly, in the case where the wafer 11 is processed by the water jet processing, the liquid 78 is, for example, jetted to the region 97A along the peripheral edge of the defective device 15a. The groove 93 (see FIG. 22A and FIG. 22B) or the through hole 95 (see FIG. 24A and FIG. 24B) is thereby formed so as to surround the defective device 15a. Incidentally, the polishing material 74 and the liquid 78 may be jetted so as to collide with a part of the defective device 15a, or may be jetted only onto the streets 13 so as not to collide with the defective device 15a.

In the case where the wafer 11 is processed by the drill processing, the drill bit 82, for example, sequentially processes a plurality of regions 97B along the peripheral edge of the defective device 15a. Incidentally, the plurality of regions 97B are each set so as to overlap a part of another adjacent region 97. The groove 93 (see FIG. 22C) or the through hole 95 (see FIG. 24C) is thereby formed so as to surround the defective device 15a. Incidentally, the drill bit 82 may be in contact with a part of the defective device 15a, or may be in contact with only the streets 13 so as not to be in contact with the defective device 15a.

In addition, in the case where the wafer 11 is processed by the drill processing, the groove 93 or the through hole 95 may be formed by moving the drill bit 82 in the horizontal direction along the streets 13 while the drill bit 82 is rotated in a state in which the drill bit 82 is inserted in the wafer 11 (see FIG. 22C and FIG. 24C). In this case, work of raising and lowering the drill bit 82 on the streets 13 a large number of times becomes unnecessary.

Thereafter, the inner wall of the through hole 11d is etched by subjecting the wafer 11 to etching processing (plasma etching or the like, see FIG. 26). As a result, minute projections and depressions remaining in the regions 97A and 97B subjected to the crushing processing are removed, and the width of the through hole 11d is increased. The through hole 11d enlarged as depicted in FIG. 27A and FIG. 27B is consequently formed.

As described above, in the removing step, the crushing processing can also separate the defective device region 11c from the wafer 11. Incidentally, steps whose description is omitted in the present embodiment among steps included in the removing step are similar to those of the first embodiment. In addition, in the present embodiment, steps other than the removing step (the wafer preparing step, the grinding step, the fitting step, the resin filling step, the resin grinding step, the wafer laminating step, the dividing step, and the like) can be performed in a manner similar to that of the first embodiment. Further, the present embodiment can be combined with another embodiment as appropriate.

Third Embodiment

In the first embodiment and the second embodiment, description has been made of an example in which the defective device region 11c is separated from the wafer 11 by processing the wafer 11 along the streets 13 in the removing step. However, a method of removing the defective device region 11c from the wafer 11 is not limited. In the present embodiment, description will be made of a method of destroying and removing the defective device region 11c by the application of a laser beam in the removing step after performing the wafer preparing step and the grinding step (see FIG. 2).

Figure 28A:
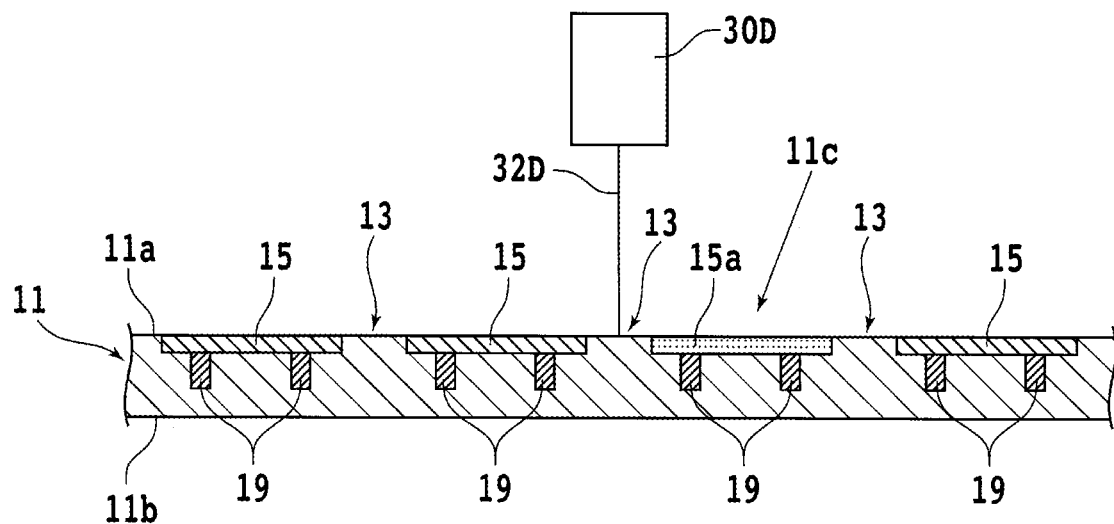
FIG. 28A is a sectional view depicting the wafer irradiated with a laser beam.

FIG. 28A is a sectional view depicting the wafer 11 irradiated with a laser beam 32D. A laser irradiating unit 30D that irradiates the wafer 11 with the laser beam 32D is used in a case where the defective device region 11c is destroyed by the application of the laser beam. Incidentally, the configuration of the laser irradiating unit 30D is similar to that of the laser irradiating unit 30A (see FIG. 4A).

However, irradiation conditions of the laser beam 32D are set such that a region of the wafer 11 which is irradiated with the laser beam 32D is removed by ablation processing. Specifically, the wavelength of the laser beam 32D is set such that at least a part of the laser beam 32D is absorbed by the wafer 11. That is, the laser irradiating unit 30D applies the laser beam 32D of a wavelength absorbable by the wafer 11. In addition, other irradiation conditions of the laser beam 32D are also set such that the wafer 11 is appropriately subjected to the ablation processing.

For example, the laser beam 32D is applied to the top surface 11a side of the wafer 11. Specifically, the laser beam 32D is applied in a state in which the condensing point of the laser beam 32D is positioned on the inside of the four streets 13 surrounding the defective device 15a. The defective device region 11c is thereby subjected to the ablation processing, so that the defective device region 11c is destroyed. As a result, a groove (recessed portion) is formed on the top surface 11a side of the wafer 11.

Figure 28B:
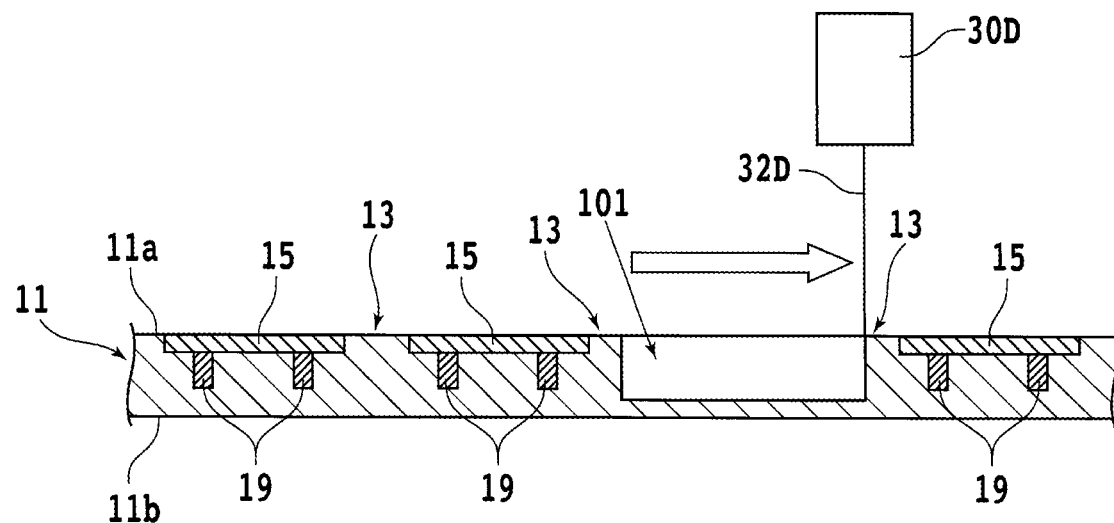
FIG. 28B is a sectional view depicting the wafer in which a groove is formed.

FIG. 28B is a sectional view depicting the wafer 11 in which a groove (removed region) 101 is formed. The laser beam 32D is, for example, scanned so as to be applied over the whole of a rectangular region as viewed in plan which is located on the inside of the four streets 13 surrounding the defective device 15a. As a result, the ablation processing forms the groove 101 in a rectangular parallelepipedic shape on the top surface 11a side of the wafer 11. Incidentally, the depth of the groove 101 is adjusted such that the bottom surface of the groove 101 is formed below lower ends of the electrodes 19. As a result, the defective device 15a and the electrodes 19 are removed.

Figure 29:
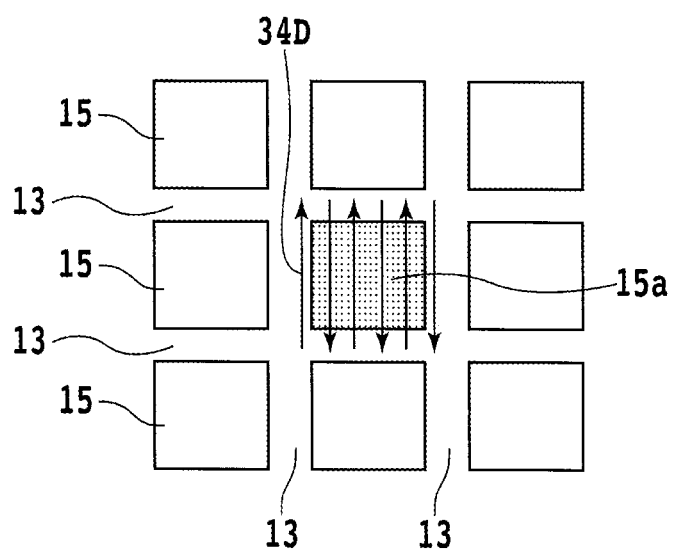
FIG. 29 is a plan view depicting paths along which the laser beam is scanned.

FIG. 29 is a plan view depicting paths 34D along which the laser beam 32D is scanned. A plurality of paths 34D going from one end side to another end side of the defective device region 11c, for example, are set. Then, the laser beam 32D is scanned along the paths 34D so as to reciprocate between one end and another end of the defective device region 11c. Consequently, the whole of the defective device region 11c is irradiated with the laser beam 32D, and the defective device region 11c is removed. However, the scanning path of the laser beam 32D is not limited as long as the defective device region 11c can be removed.

Incidentally, when the groove 101 is to be formed, the top surface 11a side of the wafer 11 may be covered by a protective film, and the wafer 11 may be irradiated with the laser beam 32D via the protective film. Usable as the protective film is, for example, a tape made of a resin or a film formed of a water-soluble resin such as PVA or PEG. When the protective film is formed on the top surface 11a side of the wafer 11, a processing waste (debris) produced at the time of the ablation processing can be prevented from adhering to the top surface 11a of the wafer 11, so that contamination of the wafer 11 and the semiconductor devices 15 is avoided.

Figure 30A:
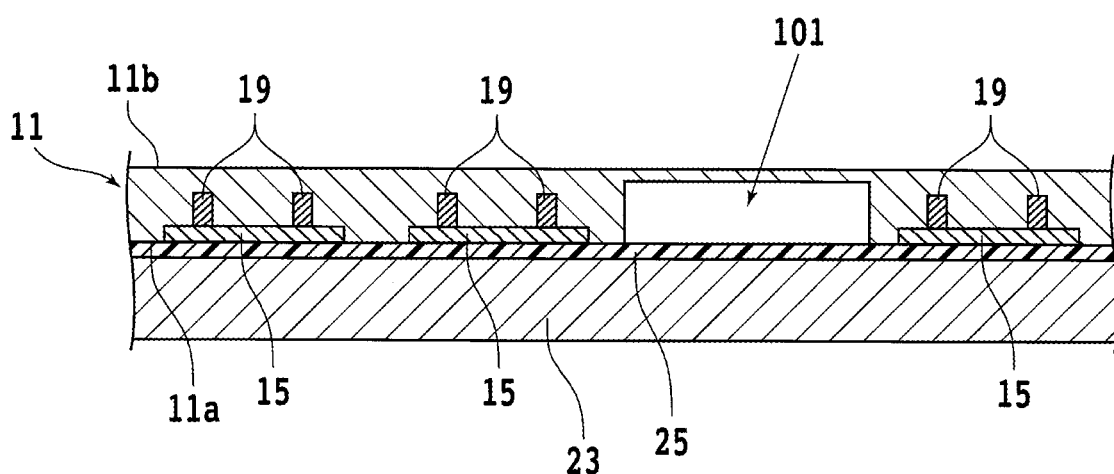
FIG. 30A is a sectional view depicting the wafer fixed to the support substrate.

Next, the processed region (groove 101) processed by the application of the laser beam 32D is exposed on the undersurface 11b side of the wafer 11 by grinding the undersurface 11b side of the wafer 11. When the wafer 11 is to be ground, first, the wafer 11 is fixed to the support substrate. FIG. 30A is a sectional view depicting the wafer 11 fixed to the support substrate 23. In a case where the undersurface 11b side of the wafer 11 is ground, the top surface 11a side of the wafer 11 is fixed to the support substrate 23 via the adhesive layer 25.

Next, the grinding apparatus 2 (see FIG. 2) grinds the wafer 11. Specifically, the undersurface 11b side of the wafer 11 is ground by bringing the grinding stones 16 into contact with the undersurface 11b side of the wafer 11. Then, the wafer 11 is ground and thinned until the groove 101 is exposed on the undersurface 11b side of the wafer 11.

Figure 30B:
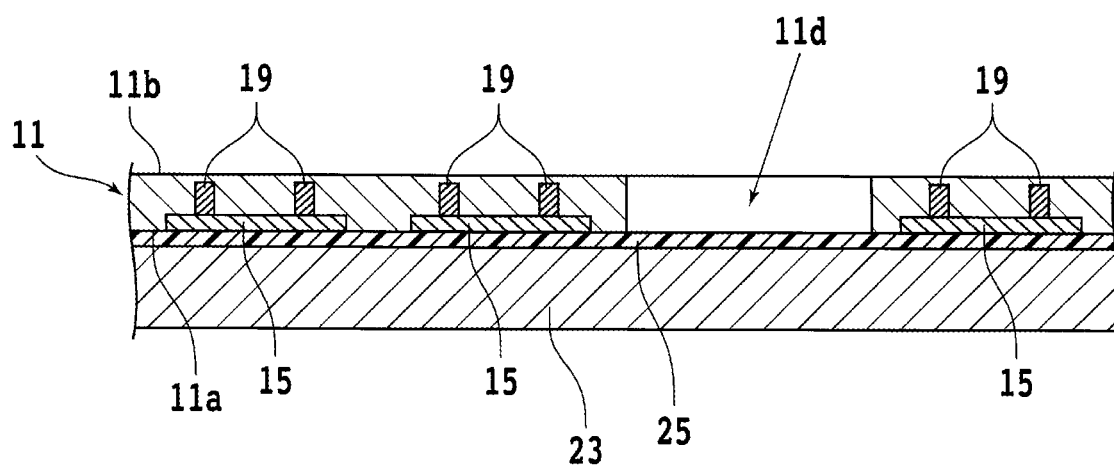
FIG. 30B is a sectional view depicting the wafer after being ground.

FIG. 30B is a sectional view depicting the wafer 11 after being ground. When the groove 101 is exposed on the undersurface 11b side of the wafer 11, the through hole 11d extending from the top surface 11a to the undersurface 11b is formed in the wafer 11.

Incidentally, in the removing step, the through hole 11d may be formed directly by the application of the laser beam 32D. Specifically, the through hole 11d extending from the top surface 11a to the undersurface 11b of the wafer 11 is formed by ablation processing.

Figure 31A:
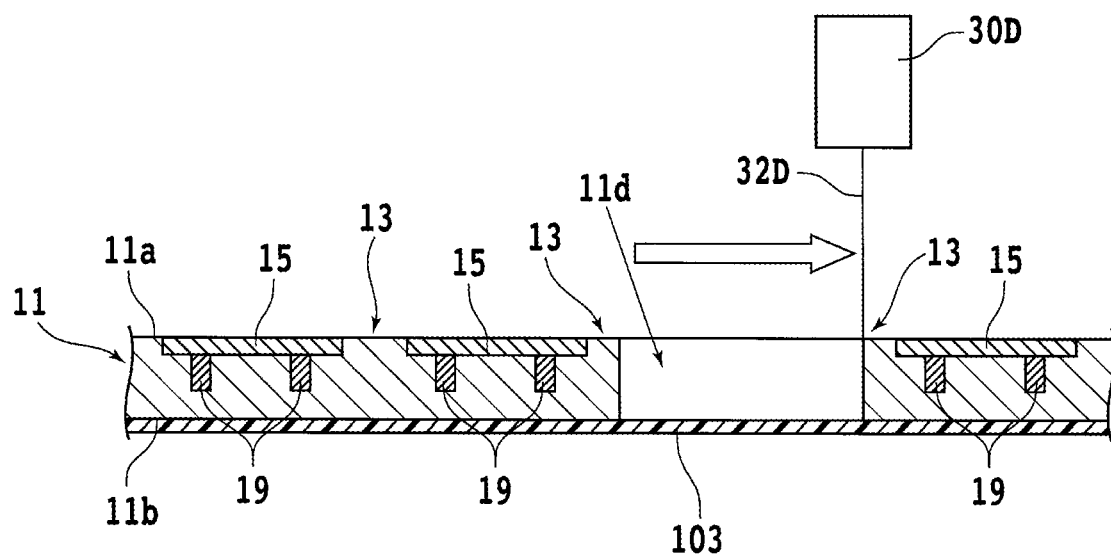
FIG. 31A is a sectional view depicting the wafer irradiated with the laser beam.

FIG. 31A is a sectional view depicting the wafer 11 irradiated with the laser beam 32D. First, a protective member 103 such as a tape is affixed to the wafer 11. In a case where the laser beam 32D is applied to the top surface 11a side of the wafer 11, for example, the protective member 103 is affixed to the undersurface 11b side of the wafer 11. Incidentally, an example of the material of the protective member 103 is similar to that of the protective member 21 (see FIG. 2).

Then, the laser beam 32D is applied in a state in which the condensing point of the laser beam 32D is positioned on the inside of the four streets 13 surrounding the defective device 15a. It is to be noted that the scanning path of the laser beam 32D is not limited. For example, the laser beam 32D is scanned along the paths 34D depicted in FIG. 29.

Irradiation conditions of the laser beam 32D are set such that a region extending from the top surface 11a to the undersurface 11b of the wafer 11 is removed by the ablation processing. Therefore, when the application of the laser beam 32D to the wafer 11 is completed, the through hole 11d penetrating the wafer 11 from the top surface 11a to the undersurface 11b is formed.

Figure 31B:
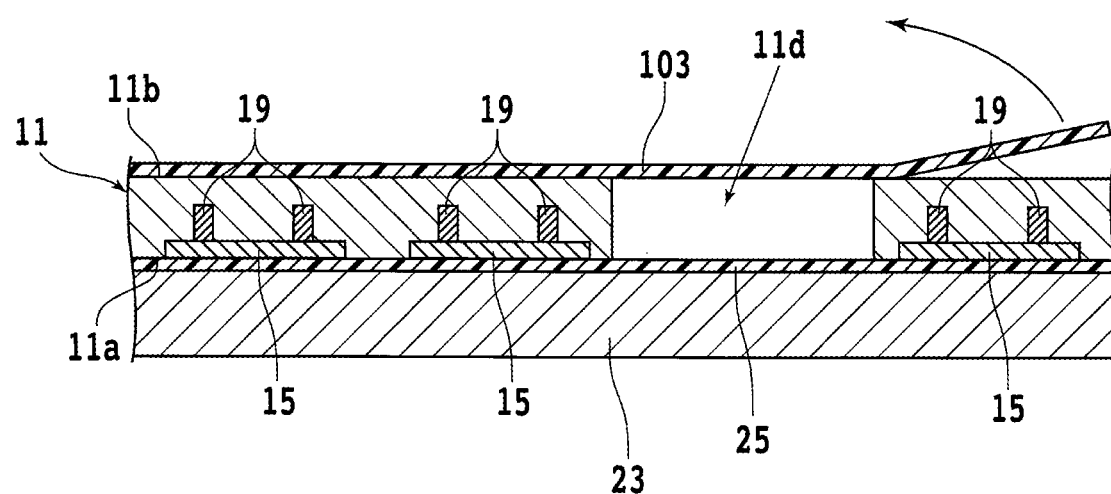
FIG. 31B is a sectional view depicting the wafer fixed to the support substrate.

The wafer 11 is thereafter fixed to the support substrate. FIG. 31B is a sectional view depicting the wafer 11 fixed to the support substrate 23. After the through hole 11d is formed in the wafer 11, the support substrate 23 is fixed to the top surface 11a side of the wafer 11 via the adhesive layer 25. The protective member 103 is thereafter peeled from the undersurface 11b side of the wafer 11.

Incidentally, a laser beam (aqua laser) applied via a liquid can also be used to form the through hole 11d. In this case, a jetting unit that jets the liquid to the laser irradiating unit 30D is provided. Then, the liquid column 50 (see FIG. 13A) is formed by jetting the liquid from the laser irradiating unit 30D, and the laser beam 32D is applied from the laser irradiating unit 30D. At this time, the condensing point of the laser beam 32D is positioned inside the liquid column 50. The laser beam 32D is applied to the defective device region 11c via the liquid column 50. The defective device region 11c is thereby removed.

In addition, the wafer 11 in which the through hole 11d is formed by destroying the defective device region 11c (see FIG. 30B and FIG. 31A) may be subjected to etching processing. For example, the inside of the through hole 11d is subjected to plasma etching by supplying gas in a plasma state to the through hole 11d of the wafer 11. In addition, the inside of the through hole 11d is subjected to wet etching by supplying an etchant to the through hole 11d of the wafer 11.

As described above, in the removing step, it is also possible to remove the defective device region 11c from the wafer 11 by destroying the defective device region 11c by the application of the laser beam. Incidentally, steps whose description is omitted in the present embodiment among steps included in the removing step are similar to those of the first embodiment. In addition, in the present embodiment, steps other than the removing step (the wafer preparing step, the grinding step, the fitting step, the resin filling step, the resin grinding step, the wafer laminating step, the dividing step, and the like) can be performed in a manner similar to that of the first embodiment. Further, the present embodiment can be combined with another embodiment as appropriate.

Fourth Embodiment

In the third embodiment, description has been made of an example in which the defective device region 11c is destroyed by the application of the laser beam in the removing step. However, a method of destroying the defective device region 11c is not limited. In the present embodiment, description will be made of a method of destroying and removing the defective device region 11c by crushing processing in the removing step after performing the wafer preparing step and the grinding step (see FIG. 2).

The crushing processing used in the present embodiment is not limited as long as the crushing processing can process the wafer 11. In the following, description will be made of sandblast processing using the sandblast unit 72 (see FIG. 22A and the like), water jet processing using the water jet unit 76 (see FIG. 22B and the like), and drill processing using the drill unit 80 (see FIG. 22C and the like) as concrete examples of the crushing processing.

Figure 32:
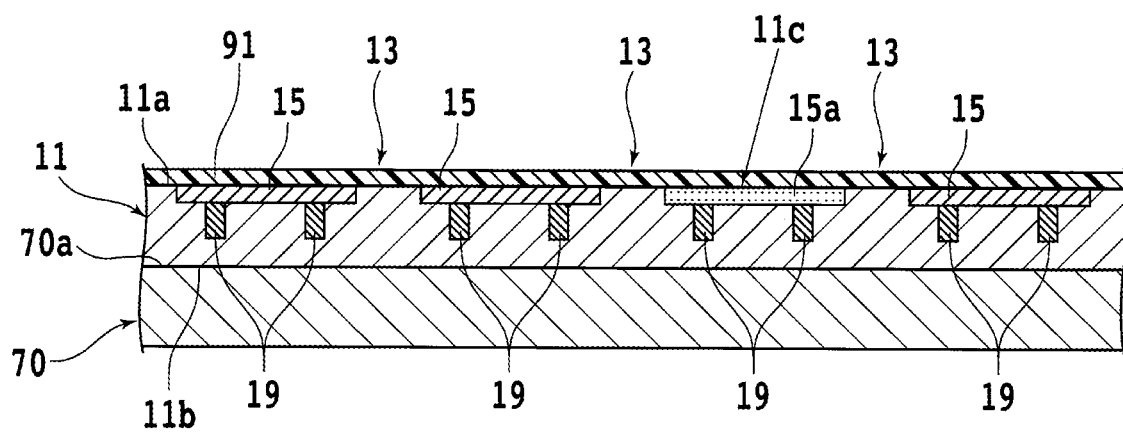
FIG. 32 is a sectional view depicting the wafer held by a holding table.

FIG. 32 is a sectional view depicting the wafer 11 held by the holding table 70. When the crushing processing is to be performed, first, a protective layer 91 is formed on the wafer 11. In a case where the processing is performed from the top surface 11a side of the wafer 11, for example, the top surface 11a side of the wafer 11 is covered by the protective layer 91. The semiconductor devices 15 are thereby protected. Incidentally, the formation of the protective layer 91 may be omitted in a case where damage to the semiconductor devices 15 due to the crushing processing is not likely to occur.

Next, the wafer 11 is held by the holding table 70. For example, the wafer 11 is disposed on the holding table 70 such that the top surface 11a side is exposed upward and the undersurface 11b side faces the holding surface 70a. Then, the wafer 11 held by the holding table 70 is subjected to the crushing processing.

Figure 33A:
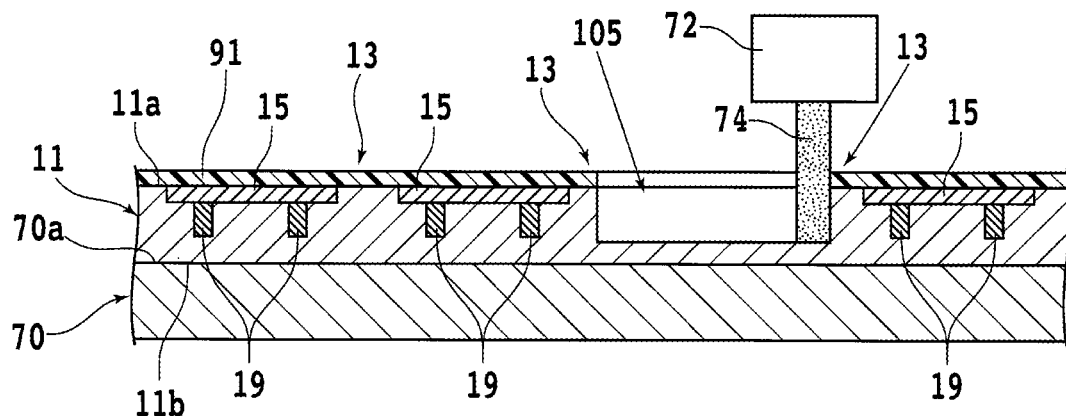
FIG. 33A is a sectional view depicting the wafer from which the defective device region is removed by the sandblast processing.

FIG. 33A is a sectional view depicting the wafer 11 from which the defective device region 11c is removed by the sandblast processing. In a case where the sandblast processing is performed, the polishing material 74 is jetted from the sandblast unit 72 to the inside of the four streets 13 surrounding the defective device 15a (see FIG. 32). As a result, a region of the wafer 11 with which the polishing material 74 collides is destroyed, and a groove (removed region) 105 in a rectangular parallelepipedic shape is formed on the top surface 11a side of the wafer 11.

Figure 33B:
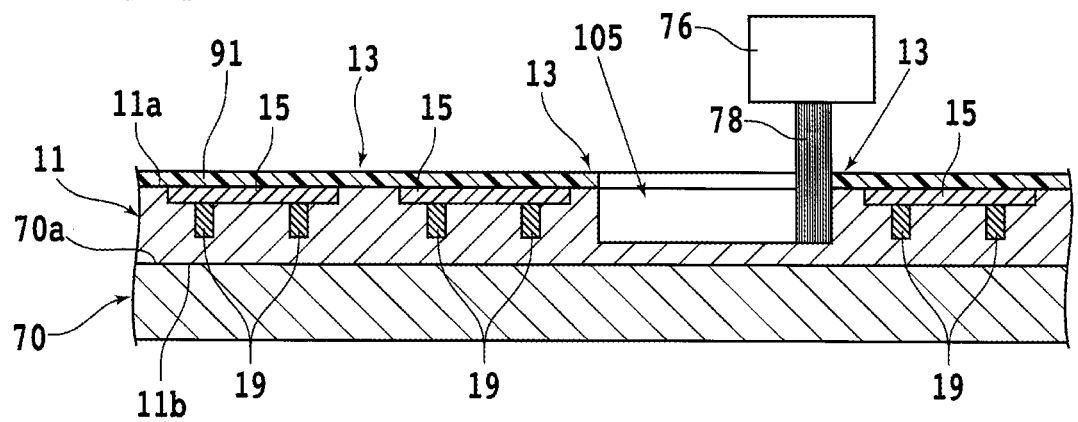
FIG. 33B is a sectional view depicting the wafer from which the defective device region is removed by the water jet processing.

FIG. 33B is a sectional view depicting the wafer 11 from which the defective device region 11c is removed by the water jet processing. In a case where the water jet processing is performed, a pressurized liquid 78 is jetted from the water jet unit 76 to the inside of the four streets 13 surrounding the defective device 15a (see FIG. 32). As a result, a region of the wafer 11 with which the liquid 78 collides is destroyed, and a groove 105 in a rectangular parallelepipedic shape is formed on the top surface 11a side of the wafer 11.

Incidentally, the groove 105 is formed at least over the whole of the region in which the defective device 15a is formed. In addition, the depth of the groove 105 is adjusted such that the bottom surface of the groove 105 is formed below lower ends of the electrodes 19. As a result, the defective device 15a and the electrodes 19 are removed.

Figure 33C:
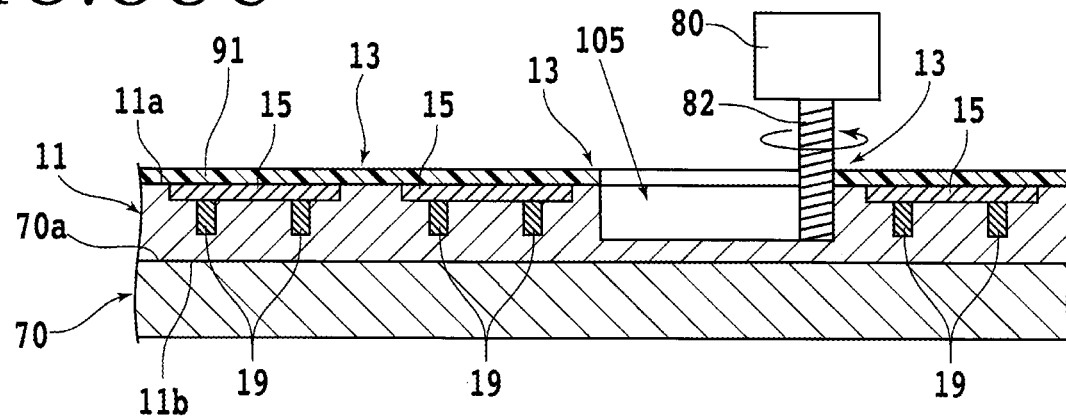
FIG. 33C is a sectional view depicting the wafer from which the defective device region is removed by the drill processing.

FIG. 33C is a sectional view depicting the wafer 11 from which the defective device region 11c is removed by the drill processing. In a case where the drill processing is performed, the drill bit 82 being rotated is brought into contact with the inside of the four streets 13 surrounding the defective device 15a (see FIG. 32), and a plurality of columnar grooves are formed in the wafer 11. Incidentally, the plurality of grooves are formed so as to be coupled to each other over the whole of the region in which the defective device 15a is formed. In addition, the depth of each of the plurality of grooves is adjusted such that the bottom surface of the groove 105 is formed below lower ends of the electrodes 19. As a result, the groove 105 constituted by the plurality of grooves coupled to each other is formed on the top surface 11a side of the wafer 11, and the defective device 15a and the electrodes 19 are removed.

As described above, the defective device 15a is destroyed by performing the crushing processing on the inside of the streets 13 surrounding the defective device 15a. The defective device 15a is thereby removed from the wafer 11.

Figure 34A:
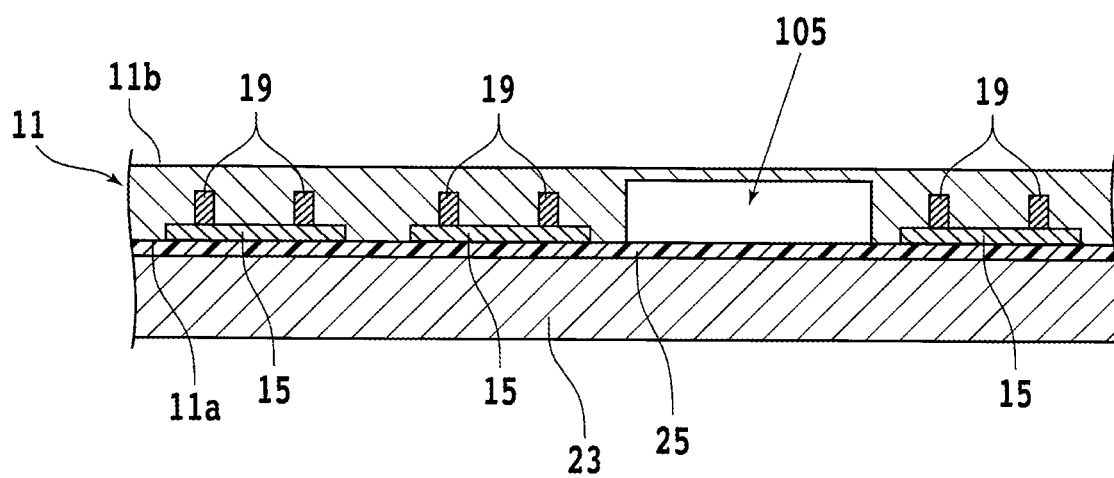
FIG. 34A is a sectional view depicting the wafer fixed to the support substrate.

Next, the processed region (groove 105) processed by the crushing processing is exposed on the undersurface 11b side of the wafer 11 by grinding the undersurface 11b side of the wafer 11. When the wafer 11 is to be ground, first, the wafer 11 is fixed to the support substrate 23. FIG. 34A is a sectional view depicting the wafer 11 fixed to the support substrate 23. In a case where the undersurface 11b side of the wafer 11 is ground, the top surface 11a side of the wafer 11 is fixed to the support substrate 23 via the adhesive layer 25.

Next, the grinding apparatus 2 (see FIG. 2) grinds the wafer 11. Specifically, the undersurface 11b side of the wafer 11 is ground by bringing the grinding stones 16 into contact with the undersurface 11b side of the wafer 11. Then, the wafer 11 is ground and thinned until the groove 105 is exposed on the undersurface 11b side of the wafer 11.

Figure 34B:
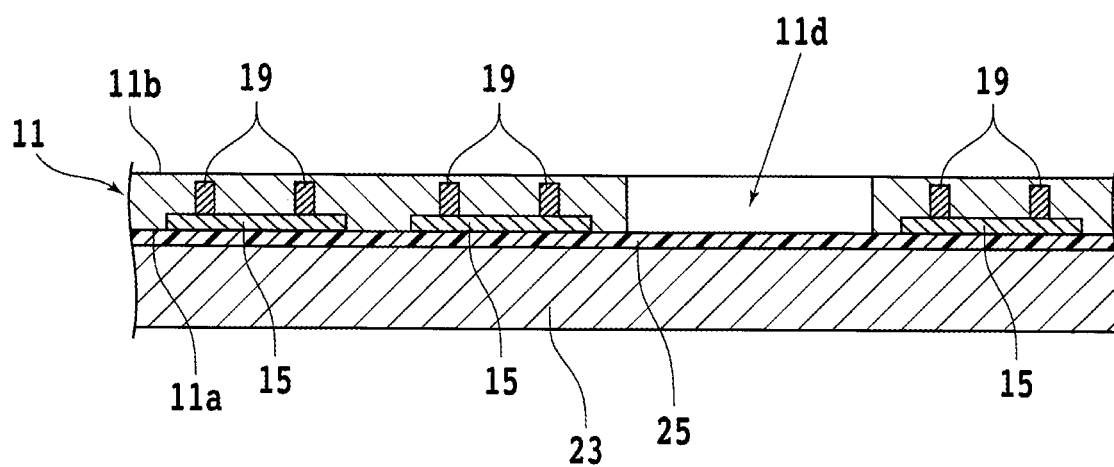
FIG. 34B is a sectional view depicting the wafer after being ground.

FIG. 34B is a sectional view depicting the wafer 11 after being ground. When the groove 105 is exposed on the undersurface 11b side of the wafer 11, a rectangular parallelepipedic through hole 11d extending from the top surface 11a to the undersurface 11b is formed in the wafer 11.

Incidentally, in the removing step, the through hole 11d may be formed directly by the crushing processing. Specifically, the through hole 11d extending from the top surface 11a to the undersurface 11b of the wafer 11 is formed by the crushing processing.

Figure 35A:
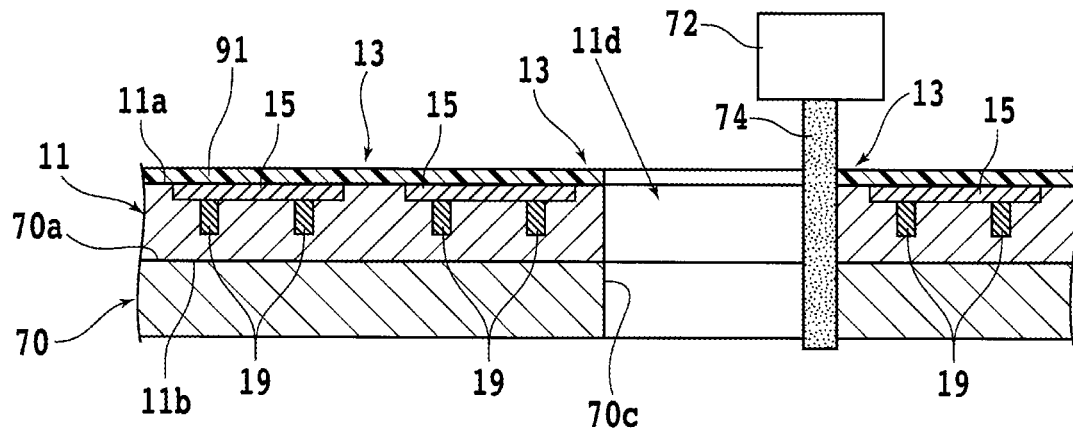
FIG. 35A is a sectional view depicting the wafer in which a through hole is formed by the sandblast processing.

FIG. 35A is a sectional view depicting the wafer 11 in which the through hole 11d is formed by the sandblast processing. In a case where the through hole 11d is formed in the wafer 11 by the crushing processing, the holding table 70 is provided with an opening 70c that vertically penetrates the holding table 70. Then, the wafer 11 is disposed on the holding table 70 such that a region inside the four streets 13 surrounding the defective device 15a coincides with the opening 70c.

Next, the polishing material 74 from the sandblast unit 72 is jetted over the whole of the region inside the four streets 13 surrounding the defective device 15a (see FIG. 32). Incidentally, jetting conditions of the polishing material 74 are set such that the region of the wafer 11 with which the polishing material 74 collides is removed, the region being from the top surface 11a to the undersurface 11b. As a result, the defective device region 11c is removed, and the through hole 11d is formed in the wafer 11.

Figure 35B:
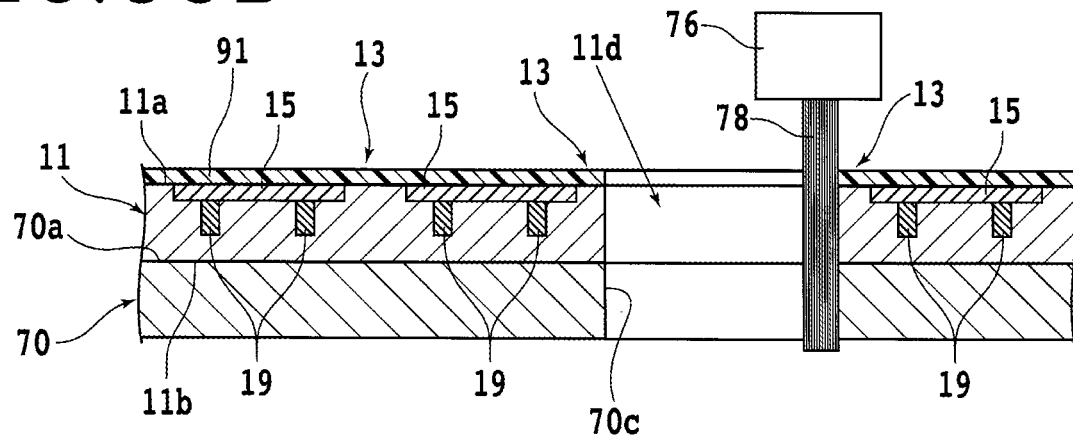
FIG. 35B is a sectional view depicting the wafer in which a through hole is formed by the water jet processing.

FIG. 35B is a sectional view depicting the wafer 11 in which the through hole 11d is formed by the water jet processing. In a case where the water jet processing is performed, the liquid 78 jetted from the water jet unit 76 is jetted over the whole of the region inside the four streets 13 surrounding the defective device 15a (see FIG. 32). Incidentally, jetting conditions of the liquid 78 are set such that the region of the wafer 11 with which the liquid 78 collides is removed, the region being from the top surface 11a to the undersurface 11b. As a result, the defective device region 11c is removed, and the through hole 11d is formed in the wafer 11.

Figure 35C:
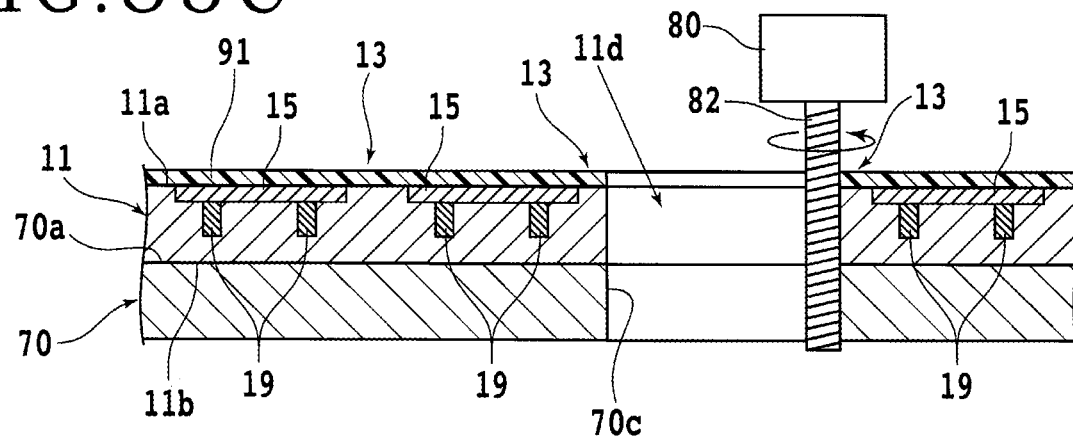
FIG. 35C is a sectional view depicting the wafer in which a through hole is formed by the drill processing.

FIG. 35C is a sectional view depicting the wafer 11 in which the through hole 11d is formed by the drill processing. In a case where the drill processing is performed, the drill bit 82 being rotated is brought into contact with the inside of the four streets 13 surrounding the defective device 15a (see FIG. 32), and a plurality of columnar grooves are formed in the wafer 11.

The drill bit 82 processes the wafer 11 until a lower end of the drill bit 82 reaches the undersurface 11b of the wafer 11. As a result, the plurality of grooves are formed so as to each penetrate the wafer 11 from the top surface 11a to the undersurface 11b. In addition, the plurality of grooves are formed so as to be coupled to each other at least over the whole of the region in which the defective device 15a is formed. As a result, the through hole 11d constituted by the plurality of grooves coupled to each other is formed.

Incidentally, when the sandblast processing (see FIG. 35A) is performed, the polishing material 74 passed through the through hole 11d of the wafer 11 is discharged via the opening 70c of the holding table 70. Similarly, when the water jet processing (see FIG. 35B) is performed, the liquid 78 passed through the through hole 11d of the wafer 11 is discharged via the opening 70c of the holding table 70. It is therefore possible to prevent the holding table 70 from being damaged by the collision of the polishing material 74 or the liquid 78 with the holding surface 70a of the holding table 70.

In addition, when the drill processing (see FIG. 35C) is performed, a distal end portion of the drill bit 82 is inserted into the opening 70c of the holding table 70. It is therefore possible to prevent the holding table 70 from being damaged by the contact of the drill bit 82 with the holding table 70.

Incidentally, while FIG. 35A, FIG. 35B, and FIG. 35C depict states in which the wafer 11 is processed from the top surface 11a side, the wafer 11 may be processed from the undersurface 11b side. That is, the polishing material 74 or the liquid 78 may be made to collide with the undersurface 11b side of the wafer 11, or the drill bit 82 may be brought into contact with the undersurface 11b side of the wafer 11.

Figure 36:
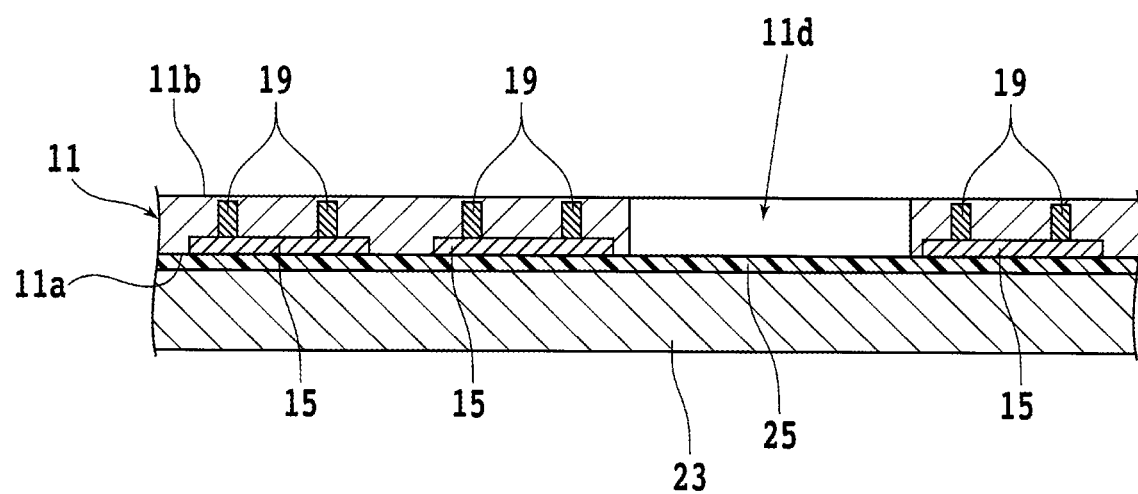
FIG. 36 is a sectional view depicting the wafer fixed to the support substrate.

Thereafter, the wafer 11 from which the defective device region 11c is removed and in which the through hole 11d is formed is fixed to the support substrate 23. FIG. 36 is a sectional view depicting the wafer 11 fixed to the support substrate 23. For example, the top surface 11a side of the wafer 11 is fixed to the support substrate 23 via the adhesive layer 25.

Incidentally, the wafer 11 in which the through hole 11d is formed by the crushing processing may be subjected to etching processing. For example, the inside of the through hole 11d is subjected to plasma etching by supplying gas in a plasma state to the through hole 11d of the wafer 11 (see FIG. 26). In addition, the inside of the through hole 11d is subjected to wet etching by supplying an etchant to the through hole 11d of the wafer 11. The etching processing performed on the wafer 11 increases the size of the through hole 11d, and removes minute projections and depressions formed on the inner wall of the through hole 11d by the crushing processing.

Figure 37A:
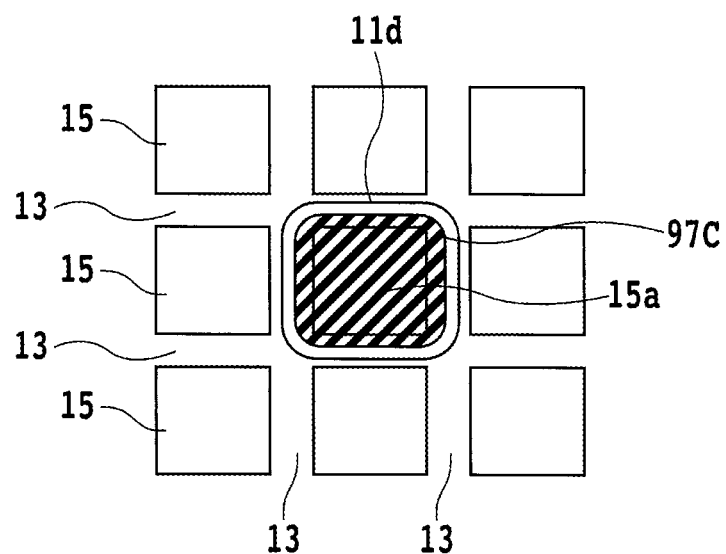
FIG. 37A is a plan view depicting a region processed by the sandblast processing or the water jet processing.
Figure 37B:
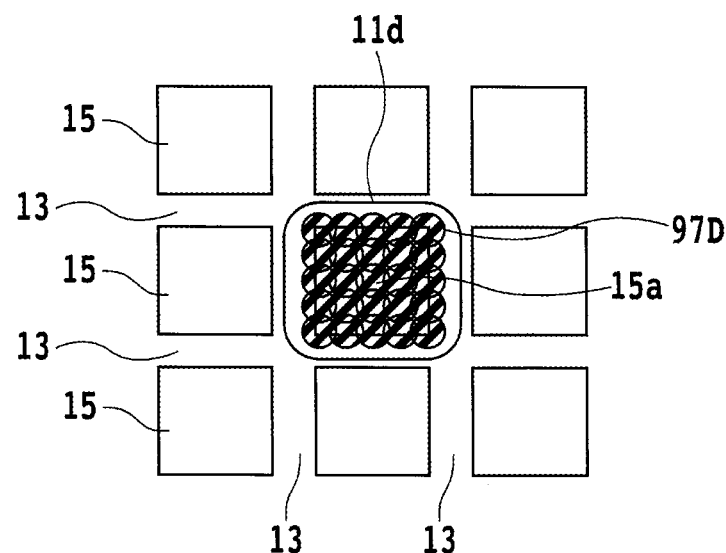
FIG. 37B is a plan view depicting regions processed by the drill processing.

The region of the wafer 11 which is subjected to the crushing processing is set as appropriate such that the through hole 11d is formed at least on the inside of the four streets 13 surrounding the defective device 15a (see FIG. 32). FIG. 37A is a plan view depicting a region (processed region) 97C processed by the sandblast processing or the water jet processing. In addition, FIG. 37B is a plan view depicting regions (processed regions) 97D processed by the drill processing. In FIG. 37A and FIG. 37B, the regions 97C and 97D are provided with a pattern.

In the case where the wafer 11 is processed by the sandblast processing, the polishing material 74 is jetted to the region 97C including the whole of the defective device 15a. Similarly, in the case where the wafer 11 is processed by the water jet processing, the liquid 78 is, for example, jetted to the region 97C including the whole of the defective device 15a. The groove 105 (see FIG. 33A and FIG. 33B) or the through hole 11d (see FIG. 35A and FIG. 35B) is thereby formed such that the defective device 15a is removed. Incidentally, the polishing material 74 and the liquid 78 may be jetted so as to collide with a part of the streets 13 surrounding the defective device 15a.

In the case where the wafer 11 is processed by the drill processing, the drill bit 82 sequentially processes a plurality of regions 97D overlapping the defective device 15a. Incidentally, the plurality of regions 97D are set so as to each overlap a part of another adjacent region 97D. The groove 105 (see FIG. 33C) or the through hole 11d (see FIG. 35C) is thereby formed such that the defective device 15a is removed. Incidentally, the drill bit 82 may be in contact with a part of the streets 13 surrounding the defective device 15a.

In addition, in the case where the wafer 11 is processed by the drill processing, the groove 105 or the through hole 11d may be formed by moving the drill bit 82 in the horizontal direction while the drill bit 82 is rotated in a state in which the drill bit 82 is inserted in the wafer 11 (see FIG. 33C and FIG. 35C). In this case, work of raising and lowering the drill bit 82 a large number of times becomes unnecessary.

Thereafter, the inner wall of the through hole 11d is etched by subjecting the wafer 11 to etching processing (plasma etching or the like, see FIG. 26). As a result, minute projections and depressions remaining in the regions 97C and 97D subjected to the crushing processing are removed, and the width of the through hole 11d is increased. The through hole 11d enlarged as depicted in FIG. 37A and FIG. 37B is consequently formed.

As described above, in the removing step, it is also possible to remove the defective device region 11c from the wafer 11 by destroying the defective device region 11c by the crushing processing. Incidentally, steps whose description is omitted in the present embodiment among steps included in the removing step are similar to those of the first embodiment. In addition, in the present embodiment, steps other than the removing step (the wafer preparing step, the grinding step, the fitting step, the resin filling step, the resin grinding step, the wafer laminating step, the dividing step, and the like) can be performed in a manner similar to that of the first embodiment. Further, the present embodiment can be combined with another embodiment as appropriate.

Fifth Embodiment

In the present embodiment, description will be made of relation between the step of removing the defective device region 11c from the wafer 11 (removing step) and the step of fixing the wafer 11 to the support substrate 23 (support substrate fixing step). Specifically, in the present embodiment, detailed description will be made of a process in which the wafer 11 is fixed to the support substrate 23 after the defective device region 11c is removed from the wafer 11.

First, the wafer 11 prepared in the preparing step is subjected to grinding processing (see FIG. 2) as required (grinding step). Then, the defective device region 11c is removed from the wafer 11 by subjecting the wafer 11 to processing such as laser processing or crushing processing (removing step). Thereafter, the wafer 11 from which the defective device region 11c is removed and in which the through hole 11d is formed is fixed to the support substrate 23 (support substrate fixing step).

The laser processing can be used to remove the defective device region 11c. For example, the defective device region 11c is separated from the wafer 11 by the laser processing (see FIG. 12A, FIG. 13A, and the like), and the wafer 11 is thereafter fixed to the support substrate 23 (see FIG. 12B, FIG. 13B, and the like). In addition, for example, the defective device region 11c is destroyed by the laser processing (see FIG. 31A and the like), and the wafer 11 is thereafter fixed to the support substrate 23 (see FIG. 31B and the like).

In addition, the crushing processing can also be used to remove the defective device region 11c. For example, the defective device region 11c is separated from the wafer 11 by the crushing processing (see FIG. 24A, FIG. 24B, FIG. 24C, and the like), and the wafer 11 is thereafter fixed to the support substrate 23 (see FIG. 25 and the like). In addition, for example, the defective device region 11c is destroyed by the crushing processing (see FIG. 35A, FIG. 35B, FIG. 35C, and the like), and the wafer 11 is thereafter fixed to the support substrate 23 (see FIG. 36 and the like).

Then, the device chip 59 is fitted into the through hole 11d of the wafer 11 fixed to the support substrate 23 (fitting step, see FIGS. 16 to 18C and the like). The wafer 11 not including the defective device 15a is thereby manufactured.

As described above, in a case where the support substrate fixing step is performed after the removing step is performed, the defective device region 11c is already removed from the wafer 11 at a time point at which the wafer 11 is fixed to the support substrate 23. Therefore, the processing for removing the defective device region 11c does not need to be performed after the wafer 11 is fixed to the support substrate 23. It is thereby possible to avoid adhesion of a waste (processing waste) produced by the processing of the wafer 11 to the support substrate 23, and prevent the processing waste adhering to the support substrate 23 from obstructing the fitting of the device chip 59 into the through hole 11d.

It is to be noted that there is no limitation on a method of fixing the wafer 11 to the support substrate 23. For example, the wafer 11 is fixed to the support substrate 23 via the adhesive layer 25. As described earlier, usable as the adhesive layer 25 is, for example, an adhesive formed of a thermosetting resin, an adhesive formed of a thermoplastic resin, an adhesive formed of an ultraviolet curable resin, a sheet capable of being fixed to the wafer 11 and the support substrate 23 by heating and pressurization and not including an adhesive (thermocompression bonding sheet), a tape including a thermally foamed layer, or the like.

Thereafter, the resin filling step (see FIG. 19A), the resin grinding step (see FIG. 19B), the wafer laminating step (see FIG. 20), and the dividing step (see FIG. 21A) are performed in order. The laminated device chips 81 each including a plurality of laminated semiconductor devices are thereby manufactured (see FIG. 21B).

As described above, by performing the support substrate fixing step after performing the removing step, it is possible to prevent adhesion of a processing waste to the support substrate 23, and perform work of fitting the device chip 59 into the wafer 11 smoothly. Incidentally, steps whose description is omitted in the present embodiment among steps included in the removing step and the support substrate fixing step are similar to those of the first embodiment. In addition, in the present embodiment, steps other than the removing step and the support substrate fixing step (the wafer preparing step, the grinding step, the fitting step, the resin filling step, the resin grinding step, the wafer laminating step, the dividing step, and the like) can be performed in a manner similar to that of the first embodiment. Further, the present embodiment can be combined with another embodiment as appropriate.

Sixth Embodiment

In the present embodiment, description will be made of relation between the step of removing the defective device region 11c from the wafer 11 (removing step) and the step of fixing the wafer 11 to the support substrate 23 (support substrate fixing step). Specifically, in the present embodiment, detailed description will be made of a process in which the defective device region 11c is removed from the wafer 11 after the wafer 11 is fixed to the support substrate 23.

First, the wafer 11 prepared in the preparing step is subjected to grinding processing (see FIG. 2) as required (grinding step). Then, the wafer 11 is fixed to the support substrate 23 (support substrate fixing step). Thereafter, the defective device region 11c is removed from the wafer 11 by subjecting the wafer 11 to processing such as laser processing or crushing processing (removing step).

The laser processing can be used to remove the defective device region 11c. For example, the wafer 11 fixed to the support substrate 23 is subjected to the laser processing (see FIG. 4A and the like), and the defective device region 11c is thereafter separated from the wafer 11 (see FIG. 8B and the like). In addition, for example, the wafer 11 fixed to the support substrate 23 is subjected to plasma etching (see FIG. 14B and the like), and the defective device region 11c is thereafter removed from the wafer 11 (see FIG. 8B and the like).

In addition, for example, the wafer 11 in which a groove is formed by the laser processing, the crushing processing, or the like is fixed to the support substrate 23 (see FIG. 11A, FIG. 23A, and the like). Thereafter, the defective device region 11c is removed from the wafer 11 by grinding the wafer 11 (see FIG. 11B, FIG. 23B, and the like).

It is to be noted that there is no limitation on a method of fixing the wafer 11 to the support substrate 23. For example, the wafer 11 is fixed to the support substrate 23 via the adhesive layer 25. As described earlier, usable as the adhesive layer 25 is, for example, an adhesive formed of a thermosetting resin, an adhesive formed of a thermoplastic resin, an adhesive formed of an ultraviolet curable resin, a sheet capable of being fixed to the wafer 11 and the support substrate 23 by heating and pressurization and not including an adhesive (thermocompression bonding sheet), a tape including a thermally foamed layer, or the like.

Then, the device chip 59 is fitted into the through hole 11d of the wafer 11 fixed to the support substrate 23 (fitting step, see FIGS. 16 to 18C). The wafer 11 not including the defective device 15a is thereby manufactured.

As described above, in a case where the removing step is performed after the support substrate fixing step is performed, the wafer 11 is supported by the support substrate 23 in a stage in which the defective device region 11c is removed from the wafer 11. Therefore, the fitting step can be thereafter performed in succession, and the fitting of the device chip 59 can be performed smoothly.

In addition, in the case where the removing step is performed after the support substrate fixing step is performed, the grinding processing for dividing the defective device region 11c from the wafer 11 (see FIG. 11B, FIG. 23B, and the like) is performed after the work of fixing the wafer 11 to the support substrate 23. It therefore becomes unnecessary to perform work of transporting the wafer 11 in a state of being thinned and thus being susceptible to deformation and laminating the wafer 11 to the support substrate 23. It is thus possible to improve work efficiency and prevent damage to the wafer.

Thereafter, the resin filling step (see FIG. 19A), the resin grinding step (see FIG. 19B), the wafer laminating step (see FIG. 20), and the dividing step (see FIG. 21A) are performed in order. The laminated device chips 81 each including a plurality of laminated semiconductor devices are thereby manufactured (see FIG. 21B).

As described above, by performing the removing step after performing the support substrate fixing step, it is possible to proceed smoothly to the fitting step to be thereafter performed. Incidentally, steps whose description is omitted in the present embodiment among steps included in the support substrate fixing step and the removing step are similar to those of the first embodiment. In addition, in the present embodiment, steps other than the support substrate fixing step and the removing step (the wafer preparing step, the grinding step, the fitting step, the resin filling step, the resin grinding step, the wafer laminating step, the dividing step, and the like) can be performed in a manner similar to that of the first embodiment. Further, the present embodiment can be combined with another embodiment as appropriate.

It is to be noted that structures, methods, and the like according to each of the foregoing embodiments can be modified and implemented as appropriate without departing from the objective scope of the present invention.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A wafer manufacturing method comprising:
 a wafer preparing step of preparing a wafer including a semiconductor device formed in each of a plurality of regions demarcated by a plurality of streets intersecting each other;
 a removing step of removing, from the wafer, a defective device region including a semiconductor device determined to be a defective product among a plurality of the semiconductor devices formed in the wafer; and
 a fitting step of fitting, into a removed region formed by removing the defective device region from the wafer, a device chip including a semiconductor device as a non-defective product having same functions as those of the semiconductor device determined to be a defective product and having a size capable of being fitted into the removed region,
 wherein the removing step includes destroying the defective device region by irradiating the defective device region with a laser beam, wherein the laser beam follows a plurality of linear paths from one end of the defective device region to the other so that the laser beam reciprocates between the ends of the defective device region.

2. The wafer manufacturing method according to claim 1, wherein:
 the removing step irradiates the defective device region with the laser beam in a state in which a condensing point of the laser beam of a wavelength absorbable by the wafer is positioned in the defective device region.

3. The wafer manufacturing method according to claim 1, wherein:
 the removing step irradiates the defective device region with the laser beam via a liquid column formed by jetting a liquid to the wafer in a state in which a condensing point of the laser beam of a wavelength absorbable by the wafer is positioned inside the liquid column.

4. The wafer manufacturing method according to claim 1, further comprising:
 a grinding step of, before the removing step is performed, affixing a protective member to a first surface side of the wafer, the semiconductor devices being formed on the first surface side, and thinning the wafer to a predetermined thickness by grinding a second surface side of the wafer, the second surface side being an opposite side of the first surface.

5. The wafer manufacturing method according to claim 1, wherein,
 by grinding a second surface side of the wafer, the second surface side being an opposite side of a first surface side on which the semiconductor devices are formed, the removing step exposes the removed region on the second surface side of the wafer.

6. The wafer manufacturing method according to claim 1, wherein:
 the removing step supplies an etchant to the removed region.

7. The wafer manufacturing method according to claim 1, wherein:
 the removing step supplies gas in a plasma state to the removed region.

8. The wafer manufacturing method according to claim 1, further comprising:
 a resin filling step of filling a resin into a gap between the device chip and the wafer, after the fitting step is performed; and
 a resin grinding step of grinding the resin formed on an outside of the gap, after the resin filling step is performed.

9. A laminated device chip manufacturing method comprising:
 a wafer preparing step of preparing a first wafer and a second wafer each having a semiconductor device formed in each of a plurality of regions demarcated by a plurality of streets intersecting each other;
 a removing step of removing, from the first wafer, a defective device region including a semiconductor device determined to be a defective product among a plurality of the semiconductor devices formed in the first wafer;
 a fitting step of fitting, into a removed region formed by removing the defective device region from the first wafer, a device chip including a semiconductor device as a non-defective product having same functions as those of the semiconductor device determined to be a defective product and having a size capable of being fitted into the removed region;

a wafer laminating step of forming a laminated wafer by laminating the second wafer onto the first wafer; and a dividing step of forming laminated device chips including a plurality of the laminated semiconductor devices by dividing the laminated wafer along the streets, wherein the removing step includes destroying the defective device region by irradiating the defective device region with a laser beam, wherein the laser beam follows a plurality of linear paths from one end of the defective device region to the other so that the laser beam reciprocates between the ends of the defective device region.

10. The laminated device chip manufacturing method according to claim 9, wherein:

the removing step irradiates the defective device region with the laser beam in a state in which a condensing point of the laser beam of a wavelength absorbable by the first wafer is positioned in the defective device region.

11. The laminated device chip manufacturing method according to claim 9, wherein:

the removing step irradiates the defective device region with the laser beam via a liquid column formed by jetting a liquid to the first wafer in a state in which a condensing point of the laser beam of a wavelength absorbable by the first wafer is positioned inside the liquid column.

12. The laminated device chip manufacturing method according to claim 9, further comprising:

a grinding step of, before the removing step is performed, affixing a protective member to a first surface side of the first wafer, the semiconductor devices being formed on the first surface side, and thinning the first wafer to a predetermined thickness by grinding a second surface side of the first wafer, the second surface side being an opposite side of the first surface.

13. The laminated device chip manufacturing method according to claim 9, wherein:

by grinding a second surface side of the first wafer, the second surface side being an opposite side of a first surface side on which the semiconductor devices are formed, the removing step exposes the removed region on the second surface side of the first wafer.

14. The laminated device chip manufacturing method according to claim 9, wherein:

the removing step supplies an etchant to the removed region.

15. The laminated device chip manufacturing method according to claim 9, wherein:

the removing step supplies gas in a plasma state to the removed region.

16. The laminated device chip manufacturing method according to claim 9, further comprising:

a resin filling step of filling a resin into a gap between the device chip and the first wafer, after the fitting step is performed; and a resin grinding step of grinding the resin formed on an outside of the gap, after the resin filling step is performed.

* * * * *